US012568741B2

(12) United States Patent
Nam et al.

(10) Patent No.: US 12,568,741 B2
(45) Date of Patent: Mar. 3, 2026

(54) DISPLAY PANEL INCLUDING SUPPORT SUBSTRATE BONDED TO ENCAPSULATION SUBSTRATE AND METHOD FOR FABRICATING THE SAME

(71) Applicant: Samsung Display Co., Ltd., Yongin-Si (KR)

(72) Inventors: Yun Yong Nam, Hwaseong-si (KR); So Young Koo, Hwaseong-si (KR); Eok Su Kim, Seoul (KR); Hyung Jun Kim, Seoul (KR); Jun Hyung Lim, Seoul (KR); Kyung Jin Jeon, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 635 days.

(21) Appl. No.: 17/943,133

(22) Filed: Sep. 12, 2022

(65) Prior Publication Data

US 2023/0189585 A1      Jun. 15, 2023

(30) Foreign Application Priority Data

Dec. 14, 2021    (KR) ........................ 10-2021-0178203

(51) Int. Cl.
*H10K 59/131*        (2023.01)
*H10K 50/84*        (2023.01)
          (Continued)

(52) U.S. Cl.
CPC ......... *H10K 59/131* (2023.02); *H10K 50/841* (2023.02); *H10K 50/844* (2023.02);
          (Continued)

(58) Field of Classification Search
CPC .. H10K 59/131; H10K 50/841; H10K 50/844; H10K 59/122; H10K 59/126;
          (Continued)

(56) References Cited

U.S. PATENT DOCUMENTS

| 11,387,286 B2 | 7/2022 | Kim et al. |
| 11,574,970 B2 | 2/2023 | Kim et al. |
| (Continued) | | |

FOREIGN PATENT DOCUMENTS

| KR | 10-2002-0045256 A | 6/2002 |
| KR | 10-2011-0110021 A | 10/2011 |
| (Continued) | | |

OTHER PUBLICATIONS

Korean Notice of Allowance corresponding to Application No. 10-2021-0178203 and issued on Jun. 10, 2025, 3 pages.

*Primary Examiner* — Jacob Y Choi
*Assistant Examiner* — Grace Cha
(74) *Attorney, Agent, or Firm* — Innovation Counsel LLP

(57)          ABSTRACT

The present disclosure relates to a display panel and a method for fabricating the same. According to an embodiment, a method for fabricating a display panel, comprises disposing a circuit array and connection lines on the support substrate, the circuit array disposed in the display area, the connection lines disposed in a non-display area; disposing a via layer on the support substrate; providing a sealing hole surrounding the display area by patterning the via layer; disposing a sealing member surrounding the display area on an encapsulation substrate. In the disposing of the circuit array and the connection lines comprises disposing an active layer overlapping a light shielding member and disposing an etch stopper corresponding to at least a portion of an overlapping area between the sealing hole and the first connecting line part, by patterning a semiconductor material layer on the buffer layer.

12 Claims, 47 Drawing Sheets

(51) Int. Cl.

| | |
|---|---|
| *H10K 50/844* | (2023.01) |
| *H10K 59/122* | (2023.01) |
| *H10K 59/126* | (2023.01) |
| *H10K 71/00* | (2023.01) |

(52) U.S. Cl.
CPC ......... *H10K 59/122* (2023.02); *H10K 59/126*
(2023.02); *H10K 71/00* (2023.02)

(58) Field of Classification Search
CPC .. H10K 71/00; H10K 59/8722; H10K 59/124;
H10K 59/1201
See application file for complete search history.

(56) References Cited

U.S. PATENT DOCUMENTS

| | | | | |
|---|---|---|---|---|
| 2011/0049680 A1* | 3/2011 | Burns | ................. | H01L 21/0271 |
| | | | | 438/689 |

| | | | | |
|---|---|---|---|---|
| 2015/0171377 A1* | 6/2015 | Jeon | .................. | H10D 86/0231 |
| | | | | 438/23 |
| 2015/0206928 A1* | 7/2015 | Kimura | ................ | H10K 59/122 |
| | | | | 257/88 |
| 2016/0104757 A1* | 4/2016 | Kim | .................... | H10D 86/423 |
| | | | | 438/34 |
| 2021/0202653 A1* | 7/2021 | Cho | ....................... | H10K 71/00 |

FOREIGN PATENT DOCUMENTS

| | | |
|---|---|---|
| KR | 10-1307260 B1 | 9/2013 |
| KR | 10-2016-0029487 A | 3/2016 |
| KR | 10-2016-0043574 A | 4/2016 |
| KR | 10-2016-0094567 A | 8/2016 |
| KR | 10-2017-0060891 A | 6/2017 |
| KR | 10-2021-0014233 A | 2/2021 |
| KR | 10-2021-0016129 A | 2/2021 |
| KR | 10-2021-0086898 A | 7/2021 |

* cited by examiner

FIG. 3
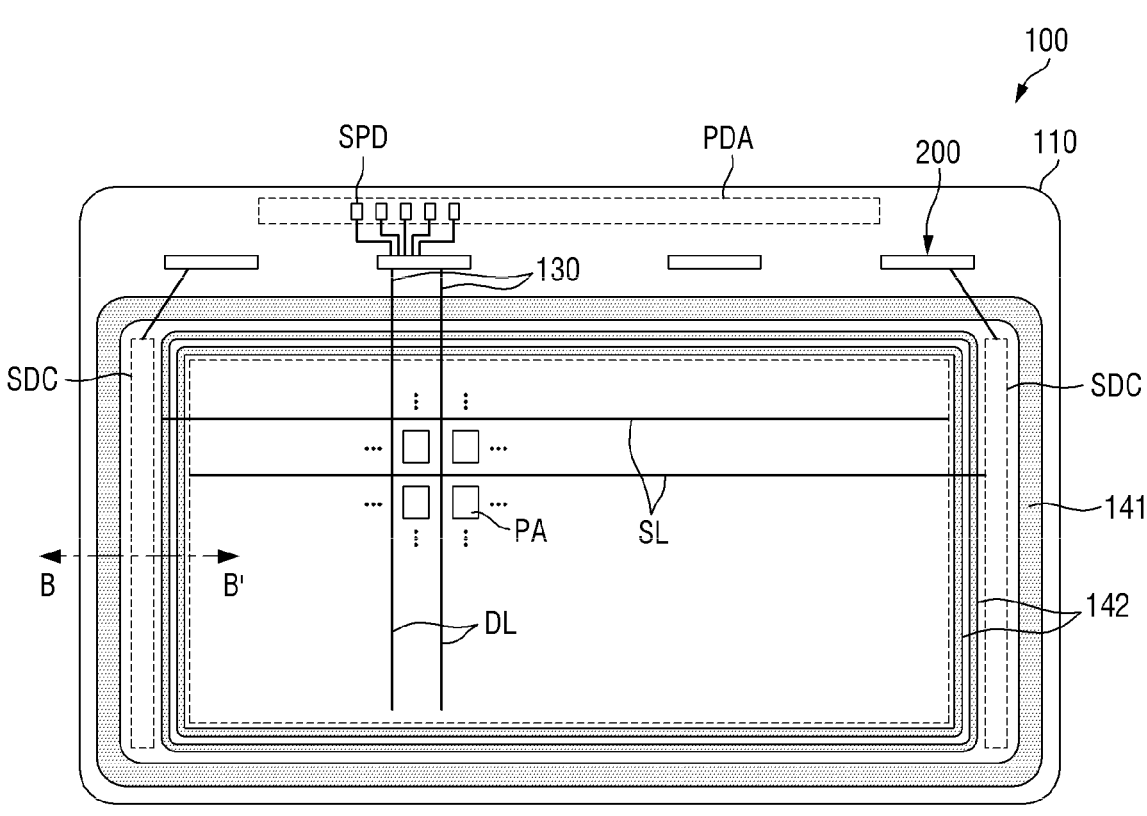
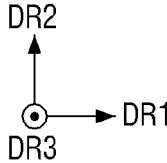

FIG. 13
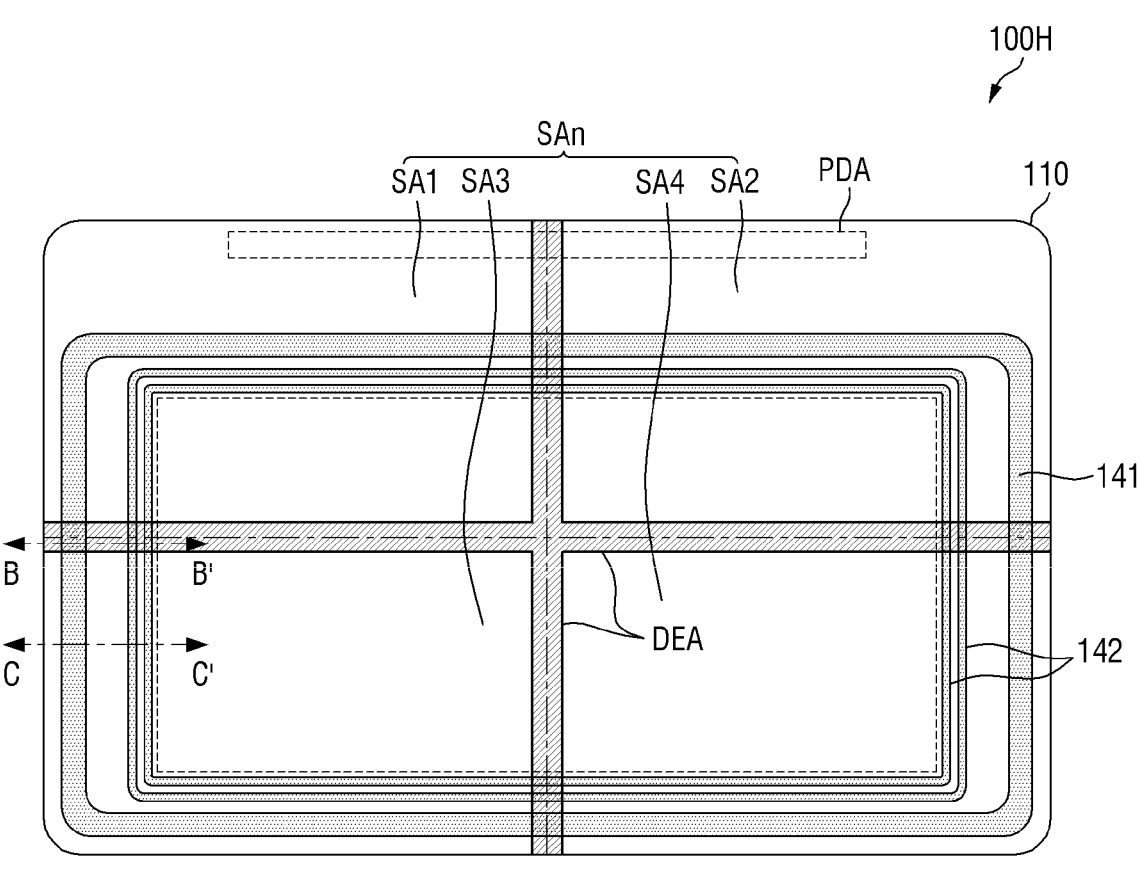
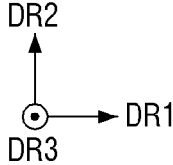

FIG. 15

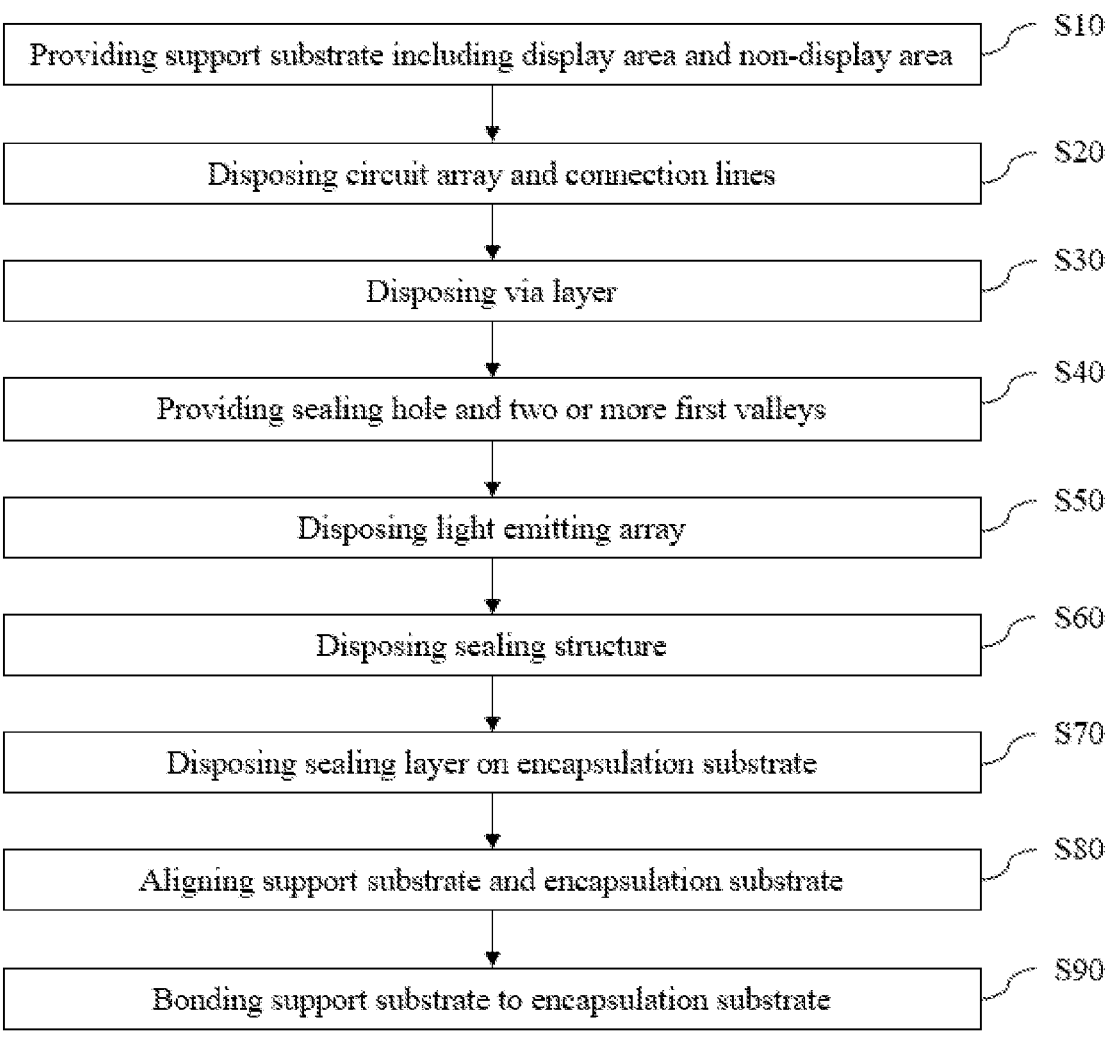

| | |
|---|---|
| Providing support substrate including display area and non-display area | S10 |
| Disposing circuit array and connection lines | S20 |
| Disposing via layer | S30 |
| Providing sealing hole and two or more first valleys | S40 |
| Disposing light emitting array | S50 |
| Disposing sealing structure | S60 |
| Disposing sealing layer on encapsulation substrate | S70 |
| Aligning support substrate and encapsulation substrate | S80 |
| Bonding support substrate to encapsulation substrate | S90 |

| Disposing mask material layer | S41 |
|---|---|
| Providing exposure mask | S42 |
| Disposing at least one contact hole of each of pixel areas | S43 |
| Providing change mask | S44 |
| Disposing sealing hole and two or more first valleys in non-display area | S45 |
| Removing change mask | S46 |

DISPLAY PANEL INCLUDING SUPPORT SUBSTRATE BONDED TO ENCAPSULATION SUBSTRATE AND METHOD FOR FABRICATING THE SAME

CROSS-REFERENCE TO RELATED APPLICATION

This application claims priority to Korean Patent Application No. 10-2021-0178203 filed on Dec. 14, 2021 in the Korean Intellectual Property Office; the Korean Patent Application is incorporated by reference.

BACKGROUND

1. Technical Field

The technical field relates to a display panel and a method for fabricating the display panel.

2. Description of the Related Art

Display apparatuses may display images in response to input signals. Display apparatuses have been applied to various electronic devices, such as smartphones, digital cameras, laptop computers, navigation devices, and smart televisions.

A display apparatus may include a display panel for emitting light to display images. The display panel may include two substrates, light emitting elements disposed between the two substrates, and a sealing member that bond the two substrates to each other. If the two substrates are not securely bonded to each other, the reliability of the display apparatus may not be satisfactory.

SUMMARY

Embodiments may be related to a display panel capable of preventing damage to a conductive member potentially caused by a sealing hole. Embodiments may be related to a method for fabricating the display panel.

According to an embodiment, a method for fabricating a display panel, comprises providing a support substrate comprising a display area and a non-display area, the display area in which a plurality of pixel areas is arranged, the non-display area being a periphery of the display area; disposing a circuit array and connection lines on the support substrate, the circuit array disposed in the display area and comprising thin film transistors and signal lines connected to the thin film transistors, and the connection lines disposed in the non-display area and connected to the signal lines; disposing a via layer covering the circuit array and the connection lines on the support substrate; providing a sealing hole having a shape surrounding the display area in the non-display area of the support substrate by patterning the via layer; disposing a sealing member having a shape surrounding the display area on an encapsulation substrate comprising at least the display area; aligning the support substrate and the encapsulation substrate in a direction in which the sealing member and the sealing hole face each other; and disposing the sealing member in the sealing hole and bonding the support substrate to the encapsulation substrate. In the disposing of the circuit array and the connection lines comprises disposing a light shielding member in one of the pixel areas and disposing a first connecting line part in the non-display area, by patterning a first conductive material layer on the support substrate; disposing a buffer layer covering the light shielding member and the first connecting line part on the support substrate; disposing an active layer overlapping the light shielding member and disposing an etch stopper corresponding to at least a portion of an overlapping area between the sealing hole and the first connecting line part, by patterning a semiconductor material layer on the buffer layer; disposing a stacked structure of a gate insulating layer and a gate electrode in a channel area of the active layer and disposing a stacked structure of the gate insulating layer and a second connecting line part in the non-display area, by patterning the first insulating material layer on the buffer layer and the second conductive material layer on the first insulating material layer; and disposing an interlayer insulating layer covering the active layer, the etch stopper, the gate electrode, and the second connecting line part on the buffer layer. Each of the connection lines comprises at least one of the first connecting line part and the second connecting line part.

The method for fabricating a display panel further comprises, after providing the sealing hole, disposing a light emitting array comprising light emitting elements respectively corresponding to the pixel areas on the via layer; and disposing a sealing structure covering the light emitting array. In the providing of the sealing hole, two or more first valleys are further provided in the non-display area of the support substrate. The two or more first valleys surround the display area and are more adjacent to the display area than the sealing hole. In the disposing of the active layer, the etch stopper further corresponds to at least a portion of an overlapping area between each of the two or more first valleys and the first connecting line part. In the providing of the sealing hole and the two or more first valleys, a first dam layer having the same layer as the via layer is provided between the two or more first valleys.

The providing of the sealing hole and the two or more first valleys comprises disposing a mask material layer of a first thickness on the via layer; providing an exposure mask comprising a first blocking portion, at least one first opening and a second blocking portion, through an exposure process using a halftone mask, the first blocking portion corresponding to each of the two or more first valleys and the sealing hole and having a second thickness smaller than the first thickness, the at least one first opening corresponding to each of the pixel areas and penetrating the mask material layer, and the second blocking portion being a remainder excluding the first blocking portion and the at least one first opening and made of the mask material layer of the first thickness; disposing at least one contact hole corresponding to each of the pixel areas by patterning the via layer corresponding to the at least one first opening of the exposure mask; providing a change mask comprising the at least one first opening, a third blocking portion and a second opening, through an ashing process for the exposure mask, the third blocking portion corresponding to the second blocking portion and having a third thickness smaller than the first thickness, and the second opening corresponding to the first blocking portion and exposing the via layer; disposing the sealing hole and the two or more first valleys by patterning the via layer corresponding to the second opening of the change mask; and removing the change mask.

In the providing of the sealing hole and the two or more first valleys, a portion of the interlayer insulating layer covering the etch stopper is patterned together with the via layer to expose a portion of the etch stopper, at least a portion of the exposed etch stopper is patterned, and the interlayer insulating layer comprises an undercut structure that corresponds to the patterned etch stopper and is spaced apart from the buffer layer.

In the disposing of the sealing hole and the two or more first valleys, the other portion of the etch stopper remains between the undercut structure of the interlayer insulating layer and the buffer layer.

In the disposing of the sealing hole and the two or more first valleys, the etch stopper is all removed.

In the providing of the exposure mask, the halftone mask corresponds to each of a plurality of separated areas into which the support substrate is divided, and the exposure process is performed on each of the separated areas. Each of the separated areas comprises a double exposure area adjacent to a boundary between the plurality of separated areas and repeatedly exposed to the exposure process. In the disposing of the active layer and the etch stopper, the etch stopper corresponds to the double exposure area of each of the two or more first valleys and the sealing hole.

The disposing of the circuit array and the connection lines further comprises, after disposing the interlayer insulating layer, disposing an auxiliary etch stopper corresponding to at least a portion of an overlapping area between each of the two or more first valleys and the sealing hole and the second connecting line part. In the disposing of the sealing hole and the two or more first valleys, the via layer comprises an undercut structure by the auxiliary etch stopper corresponding to at least a portion of the overlapping area between each of the two or more first valleys and the sealing hole and the second connecting line part.

In the disposing of the mask material layer, the mask material layer contains siloxane.

The disposing of the light emitting array comprises disposing pixel electrodes respectively corresponding to the pixel areas on the via layer; patterning a second insulating material layer on the via layer to dispose a pixel defining layer corresponding to a space between the pixel areas and covering an edge of each of the pixel electrodes; disposing a plurality of light emitting layers respectively on the pixel electrodes; and disposing a common electrode corresponding to the pixel areas on the pixel defining layer and the light emitting layers. In the disposing of the pixel defining layer, two or more second valleys respectively connected to the two or more first valleys are further disposed in the non-display area. In the disposing of the pixel defining layer and the two or more second valleys, a second dam layer having the same layer as the pixel defining layer is provided on the first dam layer between the two or more second valleys.

The disposing of the sealing structure comprises disposing a first sealing layer of an inorganic insulating material on the light emitting array; disposing a second sealing layer of an organic insulating material on the first sealing layer; and disposing a third sealing layer of the inorganic insulating material covering the second sealing layer on the first sealing layer. In the disposing of the first sealing layer, the first sealing layer covers the light emitting array and the second dam layer. In the disposing of the second sealing layer, the second sealing layer has an edge corresponding to the first dam layer and the second dam layer.

In the disposing of the at least one contact hole, a few of the at least one contact hole penetrates the via layer and the interlayer insulating layer, and a few other of the at least one contact hole penetrates the via layer, the interlayer insulating layer, and the buffer layer. In the disposing of the pixel electrodes, the pixel electrode is connected to a portion of the active layer in contact with one side of the channel area through a contact hole penetrating the via layer and the interlayer insulating layer.

According to an embodiment, a method for fabricating a display panel comprises providing a support substrate comprising a display area and a non-display area, the display area in which a plurality of pixel areas is arranged and the non-display area being a periphery of the display area; disposing a circuit array and connection lines on the support substrate, the circuit array disposed in the display area and comprising thin film transistors corresponding to the pixel areas and signal lines connected to the thin film transistors, the connection lines disposed in the non-display area and connected to the signal lines; disposing a via layer covering the circuit array and the connection lines on the support substrate; providing a sealing hole having a shape surrounding the display area in the non-display area of the support substrate by patterning the via layer; disposing a sealing member having a shape surrounding the display area on an encapsulation substrate comprising at least the display area; aligning the support substrate and the encapsulation substrate in a direction in which the sealing member and the sealing hole face each other; and disposing the sealing member in the sealing hole and bonding the support substrate to the encapsulation substrate through the sealing member.

The disposing of the circuit array and the connection lines comprises disposing a light shielding member in the pixel areas and disposing a first connecting line part in the non-display area, by patterning a first conductive material layer on the support substrate; disposing a buffer layer covering the light shielding member and the first connecting line part on the support substrate; disposing an active layer overlapping the light shielding member by patterning a semiconductor material layer on the buffer layer; disposing a stacked structure of a gate insulating layer and a gate electrode in a channel area of the active layer and disposing a stacked structure of the gate insulating layer and a second connecting line part in the non-display area, by patterning the first insulating material layer on the buffer layer and the second conductive material layer on the first insulating material layer; disposing an interlayer insulating layer covering the active layer, the gate electrode, and the second connecting line part on the buffer layer; and disposing an etch stopper corresponding to at least a portion of an overlapping area between the sealing hole and the first connecting line part and at least a portion of an overlapping area between the sealing hole and the second connecting line part. Each of the connection lines comprises at least one of the first connecting line part and the second connecting line part.

The method for fabricating a display panel further comprises, after providing the sealing hole, disposing a light emitting array comprising light emitting elements respectively corresponding to the pixel areas on the via layer; and disposing a sealing structure covering the light emitting array. In the providing of the sealing hole, two or more first valleys are further provided in the non-display area of the support substrate. The two or more first valleys surround the display area and are more adjacent to the display area than the sealing hole. In the disposing of the etch stopper, the etch stopper further corresponds to at least a portion of an overlapping area between each of the two or more first valleys and the first connecting line part, and at least a portion of an overlapping area between each of the two or more first valleys and the second connecting line part. In the providing of the sealing hole and the two or more first valleys, a first dam layer having the same layer as the via layer is provided between the two or more first valleys.

The providing of the sealing hole and the two or more first valleys comprises disposing a mask material layer of a first thickness on the via layer; providing an exposure mask comprising a first blocking portion, at least one first opening and a second blocking portion, through an exposure process using a halftone mask, the first blocking portion corresponding to each of the two or more first valleys and the sealing hole and having a second thickness smaller than the first thickness, the at least one first opening corresponding to each of the pixel areas and penetrating the mask material layer, and the second blocking portion being a remainder excluding the first blocking portion and the at least one first opening and made of the mask material layer of the first thickness; disposing at least one contact hole corresponding to each of the pixel areas by patterning the via layer corresponding to the at least one first opening of the exposure mask; providing a change mask comprising the at least one first opening, a third blocking portion and a second opening, through an ashing process for the exposure mask, the third blocking portion corresponding to the second blocking portion and having a third thickness smaller than the first thickness, and the second opening corresponding to the first blocking portion and exposing the via layer; disposing the sealing hole and the two or more first valleys by patterning the via layer corresponding to the second opening of the change mask; and removing the change mask.

In the disposing of the sealing hole and the two or more first valleys, at least a portion of the etch stopper is patterned, and the via layer comprises an undercut structure that corresponds to the patterned etch stopper and is spaced apart from the interlayer insulating layer.

In the disposing of the sealing hole and the two or more first valleys, the other portion of the etch stopper remains between the undercut structure of the via layer and the interlayer insulating layer.

In the disposing of the sealing hole and the two or more first valleys, the etch stopper is all removed.

In the providing of the exposure mask, the halftone mask corresponds to each of a plurality of separated areas into which the support substrate is divided, and the exposure process is performed on each of the separated areas. Each of the separated areas comprises a double exposure area adjacent to a boundary between the plurality of separated areas and repeatedly exposed to the exposure process. In the disposing of the etch stopper, the etch stopper further corresponds to the double exposure area.

In the disposing of the mask material layer, the mask material layer contains siloxane.

The disposing of the light emitting array comprises disposing pixel electrodes respectively corresponding to the pixel areas on the via layer; patterning a second insulating material layer on the via layer to dispose a pixel defining layer corresponding to a space between the pixel areas and covering an edge of each of the pixel electrodes; disposing a plurality of light emitting layers respectively on the pixel electrodes; and disposing a common electrode corresponding to the pixel areas on the pixel defining layer and the light emitting layers. In the disposing of the pixel defining layer, two or more second valleys respectively connected to the two or more first valleys are further disposed in the non-display area. In the disposing of the pixel defining layer and the two or more second valleys, a second dam layer having the same layer as the pixel defining layer is provided on the first dam layer between the two or more second valleys.

The disposing of the sealing structure comprises disposing a first sealing layer of an inorganic insulating material on the light emitting array; disposing a second sealing layer of an organic insulating material on the first sealing layer; and disposing a third sealing layer of the inorganic insulating material covering the second sealing layer on the first sealing layer. In the disposing of the first sealing layer, the first sealing layer covers the light emitting array and the second dam layer. In the disposing of the second sealing layer, the second sealing layer has an edge corresponding to the first dam layer and the second dam layer.

In the disposing of the at least one contact hole, a few of the at least one contact hole penetrates the via layer and the interlayer insulating layer, and a few other of the at least one contact hole penetrates the via layer, the interlayer insulating layer, and the buffer layer. In the disposing of the pixel electrodes, the pixel electrode is connected to a portion of the active layer in contact with one side of the channel area through a contact hole penetrating the via layer and the interlayer insulating layer.

According to an embodiment, a display panel comprises a support substrate comprising the display area in which a plurality of pixel areas is arranged and a non-display area that is a periphery of the display area; a circuit array comprising thin film transistors disposed in the display area on the support substrate and corresponding to the pixel areas, and signal lines connected to the thin film transistors; connection lines disposed in the non-display area on the support substrate and connected to the signal lines; a via layer disposed on the support substrate and covering the circuit array and the connection lines; a sealing hole disposed in the non-display area to surround the display area and penetrate the via layer; a sealing member disposed in the sealing hole on the support substrate; and an encapsulation substrate facing the support substrate and bonded to the support substrate by the sealing member. Each of the thin film transistors comprises a light shielding member disposed on the support substrate; a buffer layer disposed on the support substrate and covering the light shielding member; an active layer disposed on the buffer layer and overlapping the light shielding member; a gate insulating layer disposed on a channel area of the active layer; a gate electrode disposed on the gate insulating layer; and an interlayer insulating layer disposed on the buffer layer and covering the active layer and the gate electrode. Each of the connection lines comprises at least one of a first connecting line part having the same layer as the light shielding member and a second connecting line part having the same layer as the gate electrode. The interlayer insulating layer comprises a height difference due to an etch stopper which corresponds to at least a portion of an overlapping area between the sealing hole and the first connecting line part.

The etch stopper has the same layer as the active layer.

The display panel further comprises a light emitting array disposed on the via layer and comprising light emitting elements respectively corresponding to the pixel areas; a sealing structure covering the light emitting array; and two or more first valleys disposed in the non-display area, surrounding the display area, being more adjacent to the display area than the sealing hole, spaced apart from each other, and penetrating the via layer. The interlayer insulating layer further comprises a height difference due to an etch stopper which corresponds to at least a portion of an overlapping area between each of the two or more first valleys and the first connecting line part.

At least a portion of the etch stopper is patterned together with a via layer corresponding to each of the two or more first valleys and the sealing hole. The interlayer insulating layer comprises an undercut structure that corresponds to the patterned etch stopper and is spaced apart from the buffer layer.

The other portion of the etch stopper remains between the undercut structure of the interlayer insulating layer and the buffer layer.

The etch stopper is removed all together with the via layer corresponding to each of the two or more first valleys and the sealing hole.

The support substrate is divided into a plurality of separated areas. Each of the separated areas comprises a double exposure area adjacent to a boundary between the plurality of separated areas. The etch stopper corresponds to the double exposure area of each of the two or more first valleys and the sealing hole.

The via layer corresponds to at least a portion of an overlapping area between each of the two or more first valleys and the sealing hole and the second connecting line part and comprises an undercut structure by an auxiliary etch stopper disposed on the interlayer insulating layer.

The light emitting array comprises pixel electrodes disposed on the via layer and respectively corresponding to the pixel areas; a pixel defining layer disposed on the via layer, corresponding to a boundary between the pixel areas, and covering an edge of each of the pixel electrodes; a plurality of light emitting layers respectively disposed on the pixel electrodes; and a common electrode disposed on the pixel defining layer and the light emitting layers and corresponding to the pixel areas. The display panel further comprising two or more second valleys respectively connected to the two or more first valleys while penetrating the pixel defining layer.

The display panel further comprises a first dam layer disposed between the two or more first valleys and having the same layer as the via layer; and a second dam layer disposed on the first dam layer and having the same layer as the pixel defining layer. The sealing structure comprises a first sealing layer covering the light emitting array and the second dam layer and made of an inorganic insulating material; a second sealing layer disposed on the first sealing layer and made of an organic insulating material, the second sealing layer having an edge corresponding to the first and second dam layers; and a third sealing layer disposed on the first sealing layer and made of the inorganic insulating material, the third sealing layer covering the second sealing layer.

The pixel electrode is connected to a portion of the active layer in contact with one side of the channel area through a contact hole penetrating the via layer and the interlayer insulating layer.

The display panel further comprises a scan driving circuit disposed in the non-display area on the support substrate and configured to drive a plurality of scan lines supplying scan signals to the pixel areas among the signal lines. The scan driving circuit is disposed between the sealing hole and the two or more first valleys and is covered with the via layer.

According to embodiments, the display panel includes an etch stopper, in which a sealing member is disposed, corresponding to at least a portion of an overlapping area between a sealing hole penetrating a via layer and a first connecting line part disposed in a non-display area on the support substrate. Accordingly, during the patterning process for disposing the sealing hole, the first connecting line part may be protected by the etch stopper.

Here, since the etch stopper is provided as the same layer as the active layer. Advantageously, the number of mask processes may be minimized.

According to embodiments, since the sealing hole is provided in a state in which the interlayer insulating layer covers the etch stopper, the interlayer insulating layer may include a height difference and/or an undercut structure corresponding to the etch stopper. As a result, the contact area between the sealing member and the interlayer insulating layer may be increased, so that the reliability of the adhesion and sealing may be improved.

Advantageously, unwanted oxygen and moisture may be effectively blocked.

According to embodiments, the display panel includes an etch stopper disposed on the interlayer insulating layer through a separate mask process. Here, the etch stopper corresponds to at least a portion of an overlapping area between the sealing hole and the first connecting line part and at least a portion of an overlapping area between the sealing hole and the second connecting line part disposed on the gate insulating layer. In this way, during the patterning process for disposing the sealing hole, both the first connecting line part and the second connecting line part may be protected by the etch stopper.

However, the effects of the present disclosure are not limited to the aforementioned effects, and various other effects are included in the present specification.

BRIEF DESCRIPTION OF THE DRAWINGS

FIG. 3 is a plan view illustrating a support substrate and a circuit array shown in FIG. 2 according to an embodiment.

FIG. 13 is a plan view illustrating separated areas in a support substrate according to an embodiment.

FIG. 15, FIG. 16, and FIG. 17 are flowcharts illustrating one or more methods for fabricating a display panel according to the one or more embodiments.

FIG. 18, FIG. 19, FIG. 20, FIG. 21, FIG. 22, FIG. 23, FIG. 24, FIG. 25, FIG. 26, FIG. 27, FIG. 28, FIG. 29, FIG. 30, FIG. 31, FIG. 32, FIG. 33, FIG. 34, FIG. 35, FIG. 36, FIG. 37, FIG. 38, FIG. 39, FIG. 40, FIG. 41, FIG. 42, FIG. 43,

FIG. 47 illustrates disposing the via layer after disposing the etch stopper according to an embodiment.

DETAILED DESCRIPTION OF THE EMBODIMENTS

Figure 1:
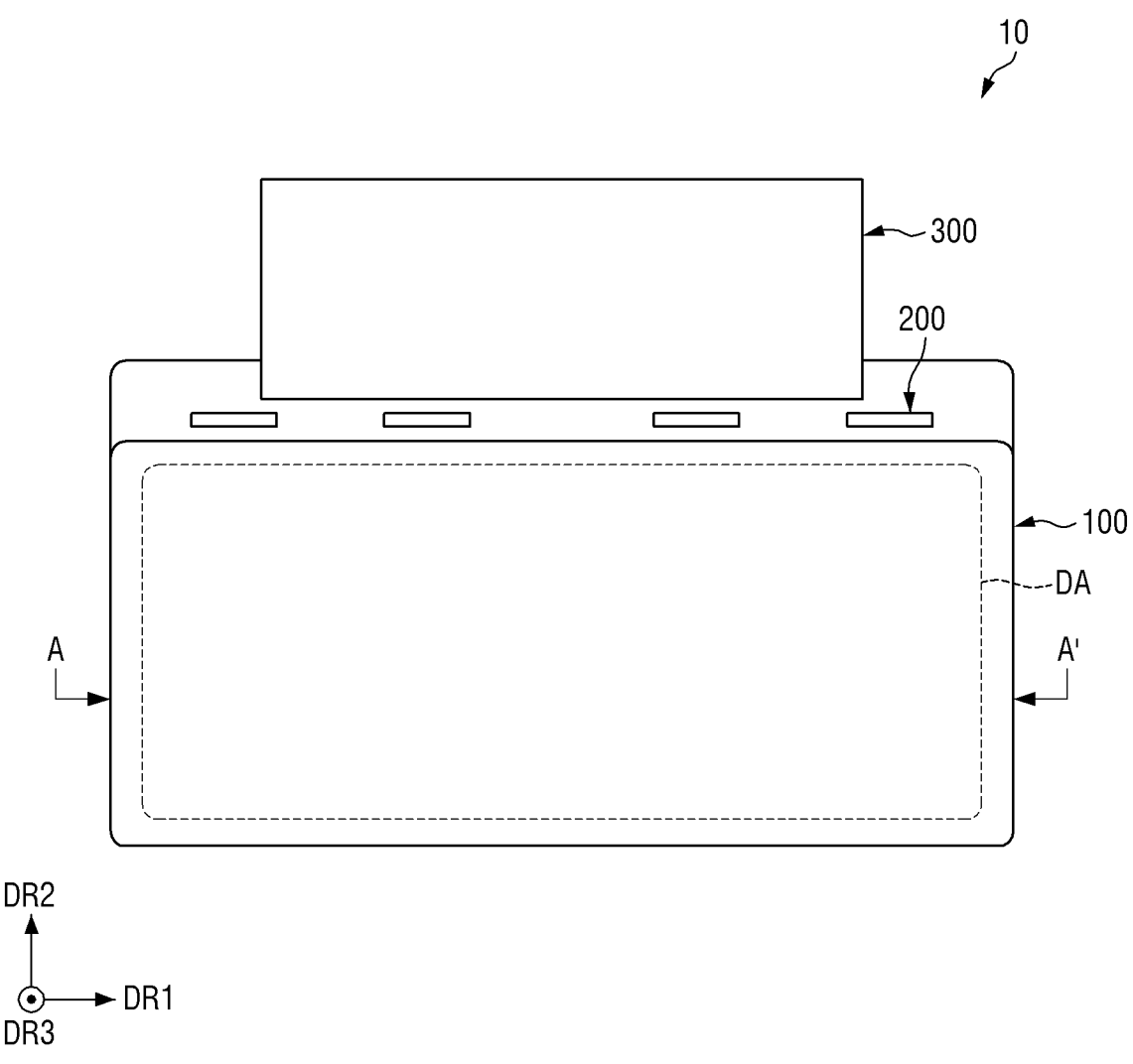
FIG. 1 is a plan view illustrating a display device according to an embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination of some of the above terms.

It will be understood that, although the terms "first," "second," "third," or the like may be used herein to describe various elements, these elements should not be limited by these terms. These terms are used to distinguish one element from another element or for the convenience of description and explanation of some of the above terms. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

Figure 2:
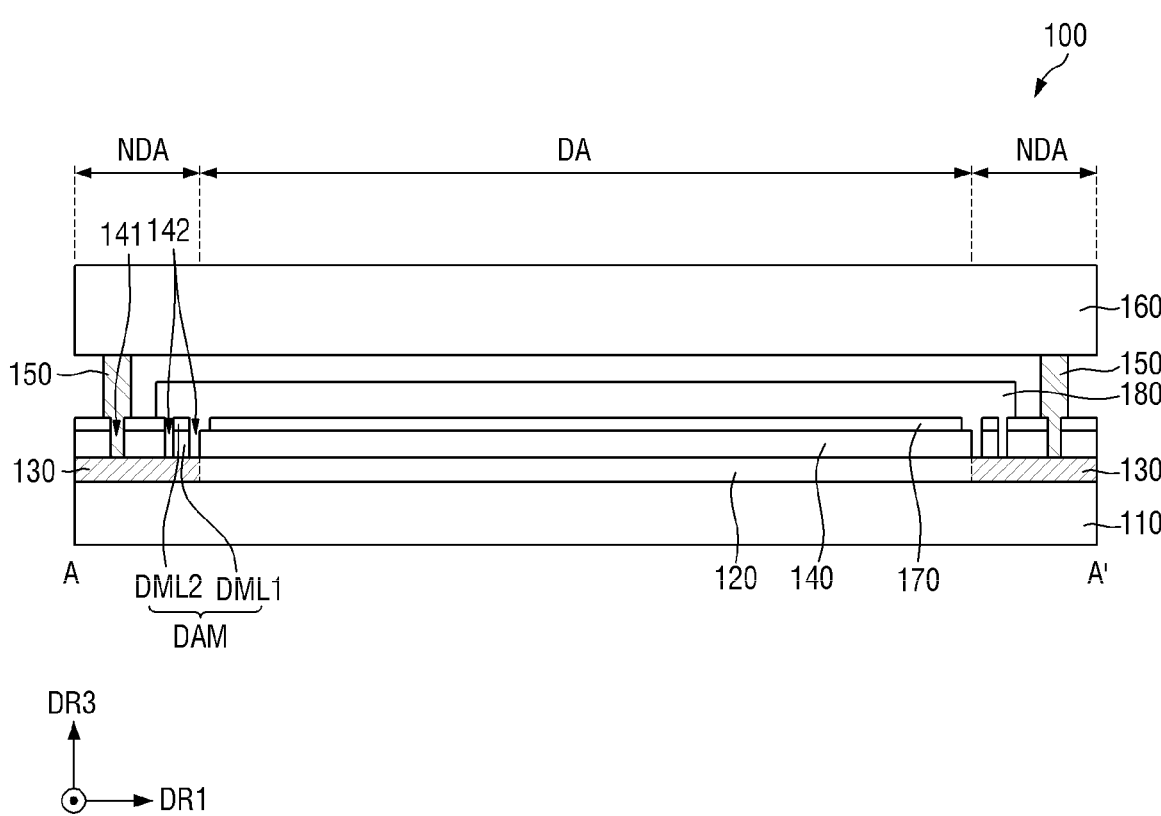
FIG. 2 is a cross-sectional view taken along line A-A' of FIG. 1 according to an embodiment.
Figure 4:
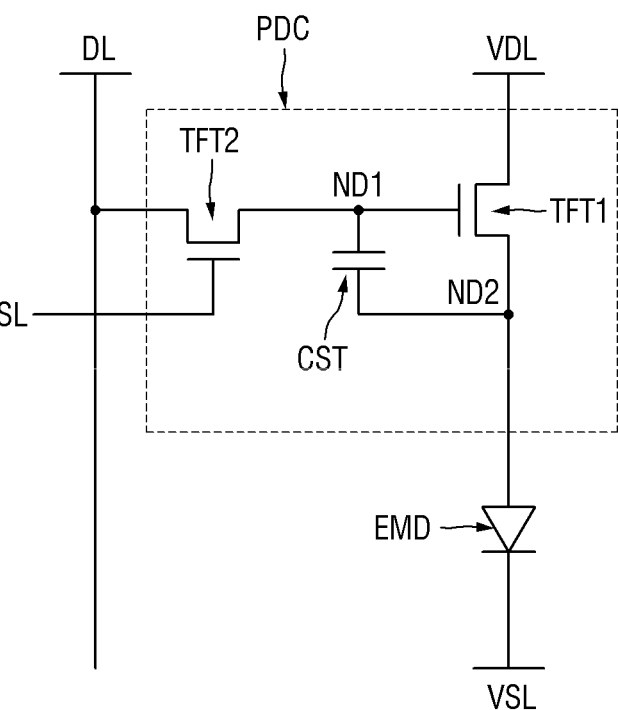
FIG. 4 is an equivalent circuit diagram illustrating a pixel driving circuit corresponding to a pixel area shown in FIG. 3 according to an embodiment.
Figure 5:
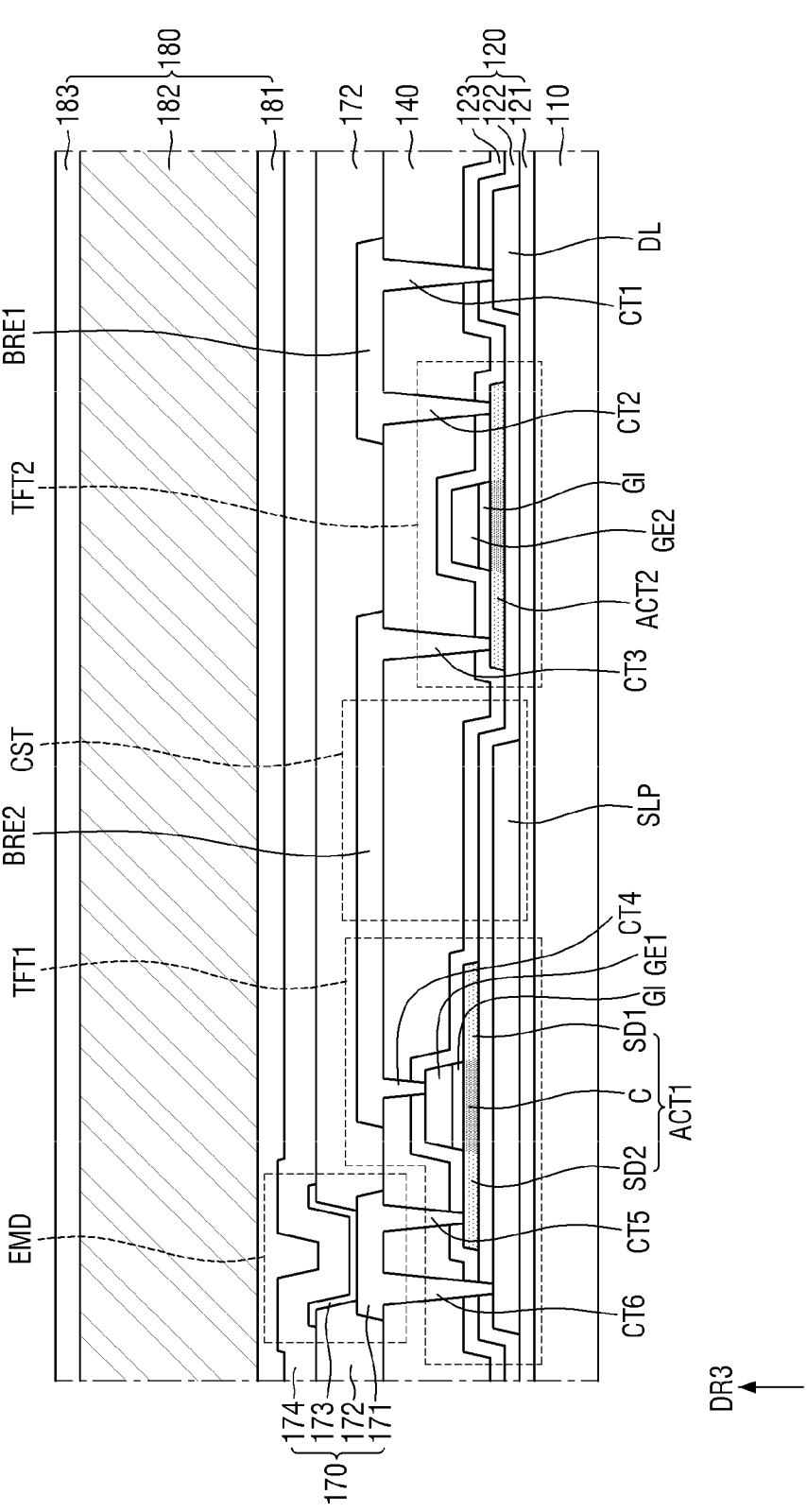
FIG. 5 is a cross-sectional view illustrating a first thin film transistor, a second thin film transistor, and a storage capacitor shown in FIG. 4 according to an embodiment.

FIG. 1 is a plan view illustrating a display device according to an embodiment. FIG. 2 is a cross-sectional view taken along line A-A' of FIG. 1 according to an embodiment. FIG. 3 is a plan view illustrating a support substrate and a circuit array shown in FIG. 2 according to an embodiment. FIG. 4 is an equivalent circuit diagram illustrating a pixel driving circuit corresponding to a pixel area shown in FIG. 3 according to an embodiment. FIG. 5 is a cross-sectional view illustrating a first thin film transistor, a second thin film transistor, and a storage capacitor shown in FIG. 4 according to an embodiment.

Referring to FIG. 1, a display device 10 according to an embodiment is a device that provides a screen for displaying an image.

The display device 10 may include a flat plate display panel 100 emitting light for displaying an image, a display driving circuit 200 supplying a signal or power for driving the display panel 100, and a display circuit board 300.

For example, the display device 10 may be provided in portable electronic devices such as a mobile phone, a smartphone, a tablet personal computer, a mobile communication terminal, an electronic organizer, an electronic book, a portable multimedia player (PMP), a navigation system, an ultra mobile PC (UMPC), or the like. Alternatively, the display device 10 may be provided in a display unit of a television, a laptop, a monitor, a billboard, or an Internet-of-Things (IoT) device. Alternatively, the display device 10 may be provided in wearable devices such as a smart watch, a watch phone, a glasses type display, or a head mounted display (HMD). Alternatively, the display device 10 may be provided in a dashboard of a vehicle, a center fascia of a vehicle, a center information display (CID) disposed on a dashboard of a vehicle, a room mirror display in place of side mirrors of a vehicle, or a display disposed on a rear surface of a front seat for rear seat entertainment of a vehicle.

The display device 10 may be an organic light emitting display device using an organic light emitting diode. However, one embodiment is not limited to the organic light emitting display device, and any structure including an organic layer for sealing may be applied. As one example, the display device 10 may be any one of a quantum dot light emitting display device including a quantum dot light emitting layer, an inorganic light emitting display device including an inorganic semiconductor, and a micro or nano light emitting display device using a micro or nano light emitting diode (micro LED or nano LED).

The display panel 100 is provided in a flat plate shape and includes a display area DA.

The display panel 100 may be flexible and may be easily deformed. In this case, at least one side of the display panel 100 may have a shape curved, bent, folded, or rolled.

The display area DA may have a quadrilateral shape including a long side in the first direction DR1 and a short side in the second direction DR2 perpendicular to the first direction DR1. At the corner of the display area DA, a long side in the first direction DR1 and a short side in the second direction DR2 may form a straight line and form a contact point of the right-angled shape. Alternatively, at the corner of the display area DA, a long side in the first direction DR1 and a short side in the second direction DR2 may also be formed as a curved line.

The display area DA according to one embodiment is not limited to a quadrilateral shape, and may be variously deformed, such as a polygonal shape, a circular shape, and an elliptical shape, depending on a device to which the display device 10 is applied.

The display driving circuit 200 may be provided as an integrated circuit chip. The integrated circuit chip of the display driving circuit 200 may be mounted on at least one side edge (upper side edge of FIG. 1) of the display panel 100.

As one example, the integrated circuit chip of the display driving circuit 200 may be directly mounted on the display panel 100 by a chip on glass (COG) method, a chip on plastic (COP) method, or an ultrasonic bonding method.

Alternatively, unlike the illustration of FIG. 1, the integrated circuit chip of the display driving circuit 200 may be mounted on the display circuit board 300.

The display circuit board 300 may include an anisotropic conductive film. For example, the circuit board 300 may be a flexible printed circuit board, a printed circuit board, or a flexible film such as a chip on film.

The display circuit board 300 may be attached to a signal pad disposed on at least one side edge (upper side edge of FIG. 1) of the display panel 100. Accordingly, the lead line (not illustrated) of the display circuit board 300 may be electrically connected to the signal pad of the display panel 100.

Unlike the illustration in FIG. 1, the display device 10 may further include a touch sensing unit (not illustrated) for sensing a user's touch point in the display area DA, and a touch driving circuit (not illustrated) that drives the touch sensing unit.

The touch sensing unit may be embedded in the display panel 100 or disposed on the display panel 100.

The touch driving circuit may be provided as an integrated circuit chip, and the integrated circuit chip of the touch driving circuit may be mounted on the display panel 100 or the display circuit board 300.

Referring to FIG. 2, the display panel 100 includes a support substrate 110, a circuit array 120 and connection lines 130 disposed on the support substrate 110, a via layer 140 covering the circuit array 120, a sealing hole 141 penetrating the via layer 140, a sealing member 150 disposed in the sealing hole 141, and an encapsulation substrate 160 that opposes the support substrate 110 and is bonded to the support substrate 110 by the sealing member 150.

In addition, the display panel 100 may further include a light emitting array 170 disposed on the via layer 140, a sealing structure 180 covering the light emitting array 170, and two or more first valleys 142 penetrating the via layer 140, adjacent closer to the display area DA than the sealing hole 141, and spaced apart from each other.

The support substrate 110 includes the display area DA in which a plurality of pixel areas is arranged, and a non-display area NDA at the periphery of the display area DA.

The support substrate 110 may be formed of an insulating material such as glass, quartz, or a polymer resin. Examples of the polymer resin may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (TAC), cellulose acetate propionate (CAP), or a combination of some of the above materials.

The circuit array 120 is disposed in the display area DA on the support substrate 110. The circuit array 120 includes a plurality of pixel driving circuits PDC of FIG. 4 respectively corresponding to a plurality of pixel areas PA of FIG. 3 arranged in the display area DA, and signal lines SL and DL of FIG. 3 connected to the plurality of the pixel driving circuits PDC of FIG. 4. Each of the pixel driving circuits PDC in FIG. 4 includes at least one thin film transistor TFT1 or TFT2 in FIG. 4.

That is, the circuit array 120 includes thin film transistors TFT1 and TFT2 of FIG. 4 and the signal lines SL and DL of FIG. 3 corresponding to the pixel areas PA of FIG. 3.

The connection lines 130 are disposed in the non-display area NDA on the support substrate 110 and are connected to the signal lines SL and DL of FIG. 3 of the circuit array 120.

The via layer 140 is disposed on the support substrate 110 and covers the circuit array 120 and the connection lines 130.

The sealing hole 141 is disposed in the non-display area NDA and penetrates the via layer 140. That is, at least a portion of the connection lines 130 overlaps the sealing hole 141.

The two or more first valleys 142 are disposed between the sealing hole 141 and the display area DA in the non-display area NDA and penetrate the via layer 140.

Referring to FIG. 3, the sealing hole 141 and each of the two or more first valleys 142 have a frame shape surrounding the display area DA. Since the two or more first valleys 142 are disposed closer to the display area DA than the sealing hole 141, the two or more first valleys 142 may have a smaller perimeter than the sealing hole 141.

As illustrated in FIG. 2, the light emitting array 170 is disposed in the display area DA on the via layer 140.

The sealing structure 180 covers the light emitting array 170. The sealing structure 180 may extend to cover at least one of the two or more first valleys 142 in the order adjacent to the display area DA. However, the sealing structure 180 is spaced apart from the sealing hole 141.

The sealing member 150 is disposed in the sealing hole 141. The sealing member 150 may fill the sealing hole 141 and may extend to the periphery of the sealing hole 141.

The sealing member 150 may be formed of an adhesive material that is cured by heat or light. As one example, the sealing member 150 may include a frit. Alternatively, the sealing member 150 may include an epoxy-based resin.

Like the support substrate 110, the encapsulation substrate 160 may be made of an insulating material such as glass, quartz, or polymer resin.

Referring to FIG. 3, the support substrate 110 includes the display area DA in which an image is displayed and the non-display area NDA at the periphery of the display area DA.

The display area DA includes the pixel areas PA that are arranged in a matrix.

The circuit array 120 in FIG. 2 corresponding to the display area DA corresponds to the pixel areas PA, and includes the plurality of pixel driving circuits PDC of FIG. 4 including at least one thin film transistor TFT1 or TFT2 in FIG. 4 and signal lines connected to the thin film transistors provided in the plurality of pixel driving circuits PDC in FIG. 4.

The signal lines provided in the circuit array 120 may include the scan line SL supplying scan signals to the pixel areas PA, and the data line DL supplying data signals to the pixel areas PA.

The scan line SL may be connected to the pixel areas arranged in the first direction DR1.

The data line DL may be connected to the pixel areas arranged in the second direction DR2.

The sealing hole 141 may be disposed in the non-display area NDA in a shape surrounding the display area DA. Here, the sealing hole 141 is for disposing the sealing member 150 of FIG. 2 for bonding between the support substrate 110 and the encapsulation substrate 160 of FIG. 2.

The two or more first valleys 142 are disposed in the non-display area NDA in a shape surrounding the display area DA, and are adjacent closer to the display area DA than the sealing hole 141 and are spaced apart from each other. Here, the two or more first valleys 142 are provided as barriers that limit the diffusion range of the organic insulating material in the sealing structure 180.

The integrated circuit chip of the display driving circuit 200 may be disposed in a portion of the non-display area NDA adjacent to at least one side corner of the display area DA in the second direction DR2. When the display driving circuit 200 is provided with a plurality of integrated circuit chips, the integrated circuit chips of the display driving circuit 200 may be arranged in parallel with each other.

The display panel 100 may further include a plurality of signal pads SPD connected to the display circuit board 300. The plurality of signal pads SPD may be disposed in a pad area PDA between the integrated circuit chip of the display driving circuit 200 and the edge of the support substrate 110 in the non-display area NDA.

The display panel 100 may further include a scan driving circuit SDC disposed in the non-display area NDA and connected to the scan line SL of the display area DA. The scan driving circuit SDC may be disposed in a portion of the non-display area NDA adjacent to at least one side corner of the display area DA in the first direction DR1.

As one example, the scan driving circuit SDC may include a first scan driving circuit in contact with one side corner of the display area DA in the first direction DR1 and a second scan driving circuit in contact with the other side corner of the display area DA in the first direction DR1.

On the other hand, according to one embodiment, the scan driving circuit SDC may be spaced apart from the sealing hole 141 from which the via layer 140 is removed and the two or more first valleys 142. That is, the scan driving circuit SDC may be disposed between the sealing hole 141 and the two or more first valleys 142. In this way, the scan driving circuit SDC may be protected by the via layer 140 regardless of the sealing hole 141 and the two or more first valleys 142.

The display panel 100 includes the connection lines 130 of FIG. 2 disposed in the non-display area NDA and connected to the signal lines SL and DL of the circuit array 120.

The connection lines 130 of FIG. 2 connect each of the signal lines SL and DL of the circuit array 120 to at least one of the signal pad SPD, the integrated circuit chip of the display driving circuit 200, and the scan driving circuit SDC.

One of the pixel areas PA includes a light emitting element EMD and a pixel driving circuit PDC supplying a driving current to the light emitting element EMD.

As one example, referring to FIG. 4, the pixel driving circuit PDC may include the first thin film transistor TFT1, the second thin film transistor TFT2, and a storage capacitor CST.

The light emitting element EMD may be an organic light emitting diode including a pixel electrode and a common electrode opposing each other, and a light emitting layer of an organic light emitting material interposed between the pixel electrode and the common electrode. Alternatively, the light emitting element EMD may also include a light emitting layer made of an inorganic photoelectric conversion material instead of an organic light emitting material.

Here, the anode electrode of the light emitting element EMD may be a pixel electrode corresponding to each pixel area, and the cathode electrode of the light emitting element EMD may be a common electrode corresponding entirely to the pixel areas PA.

The first thin film transistor TFT1 is connected to the light emitting element EMD in series between a first driving power line ELVDL supplying the first driving power and a second driving power line ELVSL supplying the second driving power lower than the first driving power.

As one example, one end of the first thin film transistor TFT1 may be connected to the first driving power line ELVDL, and the other end of the first thin film transistor TFT2 may be connected to the anode electrode of the light emitting element EMD. In addition, the cathode electrode of the light emitting element EMD may be connected to the second driving power line ELVSL.

The gate electrode of the first thin film transistor TFT1 is connected to the second thin film transistor TFT2.

The storage capacitor CST is disposed between a first node ND1 and a second node ND2. Here, the first node ND1 is a contact point between the gate electrode of the first thin film transistor TFT1 and the second thin film transistor TFT2. The second node ND2 is a contact point between the first thin film transistor TFT1 and the light emitting element EMD.

That is, the storage capacitor CST maintains the voltage difference between the gate voltage of the first thin film transistor TFT1 and the output terminal of the first thin film transistor TFT1 to maintain the supply of the driving current by the first thin film transistor TFT1 for a predetermined period of time.

The second thin film transistor TFT2 is disposed between the data line DL and the first node ND1 and is turned on based on a scan signal of the scan line SL. That is, the gate electrode of the second thin film transistor TFT2 is connected to the scan line SL, one end of the second thin film transistor TFT2 is connected to the data line DL, and the other end of the second thin film transistor TFT2 is connected to the gate electrode of the first thin film transistor TFT1 and the storage capacitor CST.

Accordingly, when the second thin film transistor TFT2 is turned on based on the scan signal supplied through the scan line SL, the data signal of the data line DL is transmitted to the first node ND1 through the second thin film transistor TFT2. In addition, the first thin film transistor TFT1 is turned on based on the data signal of the first node ND1, and a driving current having a magnitude corresponding to the voltage difference between the first node ND1 and the first driving power line ELVDL is generated. Accordingly, the light emitting element EMD emits light having a luminance corresponding to the driving current generated by the first thin film transistor TFT1.

Meanwhile, although FIG. 4 illustrates the pixel driving circuit PDC having a 2T1C structure, this is only an example. That is, the pixel driving circuit PDC of the display panel 100 according to one embodiment is not limited to the example of FIG. 4, and may have a structure including three or more thin film transistors or two or more capacitors.

Although FIG. 4 illustrates that the first thin film transistor TFT1 and the second thin film transistor TFT2 are metal oxide semiconductor field effect transistors (MOSFET), this is only an example. That is, the pixel driving circuit PDC of the display panel 100 according to one embodiment may also include at least one P-type MOSFET.

Referring to FIG. 5, the first thin film transistor TFT1 of each pixel driving circuit PDC of the pixel array 120 may include a light shielding member SLP disposed on the support substrate 110, a first active layer ACT1 disposed on a buffer layer 122 covering the light shielding member SLP and overlapping the light shielding member SLP, a stacked structure of a gate insulating layer GI and a first gate electrode GE1 disposed on the channel area of the first active layer ACT1, and an interlayer insulating layer 123 covering the first active layer ACT1 and the first gate electrode GE1.

The support substrate 110 may be made of a material having a flexible characteristic capable of bending, folding, rolling, or the like.

The support substrate 110 may be formed of an insulating material such as a polymer resin. As one example, the support substrate 110 may be made of polyimide.

The pixel array 120 may further include a barrier layer 121 to prevent permeation of oxygen or moisture through the support substrate 110. In this case, the light shielding member SLP of the first thin film transistor TFT1 may be disposed on the barrier layer 121.

For example, each of the barrier layer 121 and the buffer layer 122 may be formed of multiple layers in which one or more inorganic layers of a silicon nitride layer, a silicon oxynitride layer, a silicon oxide layer, a titanium oxide layer and an aluminum oxide layer are alternately stacked.

The light shielding member SLP may be formed of a material having light shielding properties and conductivity. As one example, the light shielding member SLP may include a metal material.

The first active layer ACT1 may include a channel area C in which a carrier movement path is generated according to the voltage of the first gate electrode GE1, and a first source drain area SD1 and a second source drain area SD2 in contact with both sides of the channel area C.

The first source drain area SD1 and the second source drain area SD2 of the first active layer ACT1 may be formed to have conductivity by doping a semiconductor material with ions or impurities. In this case, it may function as a source electrode and a drain electrode of the first thin film transistor TFT1.

The first active layer ACT1 may include polycrystalline silicon, monocrystalline silicon, low-temperature polycrystalline silicon, amorphous silicon, or an oxide semiconductor.

The gate insulating layer GI may be formed of an inorganic layer of a silicon nitride layer, a silicon oxynitride layer, a silicon oxide layer, a titanium oxide layer, or an aluminum oxide layer.

The first gate electrode GE1 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy of some of the above metals.

The interlayer insulating layer 123 may be formed of multiple layers in which one or more inorganic layers of a silicon nitride layer, a silicon oxynitride layer, a silicon oxide layer, a titanium oxide layer and an aluminum oxide layer are alternately stacked.

The second thin film transistor TFT2 of each pixel driving circuit PDC of the pixel array 120 may include a second active layer ACT2 disposed on the buffer layer 122, a stacked structure of the gate insulating layer GI and the second gate electrode GE2 disposed on the channel area of the second active layer ACT2, and the interlayer insulating layer 123 covering the second active layer ACT2 and the second gate electrode GE2.

The pixel array 120 of the display panel 100 according to one embodiment may have a structure that does not include a conductive member on the interlayer insulating layer 123. Accordingly, it may be advantageous for reducing the number of mask processes required for manufacturing the display panel 100.

In this case, the data line DL needs to be disposed on a different layer from the second gate electrode GE2 of the second thin film transistor TFT2 connected to the scan line SL to be insulated from the scan line SL. However, since the conductive member on the interlayer insulating layer 123 is excluded, the data line DL may be disposed on the same layer as the light shielding member SLP.

The circuit array 120 is covered with the via layer 140.

The via layer 140 may be disposed on the interlayer insulating layer 123, and made of an organic layer such as an acryl resin, an epoxy resin, a phenolic resin, a polyamide resin, and a polyimide resin. Alternatively, the via layer 140 may also be formed to have a structure in which two or more organic layers having different materials or different thicknesses are stacked.

In addition, according to one embodiment, in order to exclude the conductive member on the interlayer insulating layer 123, a first bridge electrode BRE1 for connecting one side (right side of FIG. 5) of the second active layer ACT2 of the second thin film transistor TFT2 with the data line DL may be disposed on the via layer 140 like a pixel electrode 171.

In addition, according to one embodiment, in order to exclude the conductive member on the interlayer insulating layer 123, a second bridge electrode BRE2 for connecting the other side (left side of FIG. 5) of the second active layer ACT2 of the second thin film transistor TFT2 with the first gate electrodes GE1 of the first thin film transistor TFT1 may also be disposed on the via layer 140 like the pixel electrode 171.

Here, the first bridge electrode BRE1 and the second bridge electrode BRE2 are not only spaced apart from each other, but also spaced apart from the pixel electrode 171.

The display panel 100 may further include at least one of contact holes CT1, CT2, CT3, CT4, CT5, and CT6 corresponding to each of the pixel areas PA and penetrating at least the via layer 140 and the interlayer insulating layer 123. A portion of at least one of the contact holes CT1, CT2, CT3, CT4, CT5, and CT6 may further penetrate the buffer layer 122.

As one example, the first bridge electrode BRE1 may be connected to the data line DL through the first contact hole CT1 corresponding to a portion of the data line DL and penetrating the via layer 140, the interlayer insulating layer 123, and the buffer layer 122, and may be connected to one side (e.g., a source area) of the second active layer ACT2 through the second contact hole CT2 corresponding to a portion of one side of the second active layer ACT2 and penetrating the via layer 140 and the interlayer insulating layer 123.

The second bridge electrode BRE2 may be connected to the other side (e.g., a drain area) of the second active layer ACT2 through the third contact hole CT3 corresponding to a portion of the other side of the second active layer ACT2 and penetrating the via layer 140 and the interlayer insulating layer 123, and may be connected to the first gate electrode GE1 of the first thin film transistor TFT1 through the fourth contact hole CT4 corresponding to a portion of the first gate electrode GE1 and penetrating the via layer 140 and the interlayer insulating layer 123.

The light emitting array 170 is disposed on the via layer 140 and includes light emitting elements EMD corresponding to the pixel areas PA.

Each of the light emitting elements EMD may include the pixel electrode 171 and a common electrode 174 that oppose each other, and a light emitting layer 173 interposed between the pixel electrode 171 and the common electrode 174.

That is, the light emitting array 170 may include a plurality of pixel electrodes 171 disposed on the via layer 140 and respectively corresponding to the pixel areas PA, the pixel defining layer 172 disposed on the via layer 140, corresponding to the boundary between the pixel areas PA, and covering the edge of each of the pixel electrodes 171, a plurality of light emitting layers 173 respectively disposed on the pixel electrodes 171, and the common electrode 174 disposed on the pixel defining layer 172 and the light emitting layers 173 and corresponding entirely to the pixel areas PA.

The pixel electrode 171 may be formed of a metal material, having high reflectivity, such as a stacked structure (Ti—Al—Ti) of aluminum (Al) and titanium (Ti), a stacked structure (ITO-Al-ITO) of Al and indium tin oxide (ITO), an APC alloy, a stacked structure (ITO-APC-ITO) of an APC alloy and ITO, or the like. The APC alloy is an alloy of silver (Ag), palladium (Pd) and copper (Cu).

The pixel defining layer 172 may be formed of an organic layer such as acryl resin, epoxy resin, phenolic resin, polyamide resin, polyimide resin and the like.

The light emitting layer 173 may be made of an organic light emitting material.

Although not illustrated in FIG. 5, the light emitting element EMD according to one embodiment may further include a hole transport layer (not illustrated) disposed between the pixel electrode 171 and the light emitting layer 173 and including a hole transport material, and an electron transport layer (not illustrated) disposed between the light emitting layer 173 and the common electrode 174 and including an electron transport material.

The common electrode 174 may include a transparent conductive material (TCO) such as ITO or IZO that can transmit light or a semi-transmissive conductive material such as magnesium (Mg), silver (Ag), or an alloy of Mg and Ag. When the common electrode 174 is made of a semi-transmissive conductive material, an improvement in light output efficiency due to a micro cavity may be expected.

In each of the pixel areas PA, the pixel electrode 171 may be connected to one side (left side of FIG. 5) of the first active layer ACT1 of the first thin film transistor TFT1 through the fifth contact hole CT5 penetrating through the via layer 140 and the interlayer insulating layer 123.

In addition, the pixel electrode 171 may be connected to the light shielding member SLP through the sixth contact hole CT6 corresponding to a portion of the light shielding member SLP and penetrating the via layer 140, the interlayer insulating layer 123, and the buffer layer 122.

That is, the light shielding member SLP may function as a contact point between the first thin film transistor TFT1 and the light emitting element EMD, that is, one end of the storage capacitor CST connected to the second node ND2 in FIG. 4.

In addition, the second bridge electrode BRE2 may function as a contact point between the first gate electrode GE1 of the first thin film transistor TFT1 and the second thin film transistor TFT2, that is, the other end of the storage capacitor CST connected to the first node ND1 in FIG. 4.

Accordingly, the storage capacitor CST may be provided by the overlapping area between the light shielding member SLP and the second bridge electrode BRE2.

In addition, although not illustrated in FIG. 5, the display panel 100 according to one embodiment may further include the first driving power line ELVDL of FIG. 4 parallel to the data line DL, spaced apart from the light shielding member SLP, and disposed on the same layer as the light shielding member SLP, and a third bridge electrode (not illustrated) for connecting the other side (right side of FIG. 5) of the first active layer ACT1 of the first thin film transistor TFT1 with the first driving power line ELVDL of FIG. 4.

The display panel 100 according to one embodiment includes a sealing structure 180 covering the light emitting array 170.

As one example, the sealing structure 180 may include a first sealing layer 181 disposed on the light emitting array 170 and made of an inorganic insulating material, a second sealing layer 182 disposed on the first sealing layer 181 and made of an organic insulating material, and a third sealing layer 183 disposed on the first sealing layer 181, covering the second sealing layer 182, and made of an inorganic insulating material.

As described above, as the sealing structure 180 has a stacked structure of the first sealing layer 181, the second sealing layer 182, and the third sealing layer 183, the sealing structure 180 may prevent oxygen or moisture from permeating into the light emitting array 170.

In addition, damage to the light emitting array 170 by foreign matters such as dust may be prevented by the second sealing layer 182 made of an organic insulating material that is relatively thick and easily disposed.

Each of the first sealing layer 181 and the third sealing layer 183 may have a structure in which one or more inorganic layers of a silicon nitride layer, a silicon oxynitride layer, a silicon oxide layer, a titanium oxide layer, and an aluminum oxide layer are stacked.

The second sealing layer 182 may be formed of an organic layer such as acryl resin, epoxy resin, phenolic resin, polyamide resin, polyimide resin and the like.

Next, a display panel according to each embodiment will be described with reference to FIG. 6, FIG. 7, FIG. 8, FIG. 9, FIG. 10, FIG. 11, FIG. 12, FIG. 13 and FIG. 14.

Figure 6:
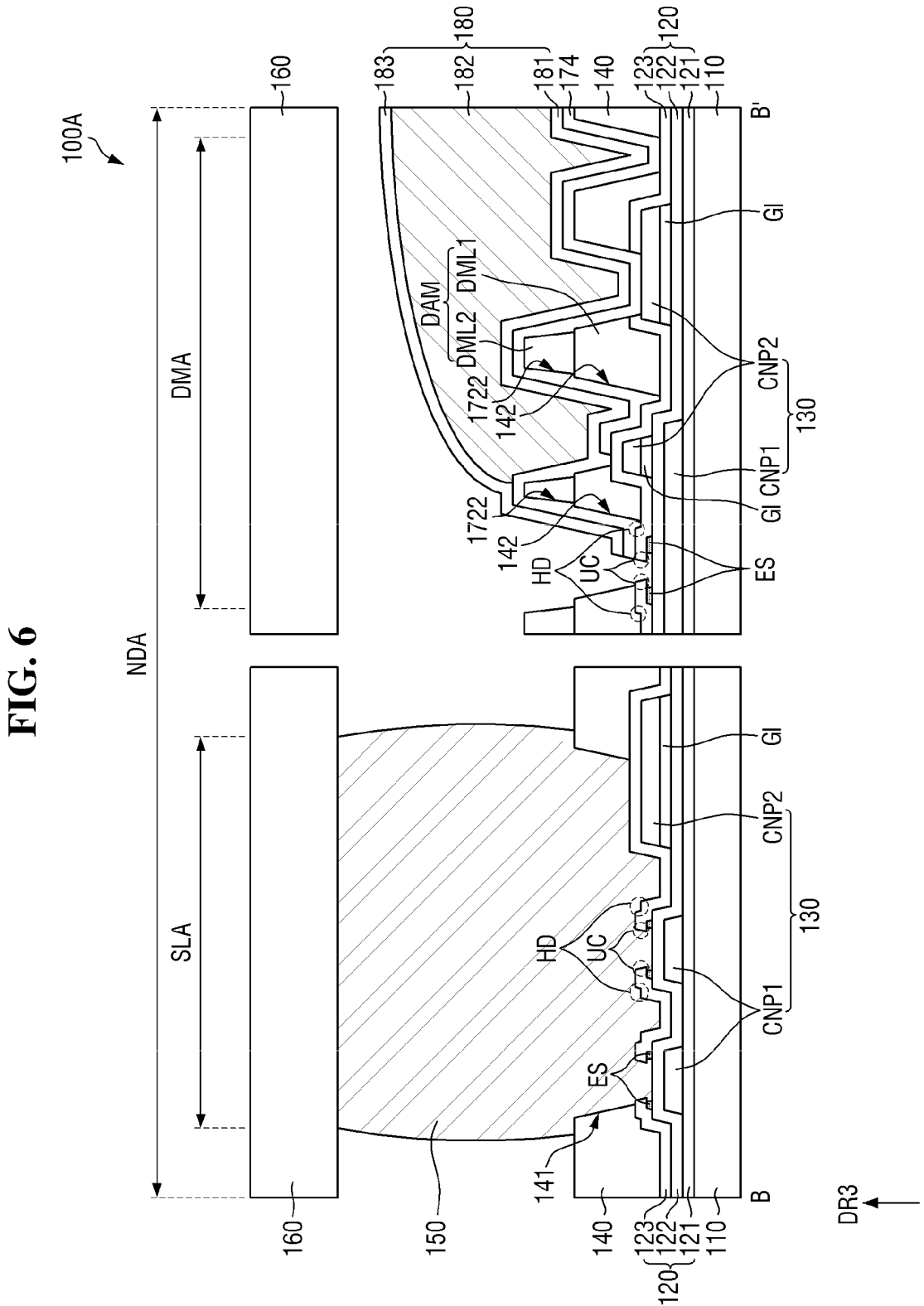
FIG. 6 is a cross-sectional view illustrating taken along line B-B' of FIG. 3 according to an embodiment.
Figure 7:
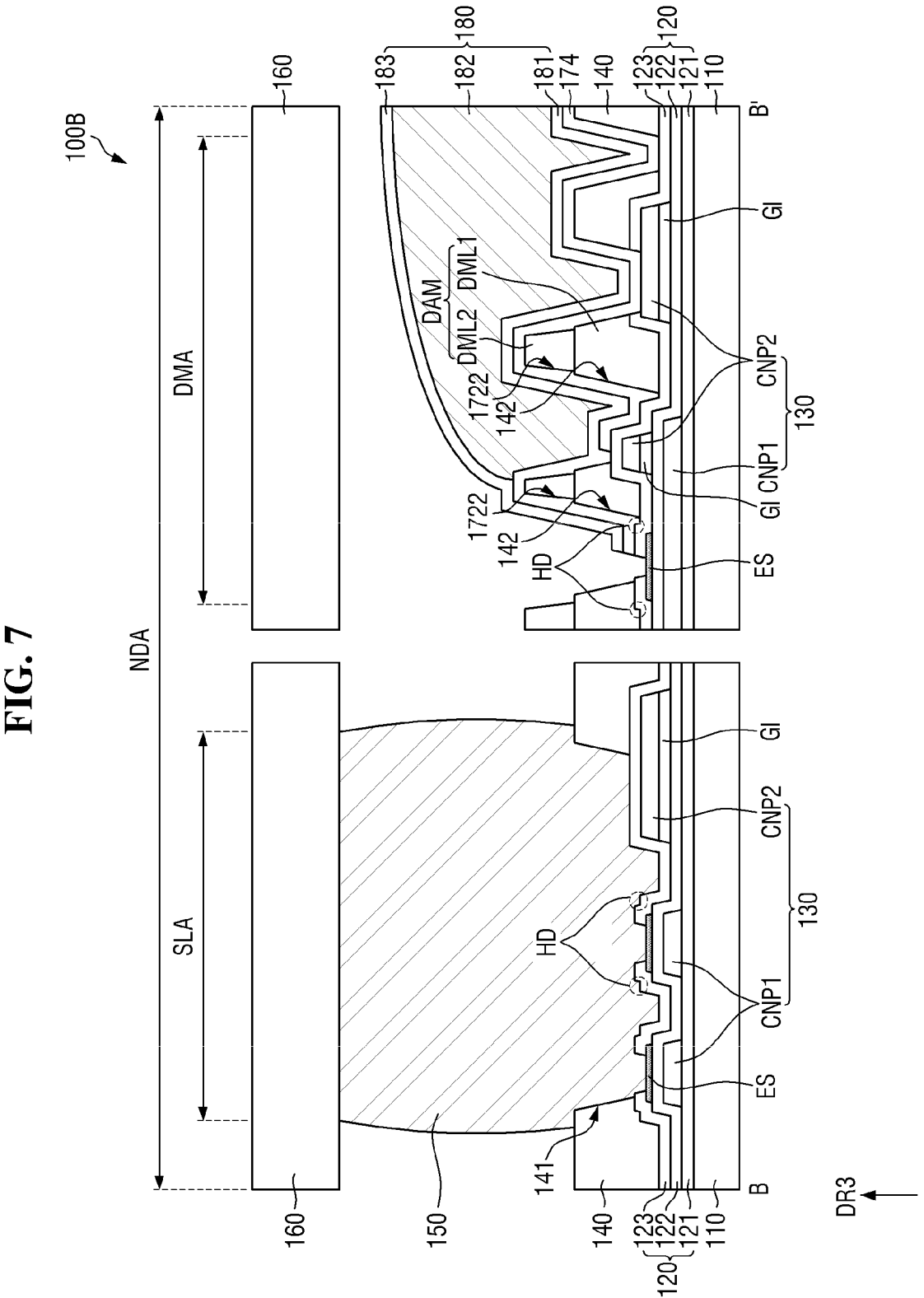
FIG. 7 is a cross-sectional view illustrating taken along line B-B' of FIG. 3 according to an embodiment.
Figure 8:
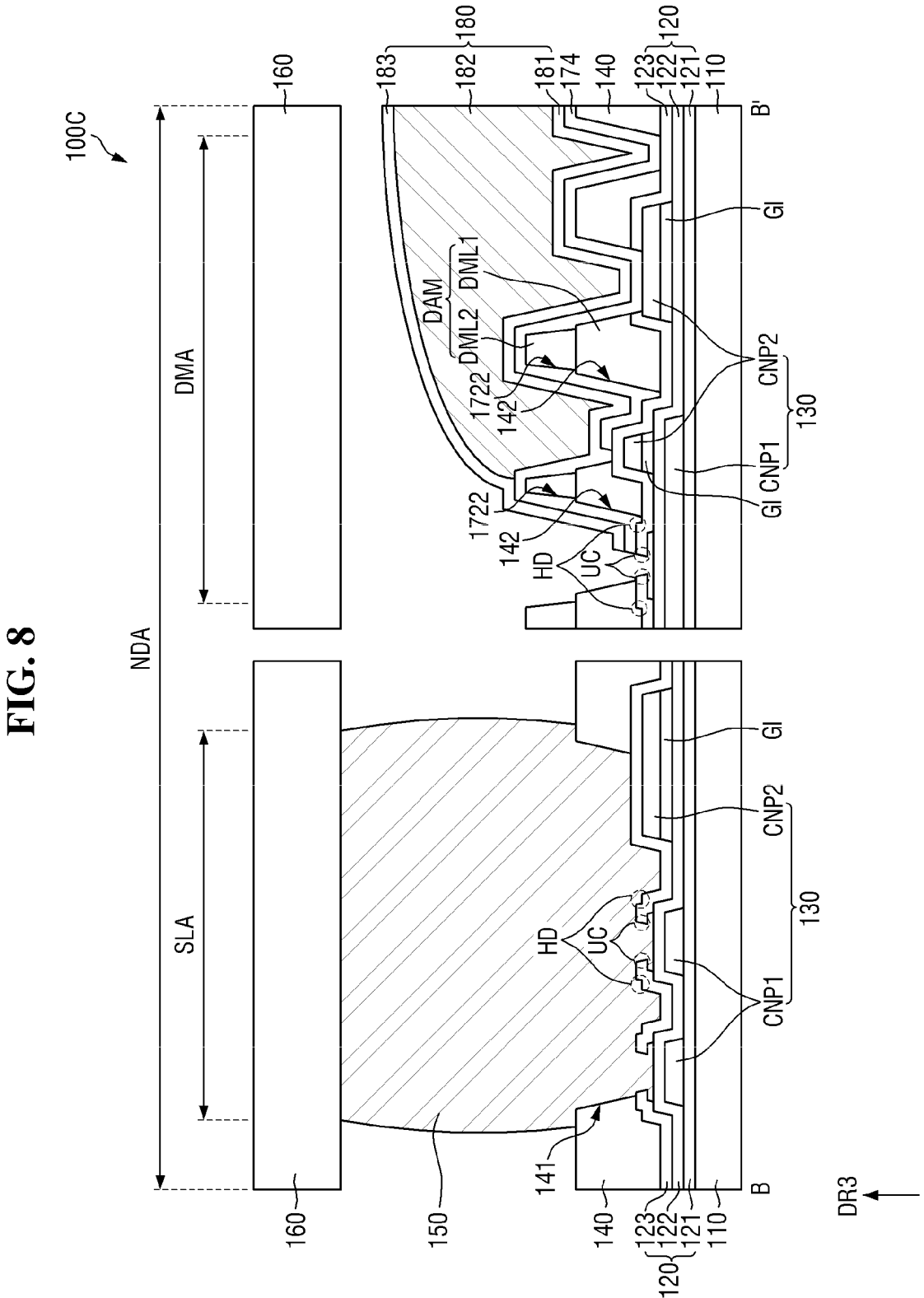
FIG. 8 is a cross-sectional view illustrating taken along line B-B' of FIG. 3 according to an embodiment.

FIG. 6 is a cross-sectional view illustrating taken along line B-B' of FIG. 3 according to an embodiment. FIG. 7 is a cross-sectional view illustrating taken along line B-B' of FIG. 3 according to an embodiment. FIG. 8 is a cross-sectional view illustrating taken along line B-B' of FIG. 3 according to an embodiment.

Referring to FIG. 6, a display panel 100A according to a first embodiment includes the connection lines 130 disposed in the non-display area NDA on the support substrate 110, the via layer 140 covering the connection lines 130, the sealing hole 141 disposed in the sealing area SLA in the non-display area NDA in a shape surrounding the display area DA and penetrating the via layer 140, and the sealing member 150 disposed in the sealing hole 141 on the support substrate 110.

One end of any one of the connection lines 130 may be connected to any one signal line of the circuit array 120, and the other end of the any one of the connection lines 130 may be connected to any one of the signal pad SPD, the scan driving circuit SDC, and the display driving circuit 200.

Each of the connection lines 130 includes at least one of a first connecting line part CNP1 having the same layer as the light shielding member SLP or a second connecting line part CNP2 having the same layer as the first gate electrode GE1.

Here, the interlayer insulating layer 123 covers the first connecting line part CNP1 and the second connecting line part CNP2 in the non-display area NDA.

According to the first embodiment, the interlayer insulating layer 123 is formed to include a height difference HD due to an etch stopper ES corresponding to at least a portion of the overlapping area between the sealing hole 141 and the first connecting line part CNP1.

In the area where the sealing hole 141 is disposed, a portion of the first connecting line part CNP1 may not be protected by the via layer 140, and thus may be easily damaged or removed.

To prevent this, according to the first embodiment, the etch stopper ES corresponding to at least a portion of an overlapping area between the sealing hole 141 and the first connecting line part CNP1 is disposed on the buffer layer 122, and in a state in which the interlayer insulating layer 123 covering the etch stopper ES and the via layer 140 are disposed, the via layer 140 for disposing the sealing hole 141 may be provided.

In this case, the interlayer insulating layer 123 may be formed to include a height difference due to the etch stopper ES corresponding to at least a portion of the overlapping area between the sealing hole 141 and the first connecting line part CNP1.

In addition, the display panel 100A according to the first embodiment may further include the two or more first valleys 142 adjacent closer to the display area DA than the sealing area SLA in the non-display area NDA, disposed in a dam area DMA having a shape surrounding the display area DA, and penetrating the via layer 140, and a first dam layer DML1 disposed between the two or more first valleys 142 and having the same layer as the via layer 140.

In the area in which the two or more first valleys 142 are disposed, the other portion of the first connecting line part CNP1 may not be protected by the via layer 140 and thus may be easily damaged or removed.

To prevent this, according to the first embodiment, the etch stopper ES on the buffer layer 122 may further correspond to at least a portion of an overlapping area between each of the two or more first valleys 142 and the first connecting line part CNP1.

In this case, the interlayer insulating layer 123 may be formed to further include a height difference due to the etch stopper ES corresponding to at least a portion of the overlapping area between each of the two or more first valleys 142 and the first connecting line part CNP1.

Accordingly, although a portion of the interlayer insulating layer 123 is removed, along with a portion of the via layer 140 corresponding to the sealing hole 141 and each of the two or more first valleys 142, the first connecting line part CNP1 may be protected from patterning (i.e., etching or removing) by the etch stopper ES.

The etch stopper ES may have the same layer as the first active layer ACT1. That is, the etch stopper ES, like the first active layer ACT1, may be formed of a semiconductor material on the buffer layer 122.

The etch stopper ES may be disposed only in a partial area of the overlapping area between the sealing hole 141 and each of the two or more first valleys 142, and the first connecting line part CNP1, in which excessive etching is likely to occur. As one example, whether excessive etching occurs may be derived through an experiment result or experience of an etching process.

In contrast, the etch stopper ES may also correspond entirely to the overlapping area between the sealing hole 141 and each of the two or more first valleys 142, and the first connecting line part CNP1 within a range that does not overlap the second connecting line part CNP2.

The etch stopper ES does not correspond to the overlapping area between the sealing hole 141 and each of the two or more first valleys 142, and the second connecting line part CNP2. That is, the etch stopper ES is not disposed under the second connecting line part CNP2. In this way, it is possible to prevent the second connecting line part CNP2 from being removed together with the etch stopper ES.

In the sealing hole 141 and each of the two or more first valleys 142, the interlayer insulating layer 123 covers the etch stopper ES, and thus may have a surface shape including the height difference HD due to the etch stopper ES.

In addition, at least a portion of the etch stopper ES may be patterned (i.e., etched or removed) together with a portion of the via layer 140 and the interlayer insulating layer 123. In this case, the interlayer insulating layer 123 may include an undercut structure UC corresponding to the patterned etch stopper ES and spaced apart from the buffer layer 122.

According to the first embodiment, the other portion of the etch stopper ES may remain between the undercut structure UC of the interlayer insulating layer 123 and the buffer layer 122 without being patterned.

In addition, the sealing member 150 disposed in the sealing hole 141 may be filled in the undercut structure UC of the interlayer insulating layer 123.

Alternatively, as illustrated in FIG. 7, according to a second embodiment, the etch stopper ES may remain on the interlayer insulating layer 123 without being patterned at all. In this case, the interlayer insulating layer 123 may not include the undercut structure UC.

Alternatively, as illustrated in FIG. 8, according to a third embodiment, the etch stopper ES may also be removed all together with the via layer 140. In this case, the sealing member 150 may be filled between the undercut structure UC of the interlayer insulating layer 123 and the buffer layer 122.

Referring back to FIG. 6, the display panel 100A according to the first embodiment may further include two or more second valleys 1722 corresponding to the dam area DMA, extending to the two or more first valleys 142, respectively, and penetrating the pixel defining layer 172, and a second dam layer DML2 disposed on the first dam layer DML1 between the two or more second valleys 1722 and having the same layer as the pixel defining layer 172.

In this case, the first sealing layer 181 of the sealing structure 180 may be disposed to extend to the dam area DMA until the first sealing layer 181 covers the light emitting array 170 and covers the second dam layer DML2.

The second sealing layer 182 has an edge corresponding to the dam structure DAM including the first dam layer DML1 and the second dam layer DML2.

The third sealing layer 183 covers the second sealing layer 182 and is in contact with the first sealing layer 181 in the dam area DMA.

The sealing member 150 is disposed in the sealing hole 141 and an additional sealing hole 1721, and bonds between the encapsulation substrate 160 and the support substrate 110.

Since the second embodiment (100B) illustrated in FIG. 7 and the third embodiment (100C) illustrated in FIG. 8 are the same as that of the first embodiment (100A) illustrated in FIG. 6 except for the degree of patterning of the etch stopper ES, repeated description will be omitted below.

As described above, according to the first embodiment (100A), the second embodiment (100B), and the third embodiment (100C) (hereinafter collectively referred to as "the first embodiment"), the interlayer insulating layer 123 is disposed to cover the etch stopper ES corresponding at least a portion of an area in which the sealing hole 141 from which the via layer 140 is removed and each of the two or more first valleys 142, and the first connecting line part CNP1 overlap, and thus is formed to include the height difference HD due to the etch stopper ES. In addition, depending on the etch strength, the interlayer insulating layer 123 may include the undercut structure UC corresponding to a portion of the patterned etch stopper ES.

Accordingly, during the disposition process of the sealing hole 141 and the two or more first valleys 142, a defect in which the first connecting line part CNP1 is damaged or removed may be prevented.

In addition, the sealing member 150 disposed in the sealing hole 141 is disposed on the interlayer insulating layer 123 including the height difference HD due to the etch stopper ES or the undercut structure UC by the patterned etch stopper ES. Accordingly, the contact area between the interlayer insulating layer 123 and the sealing member 150 is increased, so that the tackiness of the sealing member 150 to the interlayer insulating layer 123 may be increased. In addition, since the boundary surface between the interlayer insulating layer 123 and the sealing member 150 is more complicatedly deformed by the height difference HD and the undercut structure UC, the permeation path of oxygen or moisture becomes more complicated, so that the permeation of the oxygen or moisture may be reduced.

Figure 9:
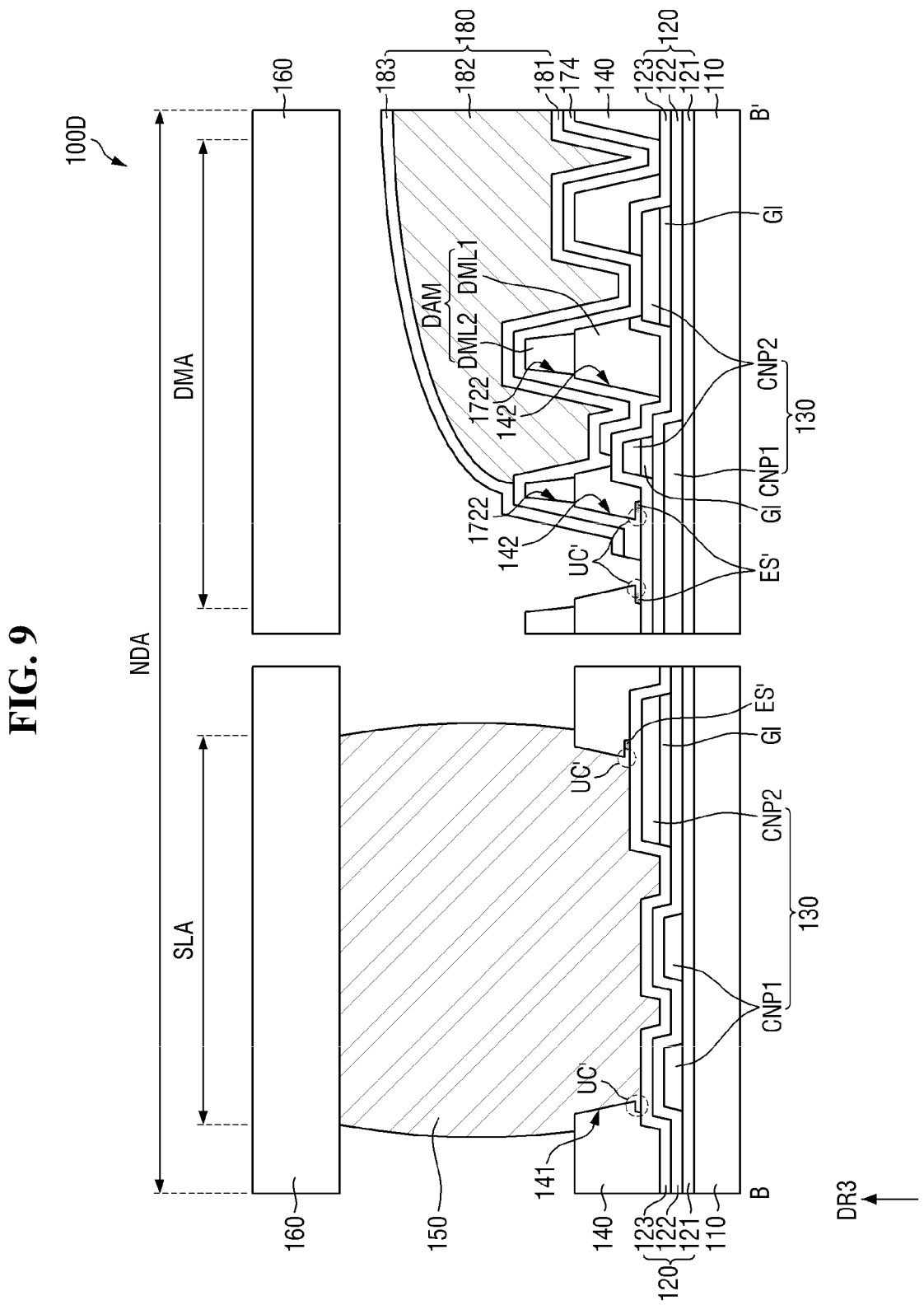
FIG. 9 is a cross-sectional view illustrating taken along line B-B' of FIG. 3 according to an embodiment.
Figure 10:
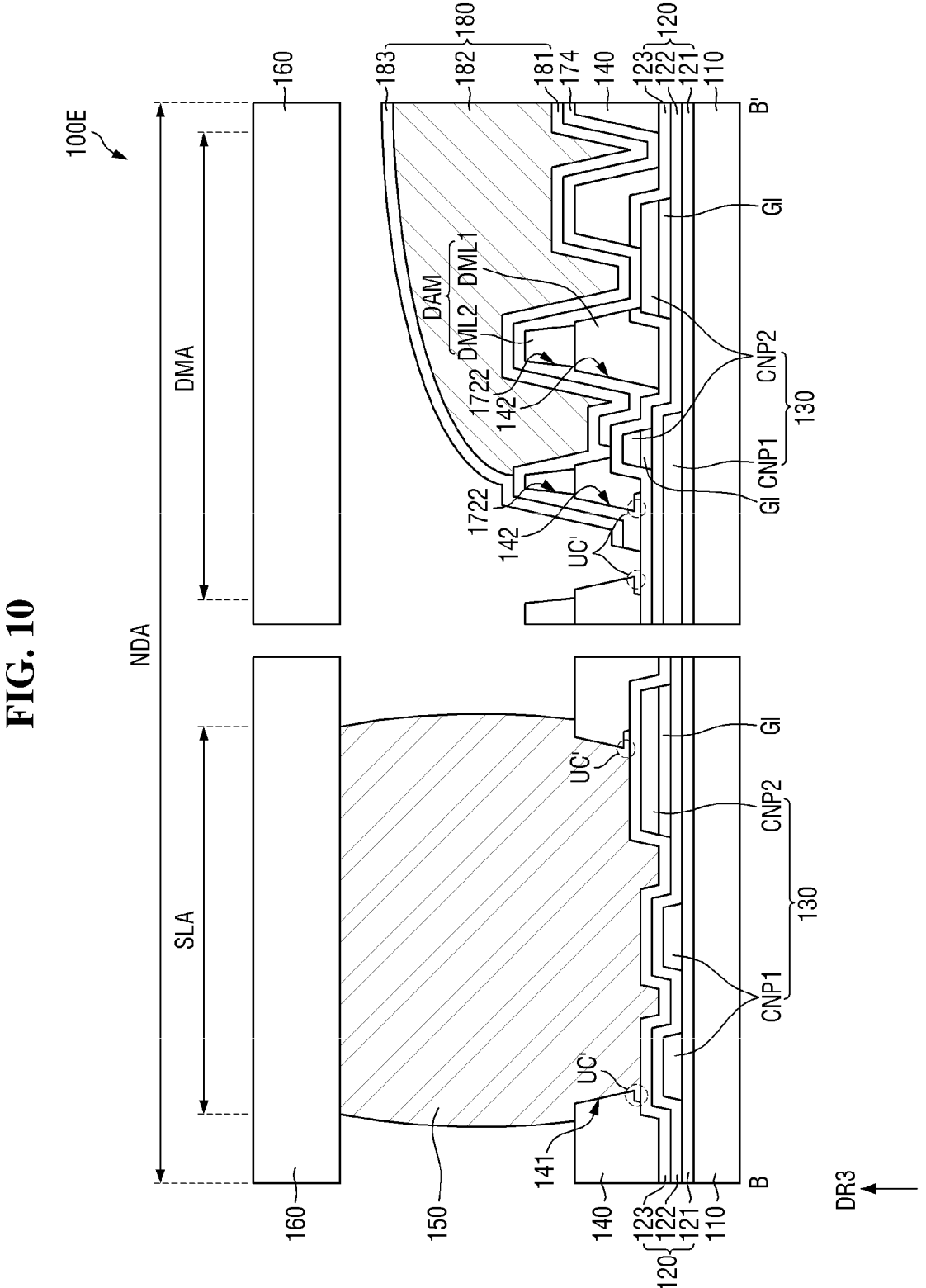
FIG. 10 is a cross-sectional view examples taken along line B-B' of FIG. 3 according to an embodiment.

FIG. 9 is a cross-sectional view illustrating taken along line B-B' of FIG. 3 according to an embodiment. FIG. 10 is a cross-sectional view examples taken along line B-B' of FIG. 3 according to an embodiment.

Referring to FIG. 9, a display panel 100D according to a fourth embodiment is the same as the first embodiment (100A) illustrated in FIG. 6 except that the interlayer insulating layer 123 does not include a height difference due to the etch stopper ES and the via layer 140 includes an undercut structure UC' by an etch stopper ES' on the interlayer insulating layer 123, and thus a redundant description will be omitted below.

The display panel 100D according to the fourth embodiment is manufactured with a manufacturing process including disposing the etch stopper ES', which corresponds to at least a portion of an overlapping area between the sealing hole 141 and each of the two or more first valleys 142, and the first connecting line part CNP1, or at least a portion of an overlapping area between the sealing hole 141 and each of the two or more first valleys 142, and the second connecting line part CNP2, on the interlayer insulating layer 123.

In this case, at least a portion of the etch stopper ES' together with the via layer 140 may be patterned in the sealing hole 141 and each of the two or more first valleys 142. Accordingly, the via layer 140 may include an undercut structure UC' corresponding to the patterned etch stopper ES' and spaced apart from the interlayer insulating layer 123.

According to the fourth embodiment, a portion of the etch stopper ES' on the interlayer insulating layer 123 may be patterned together with the via layer 140, and the other portion may not be patterned and may remain between the undercut structure UC' of the via layer 140 and the interlayer insulating layer 123.

In addition, the sealing member 150 disposed in the sealing hole 141 may be filled in the undercut structure UC' of the via layer 140.

Alternatively, as illustrated in FIG. 10, according to a fifth embodiment (100E), the etch stopper ES' on the interlayer insulating layer 123 may also be removed all together with the via layer 140. In this case, the sealing member 150 disposed in the sealing hole 141 may be filled between the undercut structure UC' of the via layer 140 and the interlayer insulating layer 123.

Since the fifth embodiment (100E) illustrated in FIG. 10 is the same as the fourth embodiment (100D) illustrated in FIG. 9 except that the etch stopper ES' on the interlayer insulating layer 123 is all patterned, and repeated description will be omitted below.

As described above, according to the fourth embodiment (100D) and the fifth embodiment (100E) (hereinafter, collectively referred to as the "second embodiment"), the via layer 140 is disposed to cover the etch stopper ES' corresponding to at least a portion of the overlapping area between the sealing hole 141 and each of the two or more first valleys 142, and the first connecting line part CNP1 and at least a portion of the overlapping area between the sealing hole 141 and each of the two or more first valleys 142, and the second connecting line part CNP2 and disposed on the interlayer insulating layer 123, and then patterned for disposition of the sealing hole 141 and the two or more first valleys 142. At this time, since at least a portion of the etch stopper ES' on the interlayer insulating layer 123 is patterned together with the via layer 140, the via layer 140 corresponds to the patterned etch stopper ES' and includes the undercut structure UC' spaced apart from the interlayer insulating layer 123.

As described above, as the etch stopper ES' is disposed on the interlayer insulating layer 123 covering the second connecting line part CNP2, during the disposition process of the sealing hole 141 and the two or more first valleys 142, not only the first connecting line part CNP1 but also the second connecting line part CNP2 may be protected by the etch stopper ES'.

Figure 11:
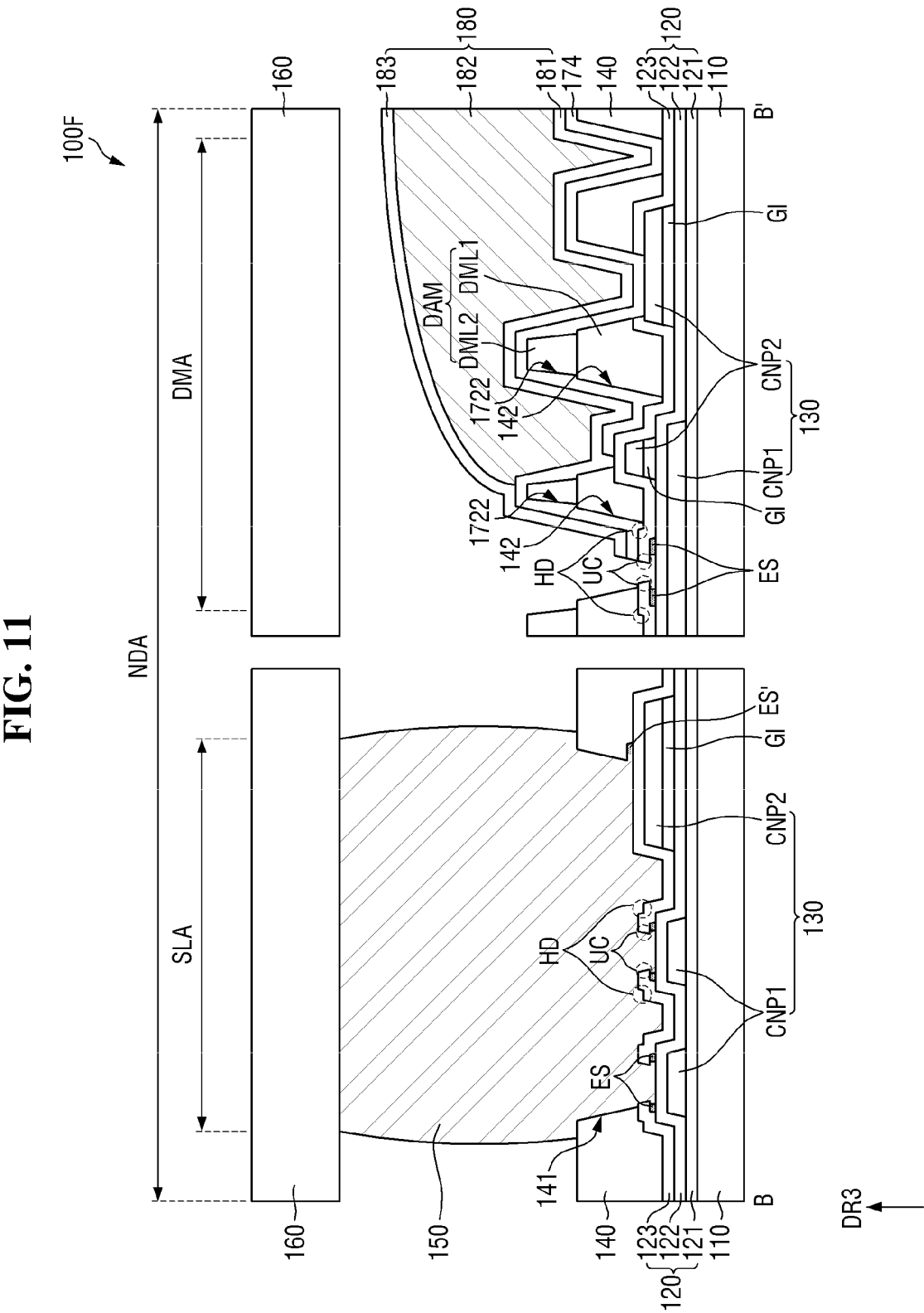
FIG. 11 is a cross-sectional view taken along line B-B' of FIG. 3 according to an embodiment.
Figure 12:
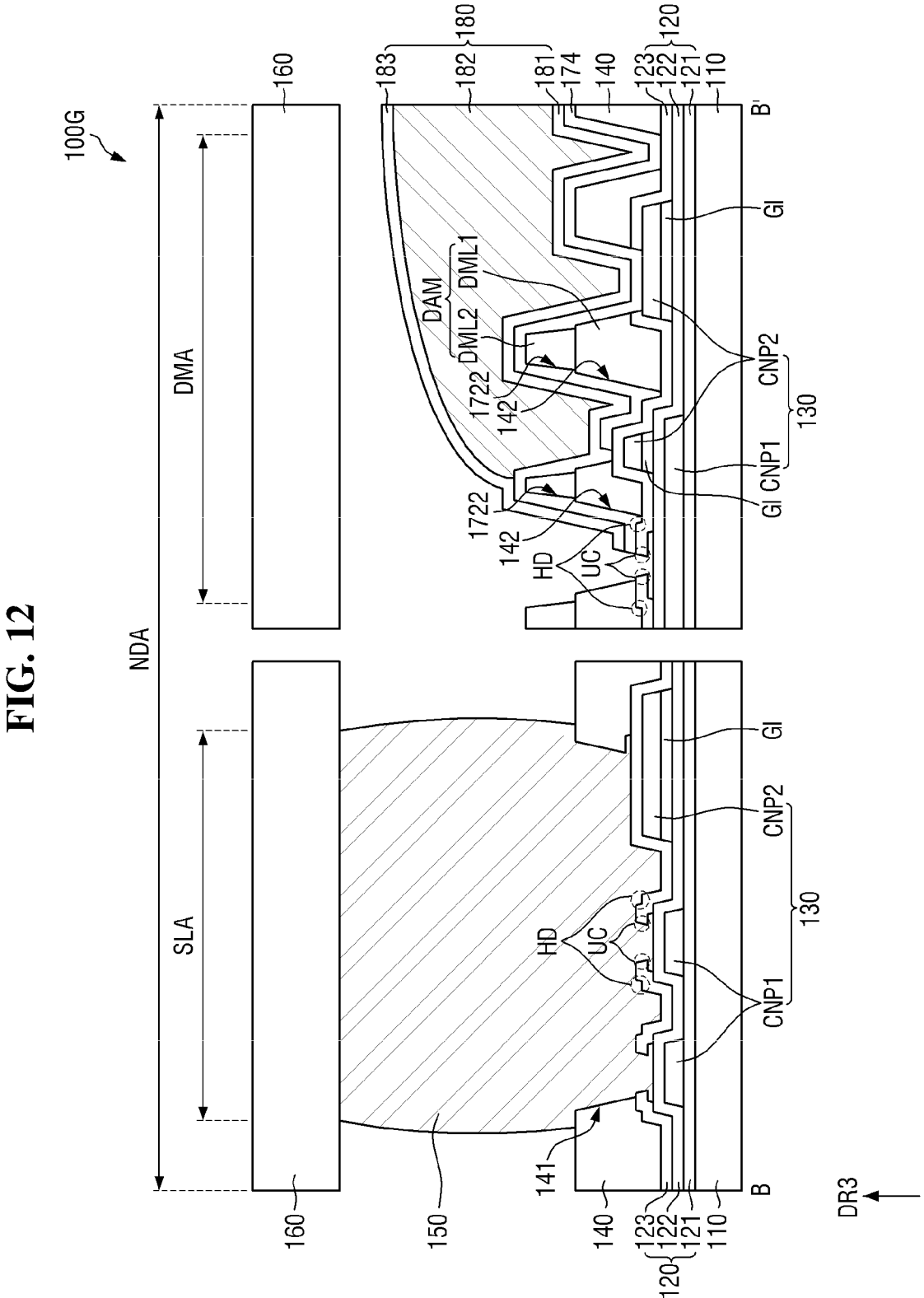
FIG. 12 is a cross-sectional view illustrating taken along line B-B' of FIG. 3 according to an embodiment.

FIG. 11 is a cross-sectional view taken along line B-B' of FIG. 3 according to an embodiment. FIG. 12 is a cross-sectional view illustrating taken along line B-B' of FIG. 3 according to an embodiment.

Referring to FIG. 11, a display panel 100F according to a sixth embodiment is the same as the first embodiment (100A) illustrated in FIG. 6 except for further including the etch stopper ES' (hereinafter referred to as an "auxiliary etch stopper") on the interlayer insulating layer 123 according to the fourth embodiment (100D), and thus a redundant description will be omitted below.

Referring to FIG. 12, a display panel 100G according to a seventh embodiment is the same as the sixth embodiment (100F) illustrated in FIG. 11 except that both the etch stopper ES on the buffer layer 122 and the auxiliary etch stopper ES' on the interlayer insulating layer 123 are patterned, and thus a redundant description will be omitted below.

As described above, according to the sixth embodiment (100F) and the seventh embodiment (100G) (hereinafter referred to as the "third embodiment"), during the disposition process of the sealing hole 141 and the two or more first valleys 142, each of the first connecting line part CNP1 and the second connecting line part CNP2 may be protected by any one of the etch stopper ES on the buffer layer 122 and the auxiliary etch stopper ES' on the interlayer insulating layer 123. Accordingly, damage to the first connecting line part CNP1 and the second connecting line part CNP2 by the disposition process of the sealing hole 141 and the two or more first valleys 142 may be more effectively prevented.

Figure 14:
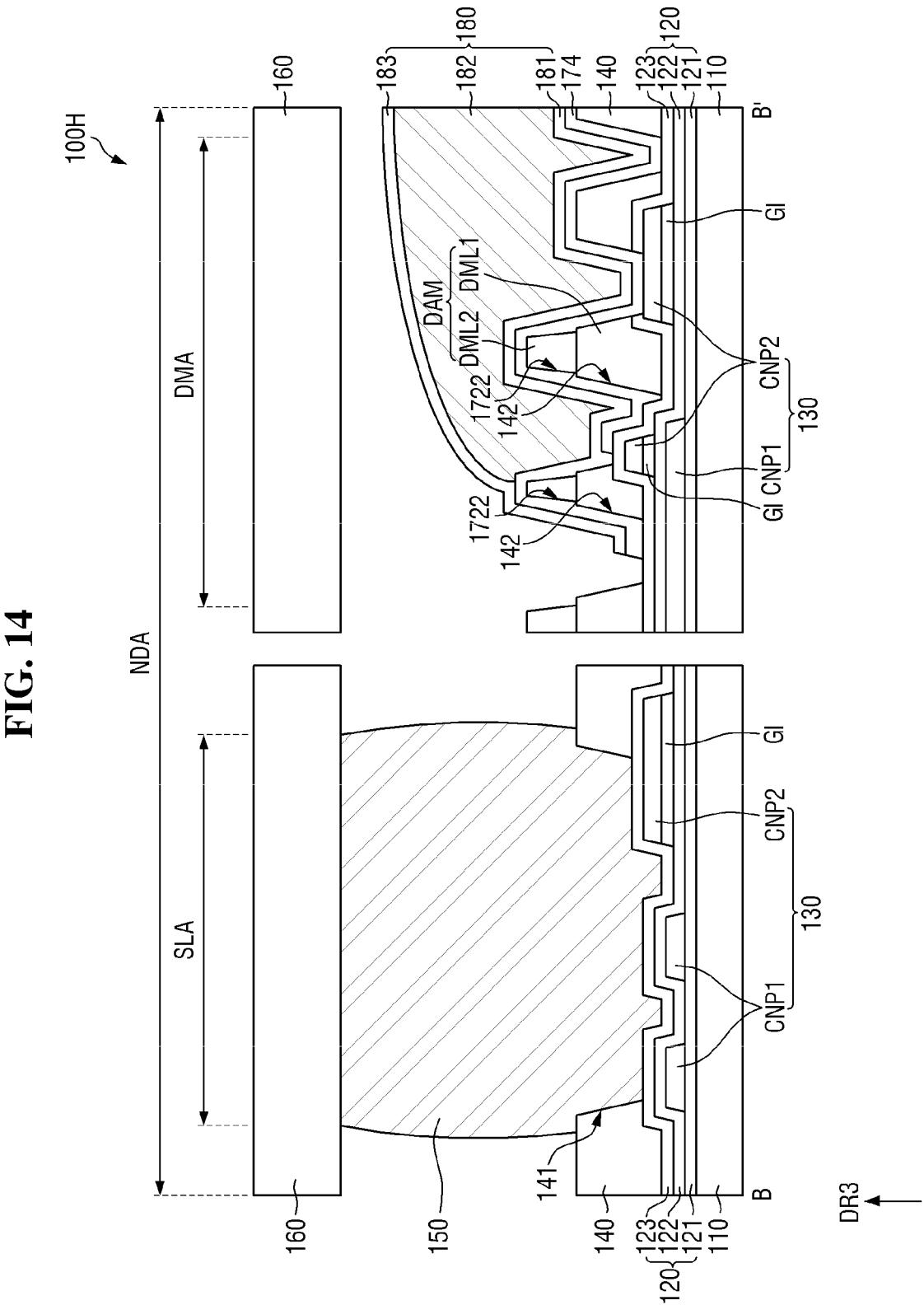
FIG. 14 is a cross-sectional view illustrating taken along line C-C' of FIG. 13 according to an embodiment.

FIG. 13 is a plan view illustrating separated areas in a support substrate according to an embodiment. FIG. 14 is a cross-sectional view illustrating taken along line C-C' of FIG. 13 according to an embodiment.

Referring to FIG. 13, the support substrate 110 may include a plurality of separated areas SAn for a process of disposing an exposure mask. That is, the exposure process for disposing the exposure mask may be performed in each of the separated areas SAn.

FIG. 13 illustrates a case in which the plurality of separated areas SAn is arranged in a 2×2 array and include four separated areas SA1, SA2, SA3, and SA4 having the same width. However, the illustration of FIG. 13 is only an example, and the plurality of separated areas SAn according to the fourth embodiment is not limited to the illustration of FIG. 13. That is, the plurality of separated areas SAn may also have different widths or may also have different shapes in consideration of the easiness of the exposure process.

Each of the separated areas SAn includes a double exposure area DEA adjacent to a boundary between the plurality of separated areas SAn. The double exposure area DEA is an area not only exposed to the exposure process corresponding to any one of the separated areas SA1, SA2, SA3, and SA4, but also exposed to two exposure processes corresponding to the two separated areas SA1 and SA2, SA1 and SA3, SA2 and SA4, and SA3 and SA4 that are in contact with each other. Accordingly, the thickness of the exposure mask in the double exposure area DEA is different from the thickness of the exposure mask in the other remaining areas.

In particular, when the thickness of the exposure mask in the double exposure area DEA becomes smaller, only the patterning of the via layer 140 may not be performed in the double exposure area DEA. That is, in the double exposure area DEA, the interlayer insulating layer 123 corresponding to the patterned via layer 140 may be patterned or even the buffer layer 122 may be patterned. Accordingly, in the double exposure area DEA, a defect in which the first connecting line part CNP1 and the second connecting line part CNP2 are damaged or removed may easily occur.

Accordingly, a display panel 100H according to the fourth embodiment is the same as the embodiments illustrated in FIGS. 6 to 12 except that the etch stopper ES on the buffer layer 122 according to the first embodiment or the etch stopper ES' on the interlayer insulating layer 123 according to the second embodiment corresponds to the double exposure area DEA, and thus a redundant description will be omitted.

Referring to FIG. 14, in the display panel 100H according to the fourth embodiment, in the remaining area except for the double exposure area DEA, the interlayer insulating layer 123 does not include the height difference HD due to the etch stopper ES, and the via layer 140 does not include the undercut structure UC' by the auxiliary etch stopper ES'.

As described above, according to the fourth embodiment, the etch stopper ES or the auxiliary etch stopper ES' is limitedly disposed in the double exposure area DEA. Accordingly, during the disposition process of the sealing hole 141 and the two or more first valleys 142, the first connecting line part CNP1 or the second connecting line part CNP2 may be prevented from being damaged, while an electrically unstable element according to the disposition of the etch stopper ES or the auxiliary etch stopper ES' may be reduced.

Figure 16:
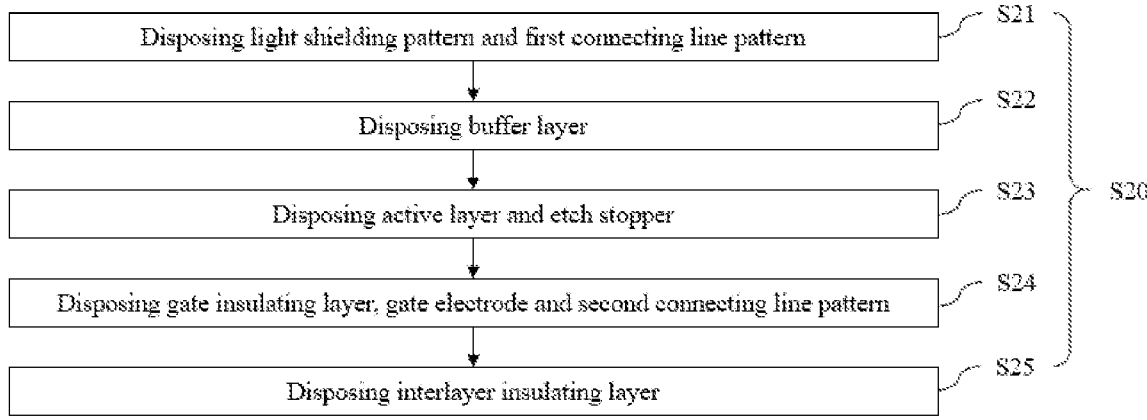
Figure 17:
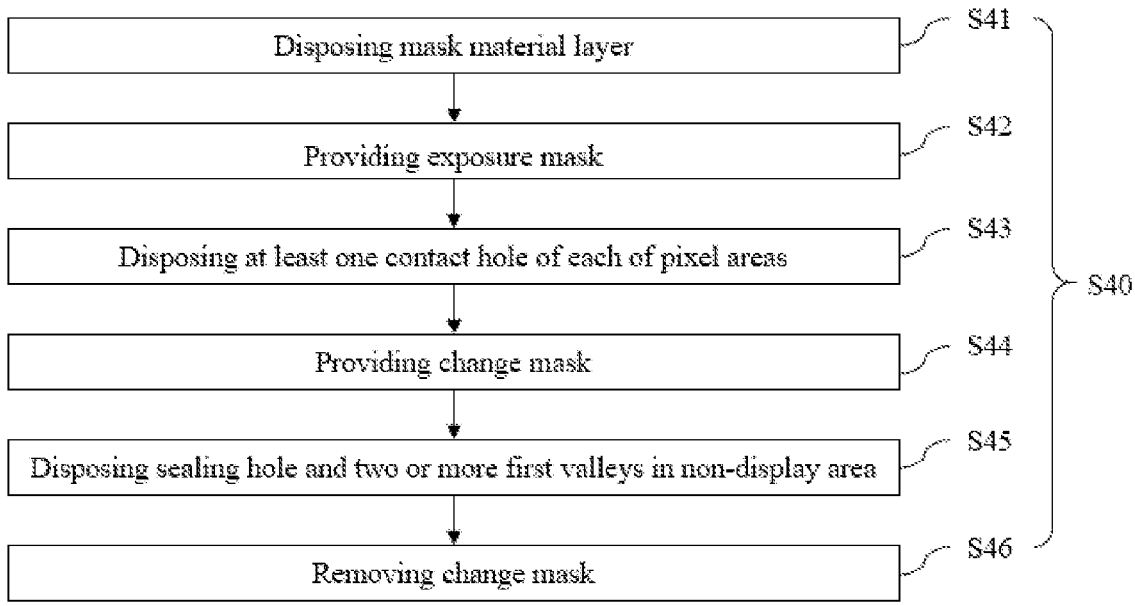

FIG. 15, FIG. 16, and FIG. 17 are flowcharts illustrating one or more methods for fabricating a display panel according to the one or more embodiments.

FIG. 18, FIG. 19, FIG. 20, FIG. 21, FIG. 22, FIG. 23, FIG. 24, FIG. 25, FIG. 26, FIG. 27, FIG. 28, FIG. 29, FIG. 30, FIG. 31, FIG. 32, FIG. 33, FIG. 34, FIG. 35, FIG. 36, FIG. 37, FIG. 38, FIG. 39, FIG. 40, FIG. 41, FIG. 42, FIG. 43, FIG. 44, and FIG. 45 illustrate structures related to steps of the flowcharts shown in FIG. 15, FIG. 16, and FIG. 17.

Referring to FIG. 15, the method for fabricating the display panels 100A, 100B, and 100C according to the first embodiment includes providing the support substrate 110 including the display area DA in which a plurality of pixel areas is arranged and the non-display area NDA that is a periphery of the display area DA (step S10), disposing the circuit array 120 including the thin film transistors TFT1 and TFT2 in FIG. 4 corresponding to the pixel areas PA and the signal lines SL and DL in FIG. 3 connected to the thin film transistors in the display area DA on the support substrate 110 and disposing the connection lines 130 connected to the signal lines in the non-display area NDA on the support substrate 110 (step S20), disposing the via layer 140 covering the circuit array 120 and the connection lines 130 on the support substrate 110 (step S30), providing the sealing hole 141 having a shape surrounding the display area DA in the non-display area NDA of the support substrate 110 by patterning the via layer 140 (step S40), disposing the sealing member 150 having a shape surrounding the display area DA on the encapsulation substrate 160 including at least the display area DA (step S70), aligning the support substrate 110 and the encapsulation substrate 160 in a direction in which the sealing member 150 and the sealing hole 141 face each other (step S80), and disposing the sealing member 150 in the sealing hole 141 and bonding the support substrate 110 to the encapsulation substrate 160 (step S90).

According to the first embodiment, in the step S40 of providing the sealing hole 141, the two or more first valleys 142 having a shape surrounding the display area DA and adjacent closer to the display area DA than the sealing hole 141 may be further provided in the non-display area NDA of the support substrate 110. In this case, the first dam layer DML1 having the same layer as the via layer 140 may be provided between the two or more first valleys 142.

The method for fabricating the display panel according to the first embodiment may further include, after the providing the sealing hole 141 (step S40), disposing the light emitting array 170 including the light emitting elements EMD corresponding to the pixel areas PA on the via layer 140 (step S50), and disposing the sealing structure 180 covering the light emitting array 170 (step S60).

Referring to FIG. 16, the step S20 of disposing the circuit array 120 and the connection lines 130 may include disposing the light shielding member SLP in the pixel areas PA and disposing the first connecting line part CNP1 in the non-display area NDA, by patterning the first conductive material layer on the support substrate 110 (step S21), disposing the buffer layer 122 covering the light shielding member SLP and the first connecting line part CNP1 on the support substrate 110 (step S22), disposing the first active layer ACT1 overlapping the light shielding member SLP and disposing the etch stopper ES corresponding to at least a portion of the overlapping area between the sealing hole 141 and the first connecting line part CNP1, by patterning the semiconductor material layer on the buffer layer 122 (step S23), disposing the stacked structure of the gate insulating layer GI and the first gate electrode GE1 in the channel area C of the first active layer ACT1 by patterning the first insulating material layer on the buffer layer 122 and the second conductive material layer on the first insulating material layer, and disposing the stacked structure of the gate insulating layer GI and the second connecting line part CNP2 in the non-display area NDA (step S24), and disposing an interlayer insulating layer 123 covering the first active layer ACT1, the etch stopper ES, the first gate electrode GE1, and the second connecting line part CNP2 on the buffer layer 122 (step S25).

Referring to FIG. 17, the step S40 of providing the sealing hole 141 and the two or more first valleys 142 may include disposing a mask material layer of a first thickness on the via layer 140 (step S41), providing an exposure mask including a first blocking portion corresponding to the sealing hole 141 and each of the two or more first valleys 142 and having a second thickness smaller than the first thickness, at least one first opening corresponding to each of the pixel areas PA and penetrating the mask material layer, and a second blocking portion being the remainder excluding the first blocking portion and the first opening and made of the mask material layer of the first thickness, through an exposure process using a halftone mask (step S42), disposing at least one of the contact holes CT1, CT2, CT3, CT4, CT5, and CT6 of FIG. 5 corresponding to each of the pixel areas PA by patterning the via layer 140 corresponding to the at least one first opening of the exposure mask (step S43), providing a change mask including at least one first opening, a third blocking portion corresponding to the second blocking portion and having a third thickness smaller than the first thickness, and a second opening corresponding to the first blocking portion and exposing the via layer 140, through an ashing process for the exposure mask (step S44), disposing the sealing hole 141 and the two or more first valleys 142 by patterning the via layer 140 corresponding to the second opening of the change mask (step S45), and removing the change mask (step S46).

Figure 18:
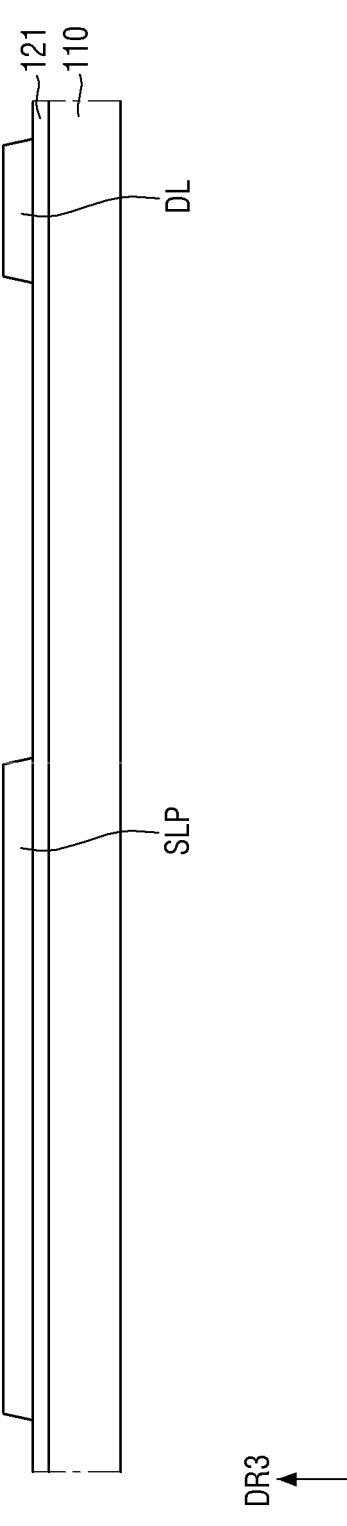
Figure 19:
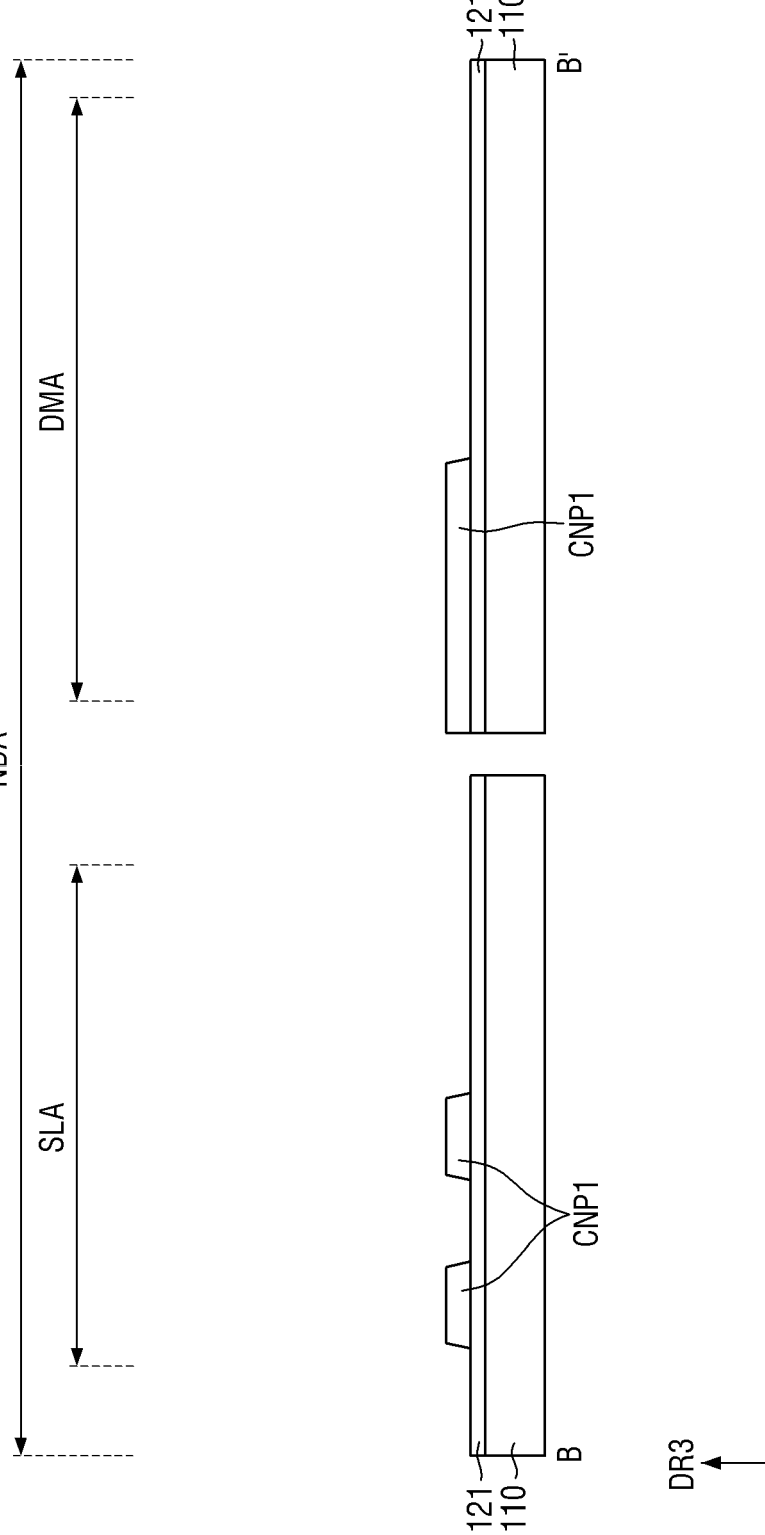

Referring to FIGS. 18 and 19, after the providing the support substrate 110 including the display area DA and the non-display area NDA (step S10), after the disposing the barrier layer 121 on the support substrate 110 is performed, the step S21 of disposing the light shielding member SLP and the first connecting line part CNP1 may be performed.

That is, the light shielding member SLP and the first connecting line part CNP1 may be provided by patterning the first conductive material layer (not illustrated) disposed on the barrier layer 121.

As illustrated in FIG. 18, the light shielding member SLP corresponding to each of the pixel areas PA may be disposed by patterning the first conductive material layer (not illustrated) on the support substrate 110.

In this case, disposing the data line DL may be performed together with the light shielding member SLP.

In addition, as illustrated in FIG. 19, the first connecting line part CNP1 corresponding to the non-display area NDA may be disposed together with the light shielding member SLP, by patterning the first conductive material layer (not illustrated) on the support substrate 110 including the display area DA and the non-display area NDA.

The barrier layer 121 is for reducing the permeation of moisture or oxygen through the support substrate 110, and may be formed of a multilayer in which one or more inorganic layers of a silicon nitride layer, a silicon oxynitride layer, a silicon oxide layer, a titanium oxide layer, and an aluminum oxide layer are alternately stacked.

The first conductive material layer may be made of a metal material having light shielding properties and conductivity.

Figure 20:
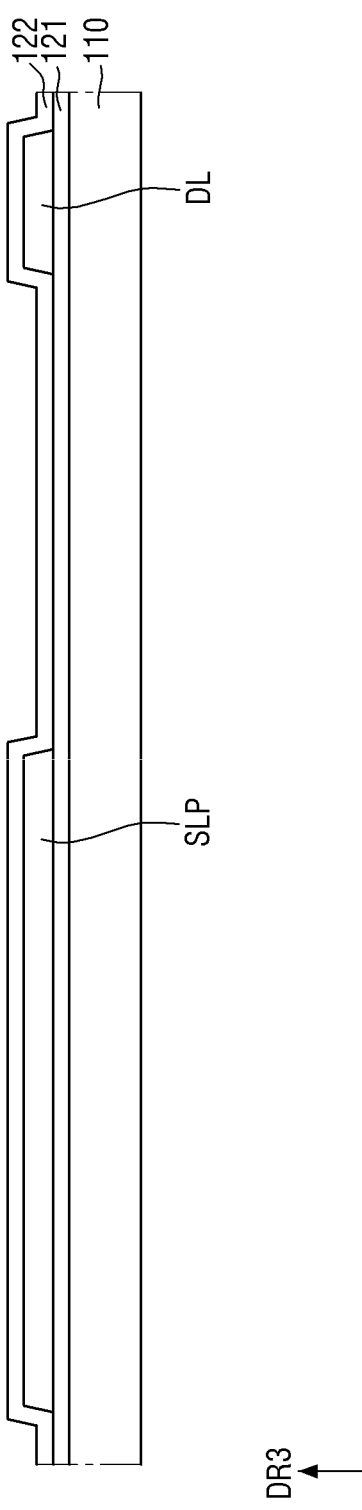
Figure 21:
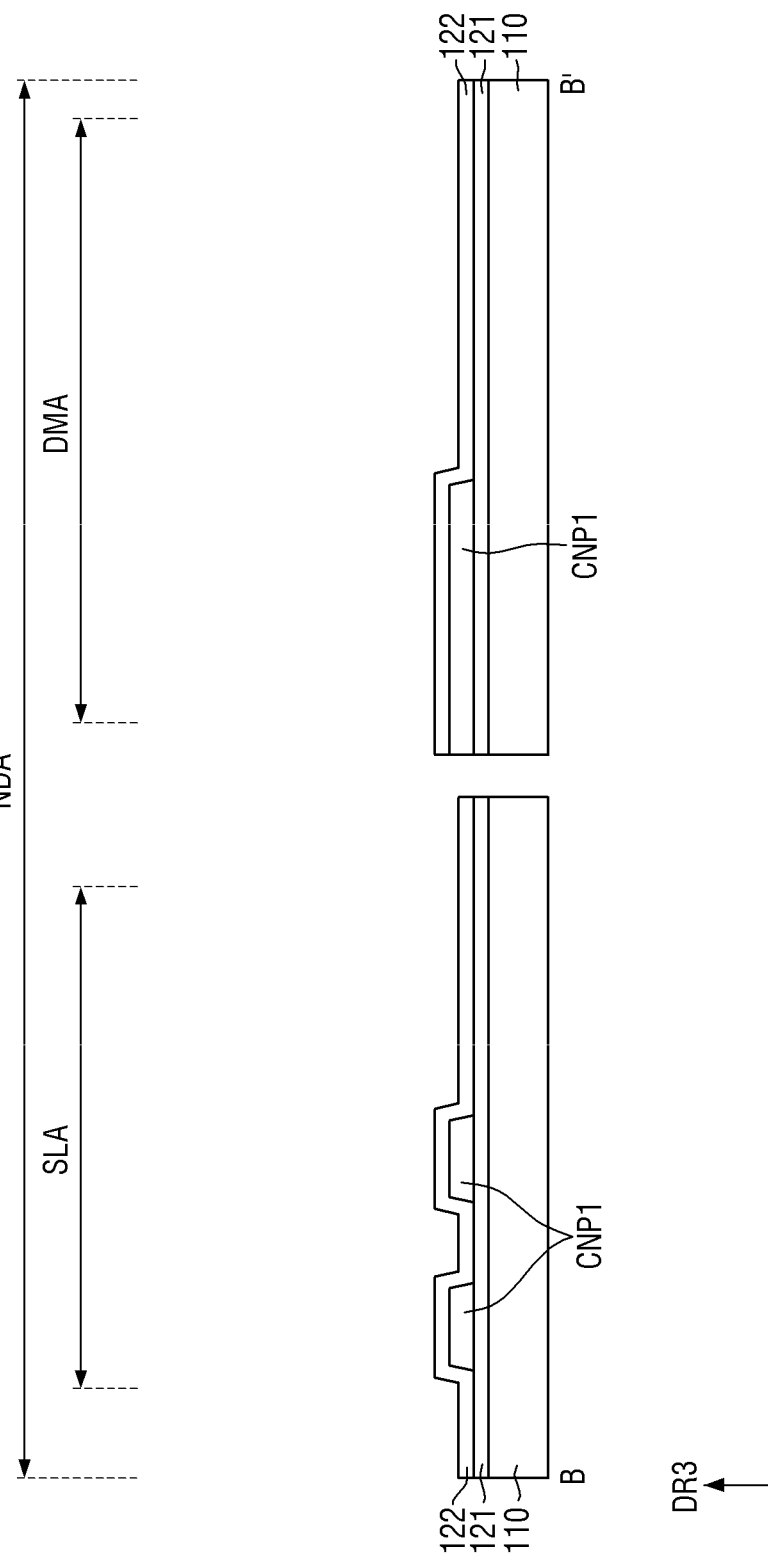
Figure 22:
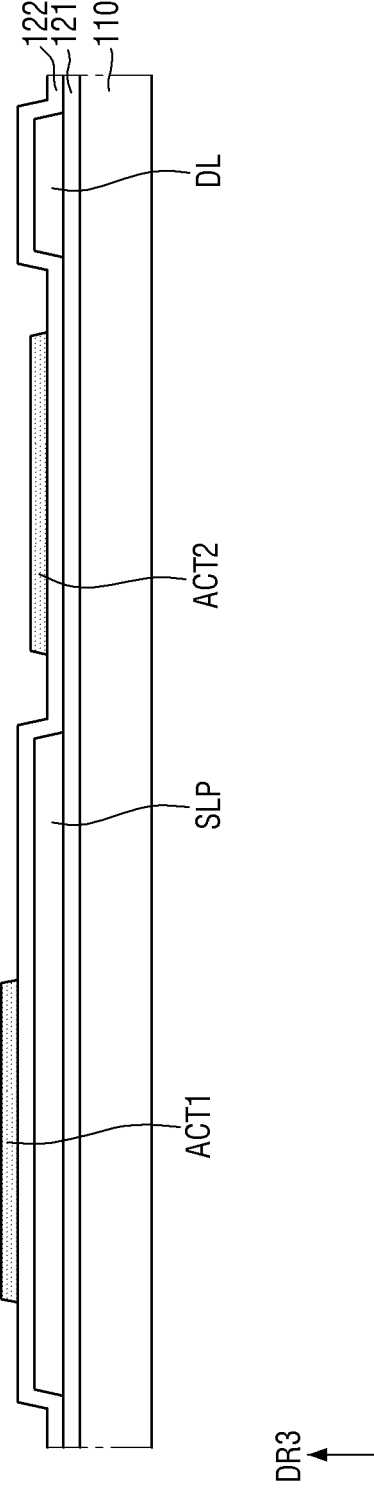

Referring to FIGS. 20 and 21, the buffer layer 122 covering the light shielding member SLP and the first connecting line part CNP1 is disposed on the support substrate 110 by applying an inorganic insulating material (step S22 in FIG. 16).

Figure 23:
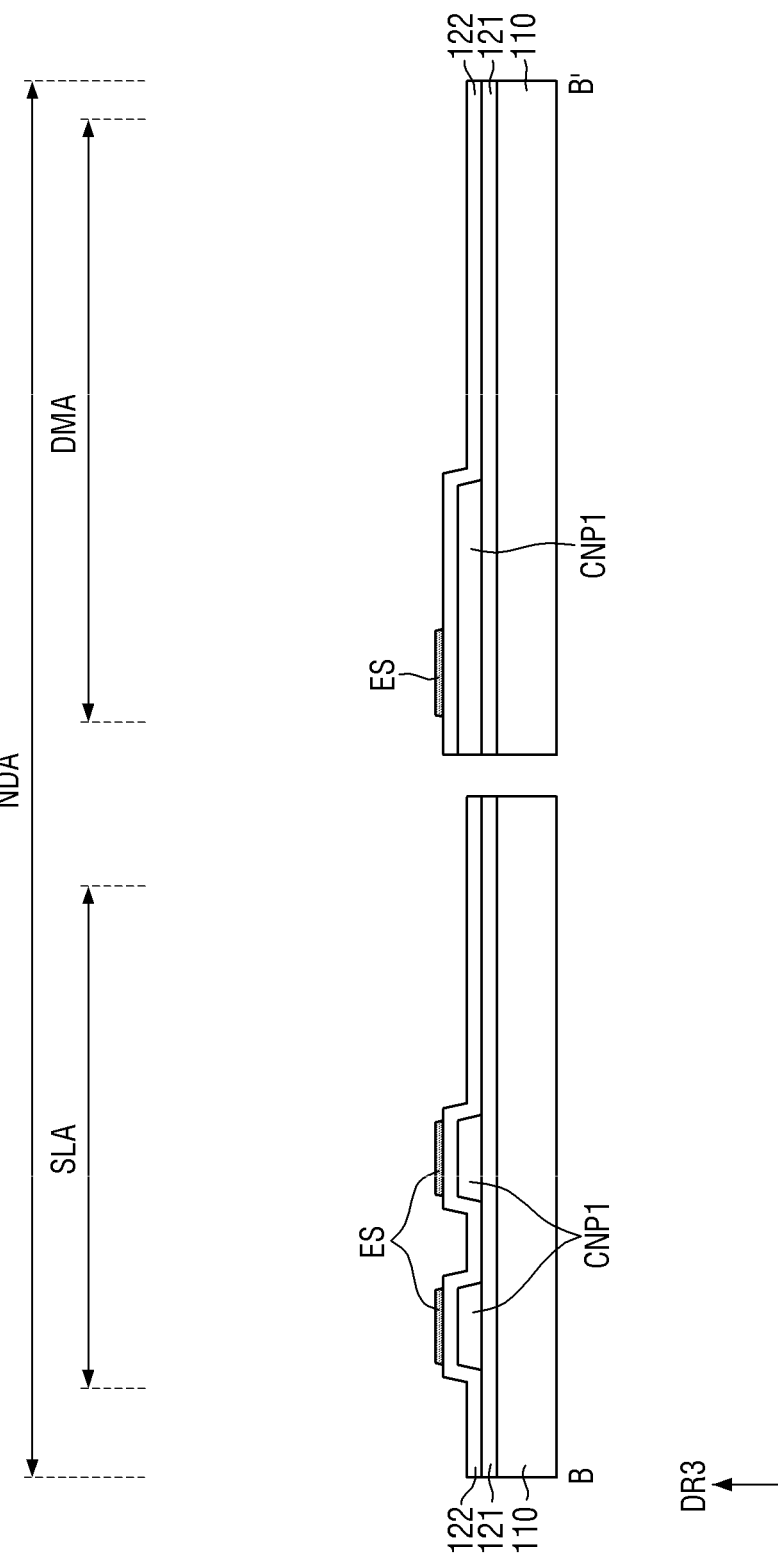

Referring to FIG. 23, the first active layer ACT1 overlapping the light shielding member SLP is disposed in each of the pixel areas PA by patterning the semiconductor material layer (not illustrated) on the buffer layer 122 (step S23 in FIG. 16).

In this case, the second active layer ACT2 spaced apart from the first active layer ACT1 may be further disposed in each of the pixel areas PA.

Figure 24:
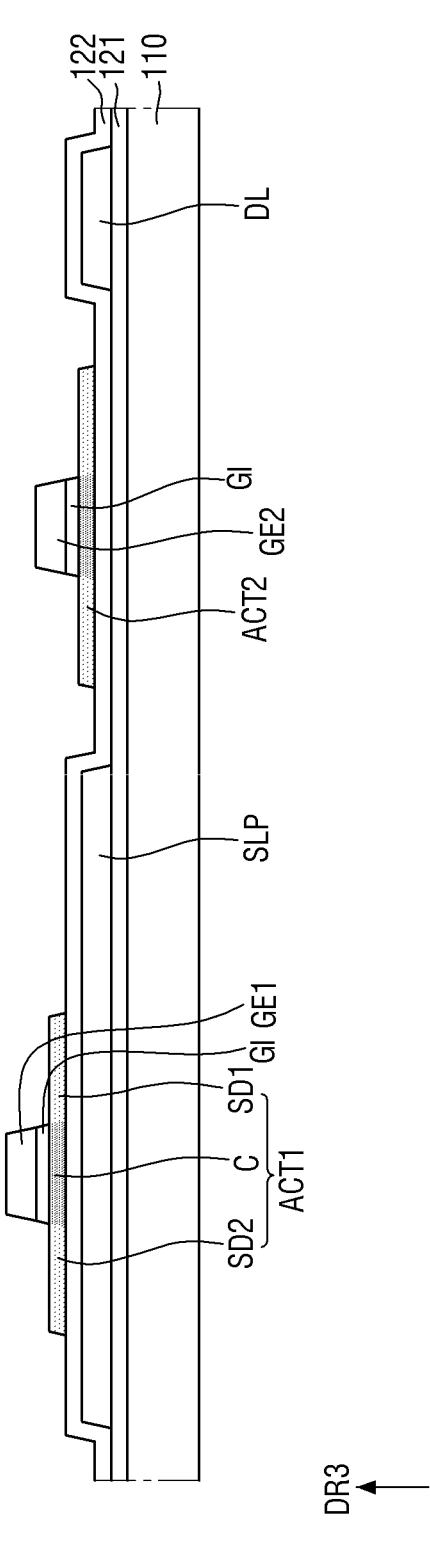

In addition, referring to FIG. 24, the etch stopper ES overlapping a portion of the first connecting line part CNP1 is disposed on at least a portion of each of the sealing area SLA and the dam area DMA in which the via layer 140 is scheduled to be removed in the non-display area NDA by patterning the semiconductor material layer (not illustrated) on the buffer layer 122 (step S23 in FIG. 16).

The semiconductor material layer may be made of polycrystalline silicon, monocrystalline silicon, low-temperature polycrystalline silicon, amorphous silicon, or an oxide semiconductor.

Referring to FIG. 24, the first insulating material layer (not illustrated) covering the first active layer ACT1, the second active layer ACT2, and the etch stopper ES is disposed on the buffer layer 122, the second conductive material layer (not illustrated) is disposed on the first insulating material layer, and then the stacked structure of the gate insulating layer GI and the first gate electrode GE1 may be disposed in the channel area C of the first active layer ACT1 by collectively patterning the first insulating material layer and the second conductive material layer (step S24 in FIG. 16).

Figure 25:
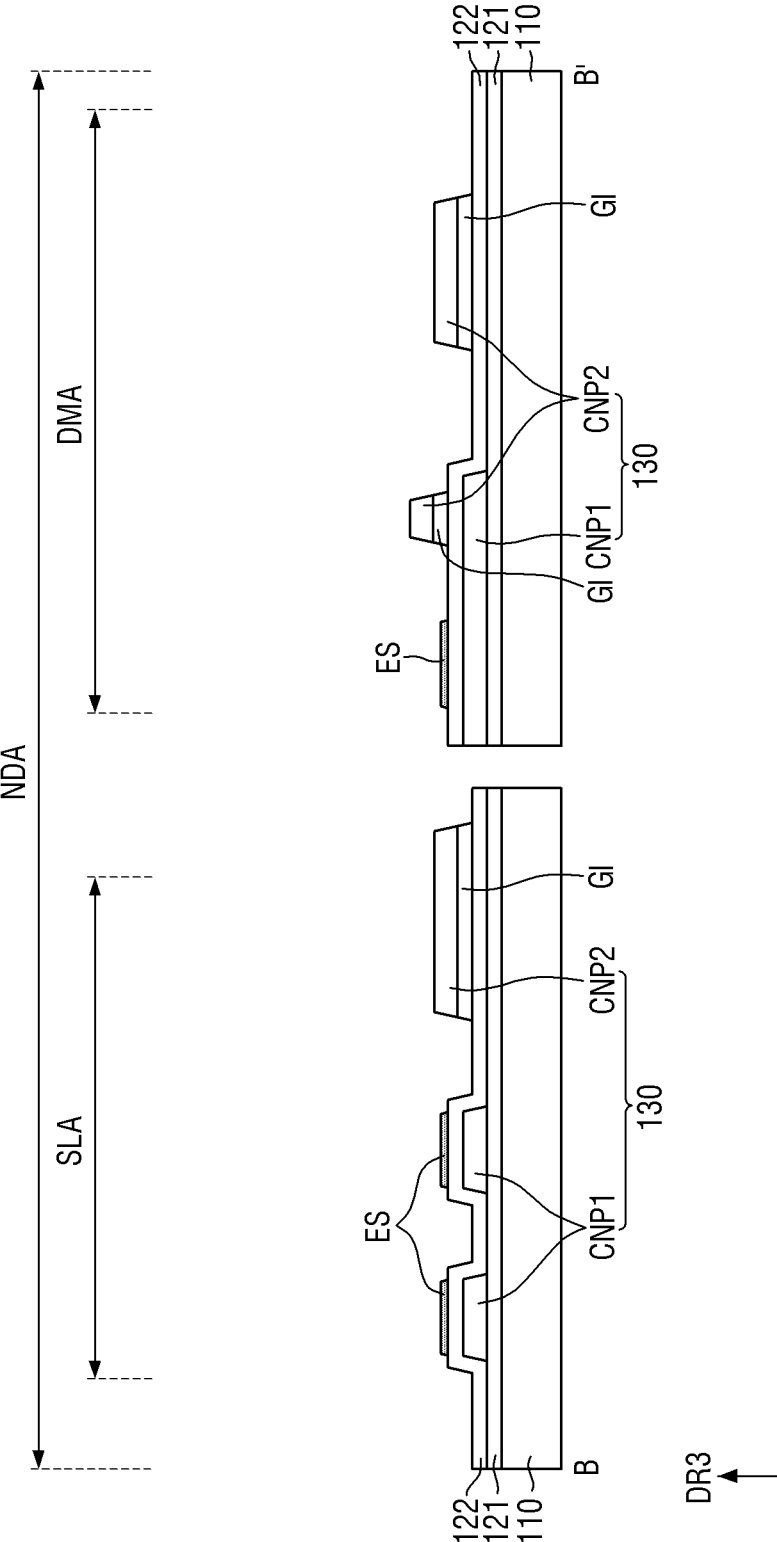

In addition, referring to FIG. 25, the stacked structure of the gate insulating layer GI and the second connecting line part CNP2 corresponding to the non-display area NDA is disposed by collectively patterning the first insulating material layer and the second conductive material layer (step S24 in FIG. 16).

Here, the second connecting line part CNP2 does not overlap the etch stopper ES. That is, the second connecting line part CNP2 is spaced apart from the etch stopper ES on the buffer layer 122. Accordingly, patterning of the second connecting line part CNP2 together with the etch stopper ES may be prevented.

At this time, the connection lines 130 each including at least one of the first connecting line part CNP1 and the second connecting line part CNP2 are provided.

The first insulating material layer may be formed of an inorganic layer of a silicon nitride layer, a silicon oxynitride layer, a silicon oxide layer, a titanium oxide layer, or an aluminum oxide layer.

The second conductive material layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy of some of the metals.

Figure 26:
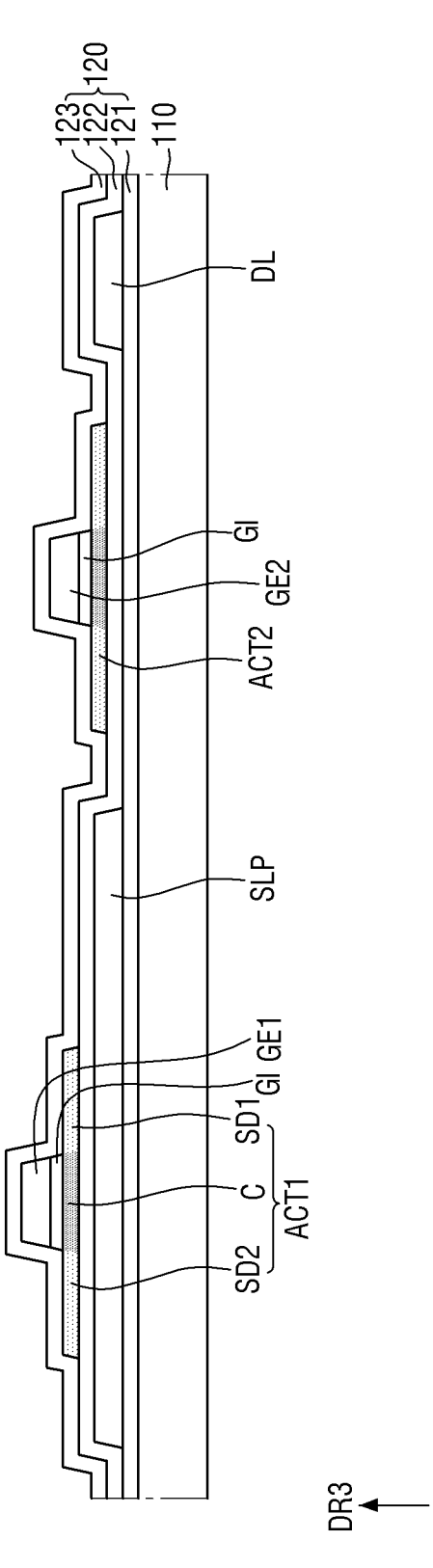
Figure 27:
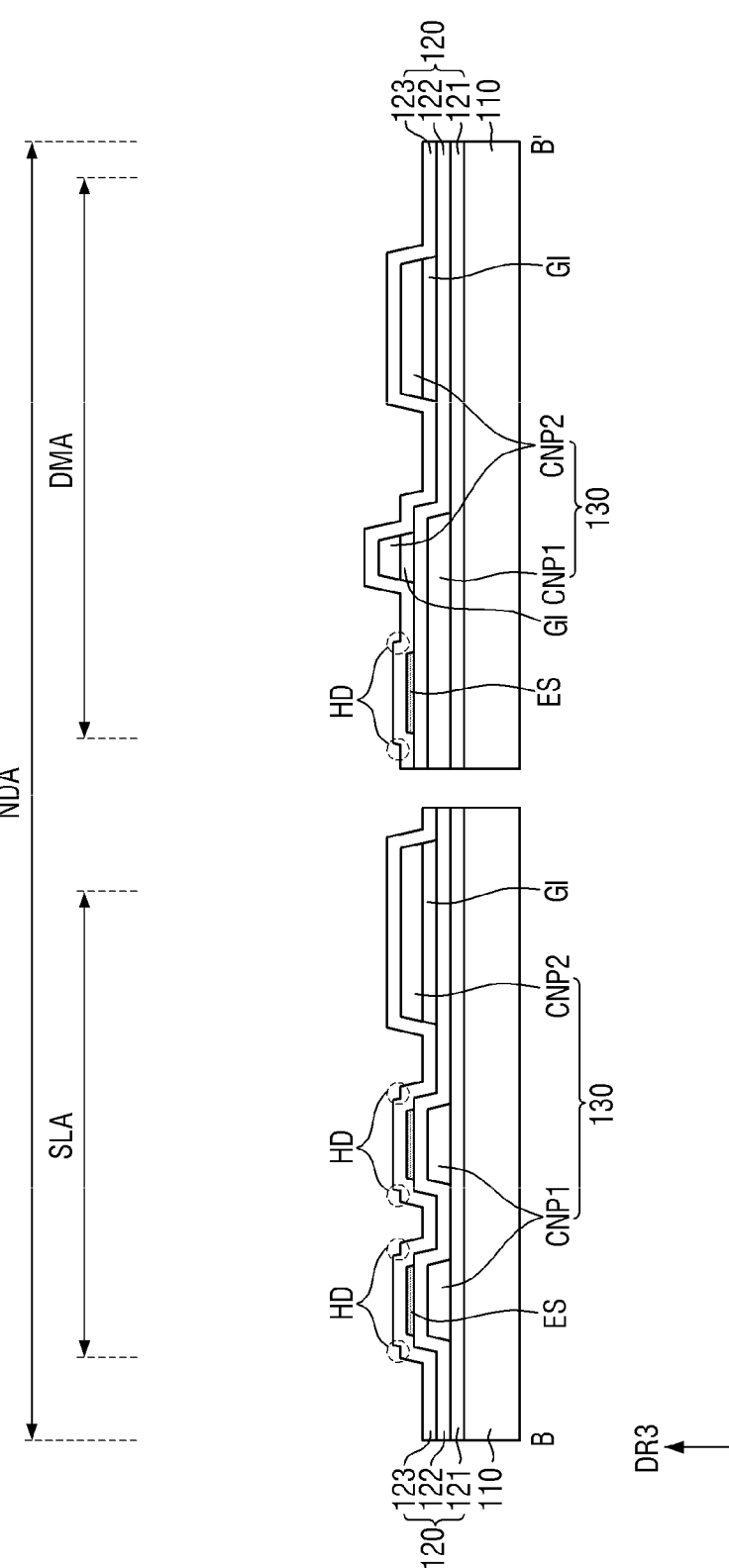

Referring to FIG. 26, the interlayer insulating layer 123 covering the first source drain area SD1 and the second source drain area SD2 of the first active layer ACT1, the etch stopper ES, the first gate electrode GE1, and the second connecting line part CNP2 is disposed by applying an inorganic insulating material on the buffer layer 122 (step S25 in FIG. 16).

In each of the sealing area SLA and the dam area DMA of the non-display area NDA, since the interlayer insulating layer 123 covers the etch stopper ES overlapping a portion of the first connecting line part CNP1, the insulating layer 123 has a shape including the height difference HD corresponding to the etch stopper ES.

The interlayer insulating layer 123 may be formed of multiple layers in which one or more inorganic layers of a silicon nitride layer, a silicon oxynitride layer, a silicon oxide layer, a titanium oxide layer and an aluminum oxide layer are alternately stacked.

Accordingly, the circuit array 120 corresponding to the display area DA and the connection lines 130 corresponding to the non-display area NDA are provided on the support substrate 110 (step S20 in FIG. 15).

Figure 28:
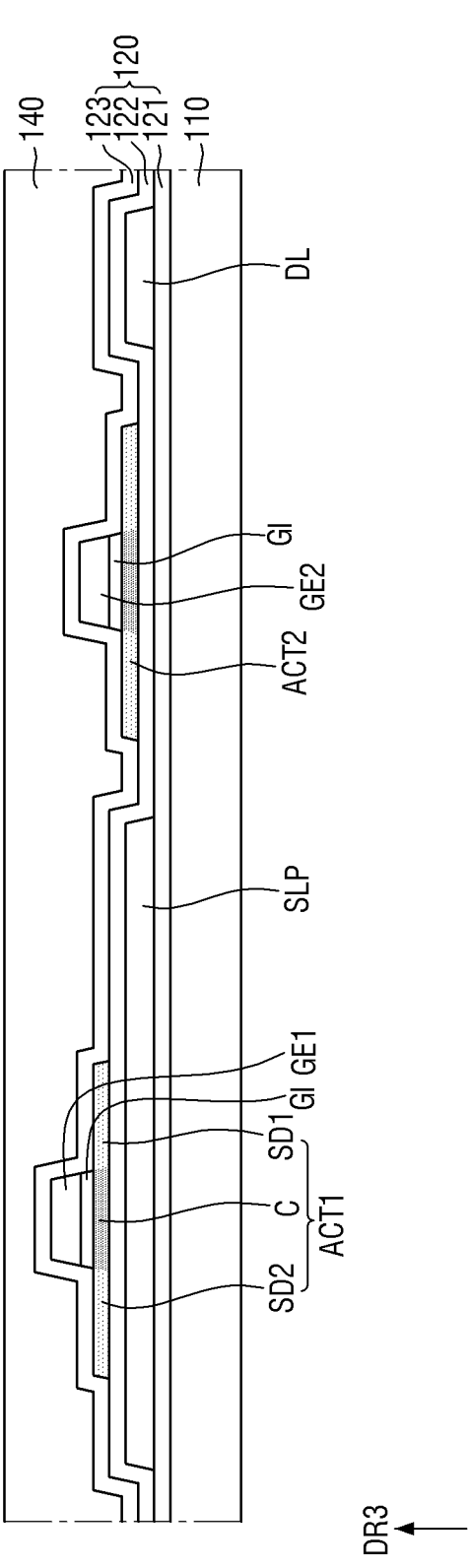
Figure 29:
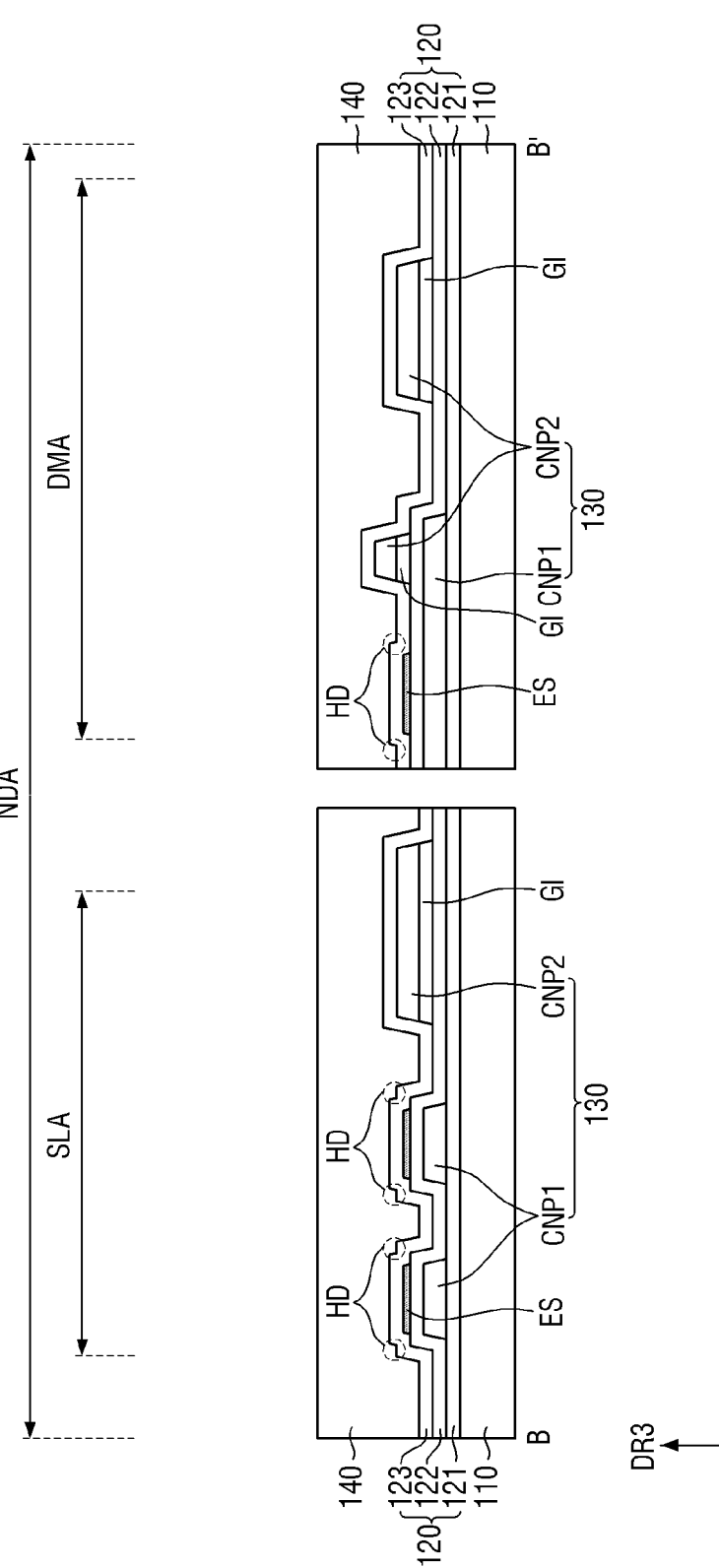

Referring to FIGS. 28 and 29, the via layer 140 covering the circuit array 120 and the connection lines 130 is disposed (step S30 in FIG. 15).

That is, the via layer 140 may be disposed on the interlayer insulating layer 123, and may have a structure in which one or more organic layers such as an acryl resin, an epoxy resin, a phenolic resin, a polyamide resin, and a polyimide resin are stacked.

Figure 30:
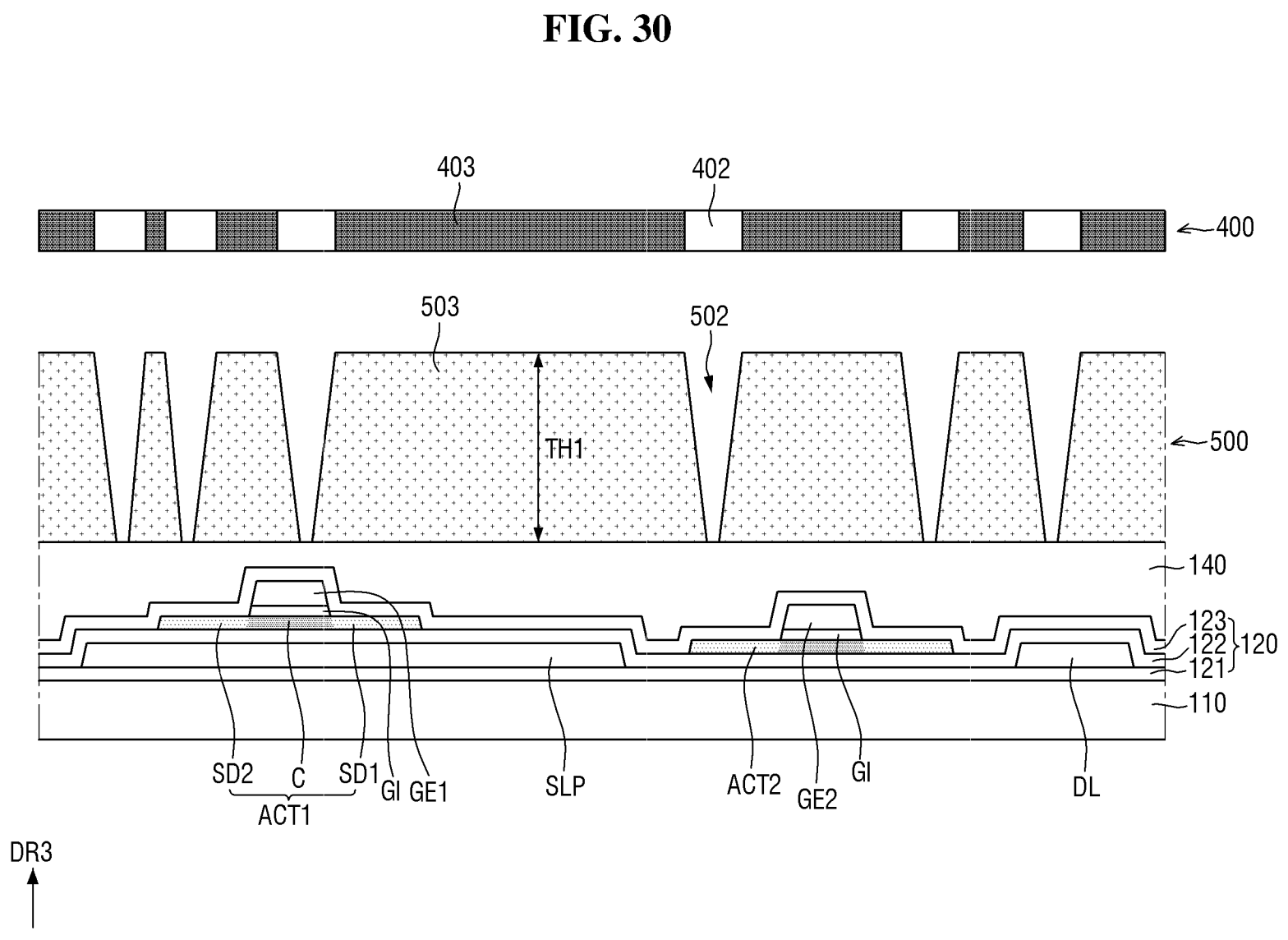
Figure 31:
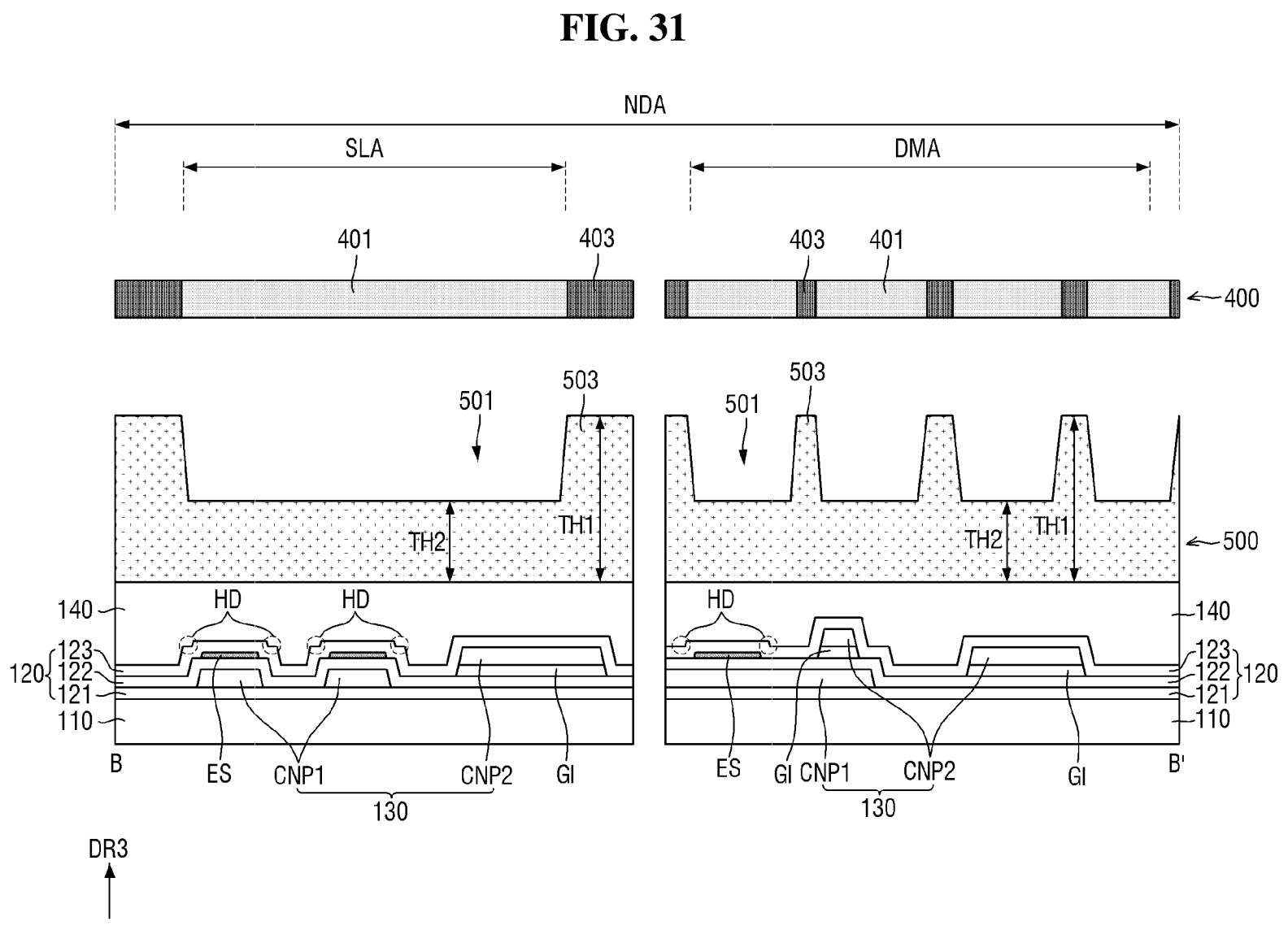

Referring to FIGS. 30 and 31, after disposing a mask material layer (not illustrated) having a first thickness TH1 on the via layer 140 (step S41 in FIG. 17), the exposure mask 500 is disposed on the via layer 140 by performing an exposure process using a halftone mask 400 on the mask material layer (step S42 in FIG. 17).

Here, the mask material layer may be made of siloxane. In this way, it may be reduced that the mask material layer is etched together by the etching process in the step S43 of disposing at least one contact hole (see FIG. 17).

The halftone mask 400 may include a semi-transmissive portion 401 corresponding to the sealing hole 141 of the sealing area SLA and each of the two or more first valleys 142 of the dam area DMA, at least one light transmitting portion 402 corresponding to at least one of the contact holes CT1, CT2, CT3, CT4, CT5, and CT6 (see FIG. 5) of each of the pixel areas PA, and a light blocking portion 403 corresponding to the remainder excluding them.

Accordingly, the exposure mask 500 may include a first blocking portion 501 corresponding to the semi-transmissive portion 401 of the halftone mask 400 and having a second thickness TH2 smaller than the first thickness TH1 of the mask material layer, at least one first opening 502 corresponding to the at least one light transmitting portion 402 of the halftone mask 400 and penetrating the mask material layer, and a second blocking portion 503 corresponding to the light blocking portion 403 of the halftone mask 400 and made of the mask material layer having the first thickness TH1.

Figure 32:
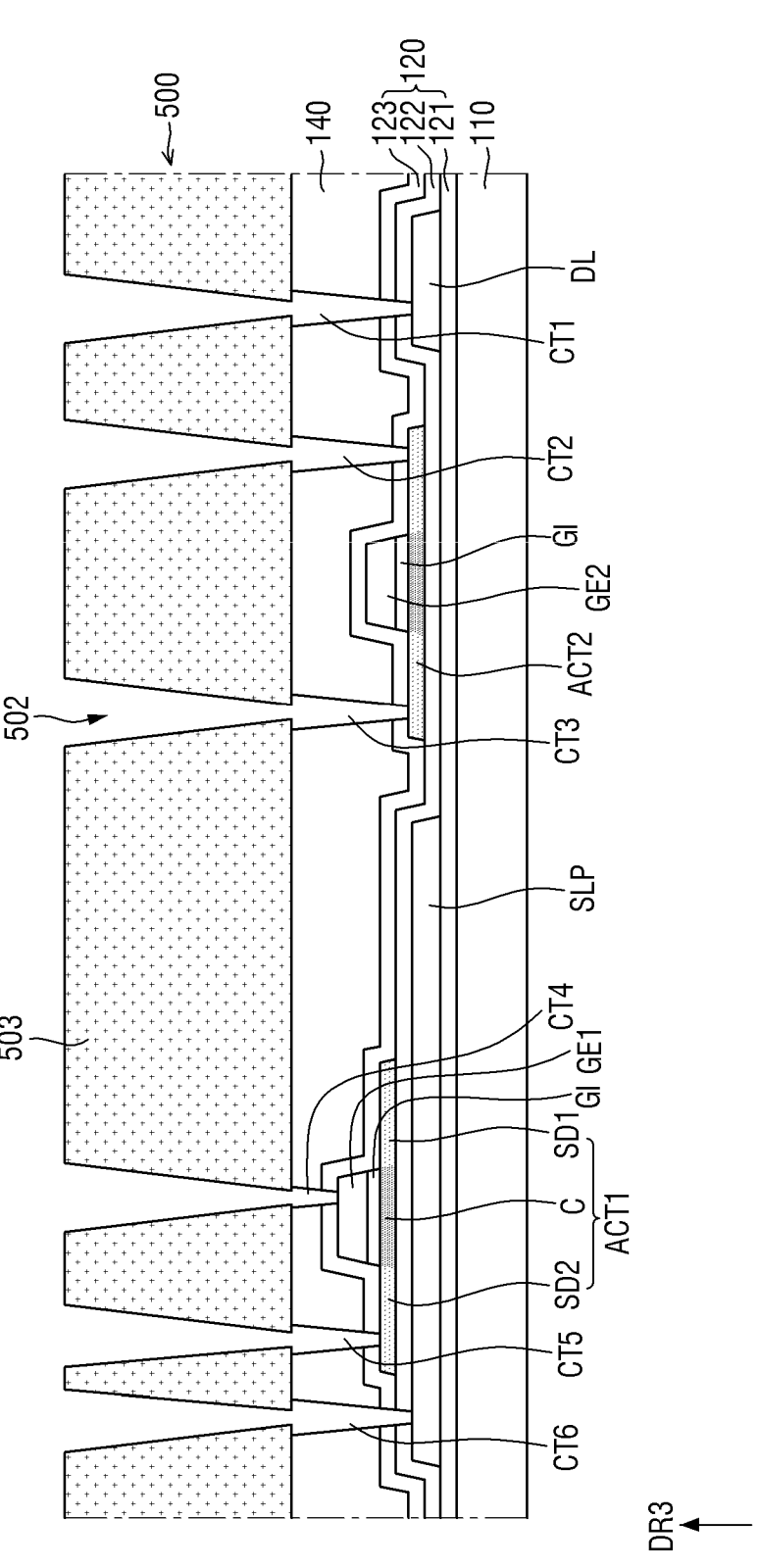

Referring to FIG. 32, the via layer 140 exposed by the at least one first opening 502 of the exposure mask 500 is patterned to provide at least one of the contact holes CT1, CT2, CT3, CT4, CT5, and CT6 corresponding to each of the pixel areas PA (step S43 in FIG. 17).

Figure 33:
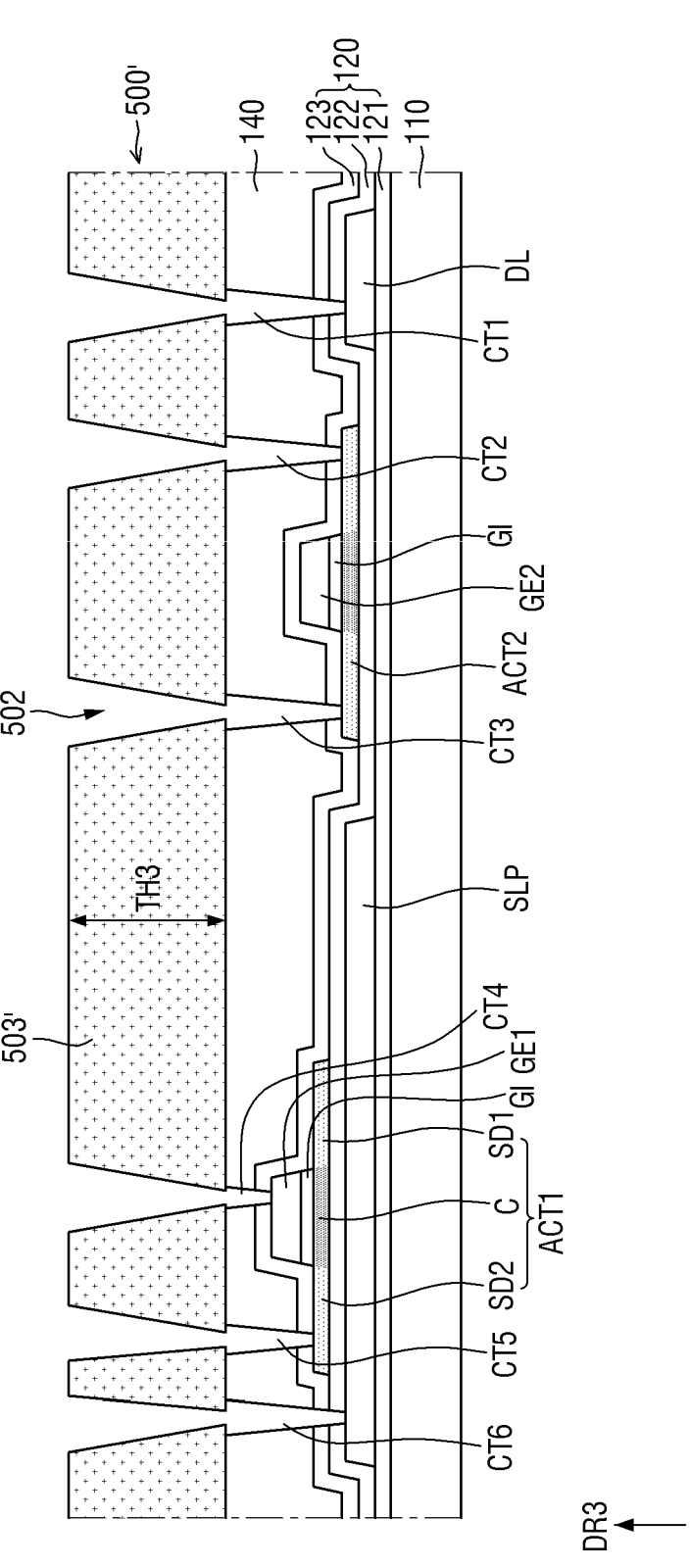
Figure 34:
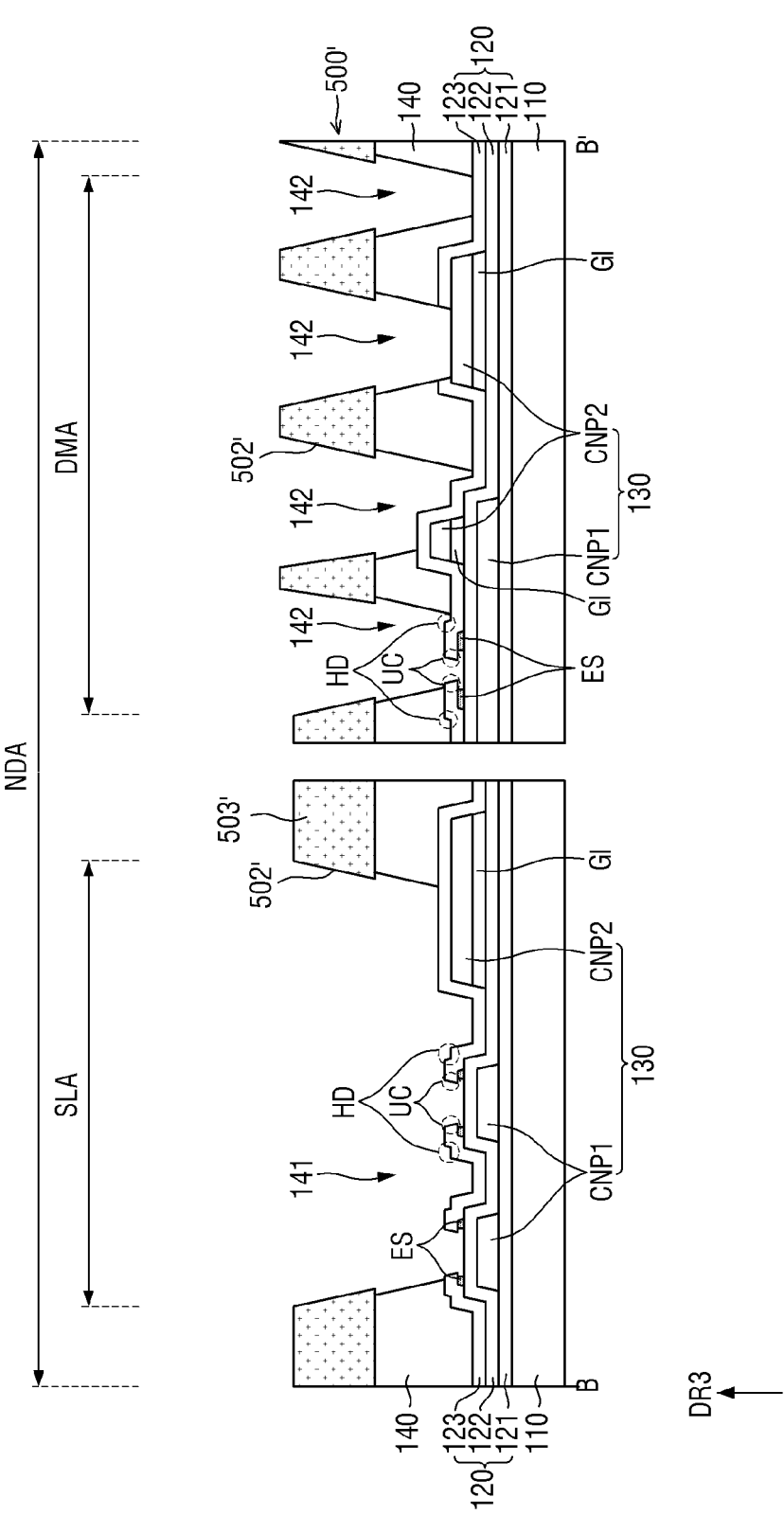

Referring to FIGS. 33 and 34, an ashing process is performed on the exposure mask 500 to provide a change mask 500' (step S44 in FIG. 17).

The change mask 500', together with the at least one first opening 502 of the exposure mask 500, may include a third blocking portion 503' corresponding to the second blocking portion 503 of the exposure mask 500 and having a third thickness TH3 smaller than the first thickness TH1, and a second opening 502' corresponding to the first blocking portion 501 of the exposure mask 500 and exposing the via layer 140.

Referring to FIG. 34, by patterning the via layer 140 corresponding to the second opening 502' of the change mask 500', the sealing hole 141 may be disposed in the sealing area SLA of the non-display area NDA, and the two or more first valleys 142 may be disposed in the dam area DMA of the non-display area NDA (step S45 in FIG. 17).

In addition, the first dam layer DML1 having the same layer as the via layer 140 is provided between the two or more first valleys 142.

At this time, a portion of the interlayer insulating layer 123 is patterned together in the sealing hole 141 and each of the two or more first valleys 142 according to the etch strength for patterning the via layer 140, so that a portion of the etch stopper ES may be exposed or removed. In this case, the interlayer insulating layer 123 may include the undercut structure UC corresponding to a portion of the removed etch stopper ES.

Alternatively, all of the etch stopper ES may also be removed according to an etch strength for patterning the via layer 140.

As such, due to the disposition of the etch stopper ES, the possibility of damage or removal of the first connecting line part CNP1 in the sealing hole 141 and each of the two or more first valleys 142 may be reduced.

Thereafter, the step S46 of removing the change mask 500' on the via layer 140 (see FIG. 17) is performed.

Accordingly, at least one contact hole corresponding to each of the pixel areas PA, and the sealing hole 141 and the two or more first valleys 142 corresponding to the non-display area NDA are provided (step S40 in FIG. 15).

Figure 35:
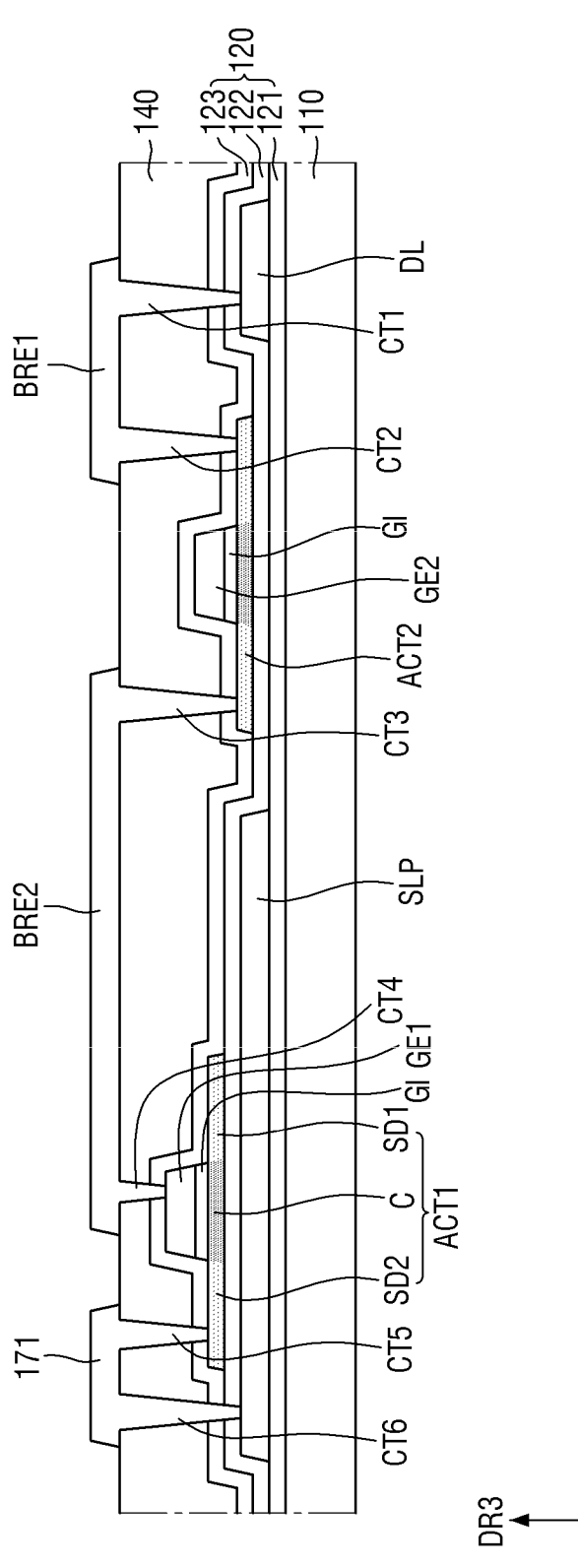

Next, referring to FIG. 35, the pixel electrodes 171 respectively corresponding to the pixel areas PA are disposed on the via layer 140.

In this case, the pixel electrode 171 may be connected to the second source drain area SD2 of the first active layer ACT1 through the fifth contact hole CT5 penetrating the via layer 140 and the interlayer insulating layer 123.

In addition, the pixel electrode 171 may be connected to the light shielding member SLP through the sixth contact hole CT6 penetrating the via layer 140, the interlayer insulating layer 123, and the buffer layer 122.

In addition, along with the pixel electrode 171, the first bridge electrode BRE1 connecting the data line DL and the second active layer ACT2 through the first contact hole CT1 and the second contact hole CT2, and the second bridge electrode BRE2 connecting the first gate electrode GE1 and the second active layer ACT2 through the third contact hole CT3 and the fourth contact hole CT4 may be disposed on the via layer 140.

Figure 36:
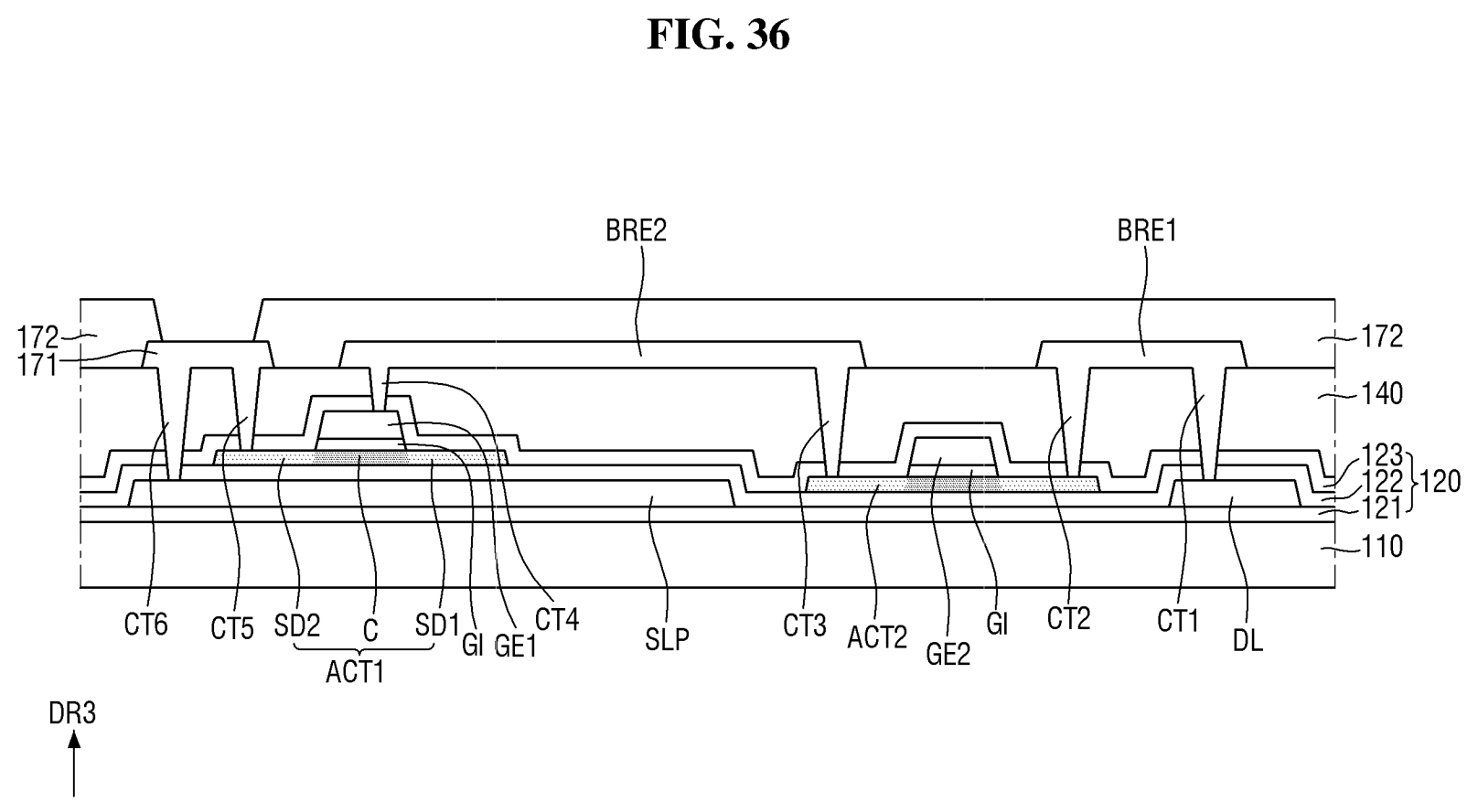

Referring to FIG. 36, an organic insulating material layer disposed on the via layer 140 and covering the pixel electrode 171, the first bridge electrode BRE1 and the second bridge electrode BRE2 is patterned to dispose the pixel defining layer 172 corresponding to the boundary between the pixel areas PA and covering the remainder except for a portion of the central portion of the pixel electrode 171.

The pixel defining layer 172 may be made of acryl resin, epoxy resin, phenolic resin, polyamide resin, polyimide resin and the like.

Figure 37:
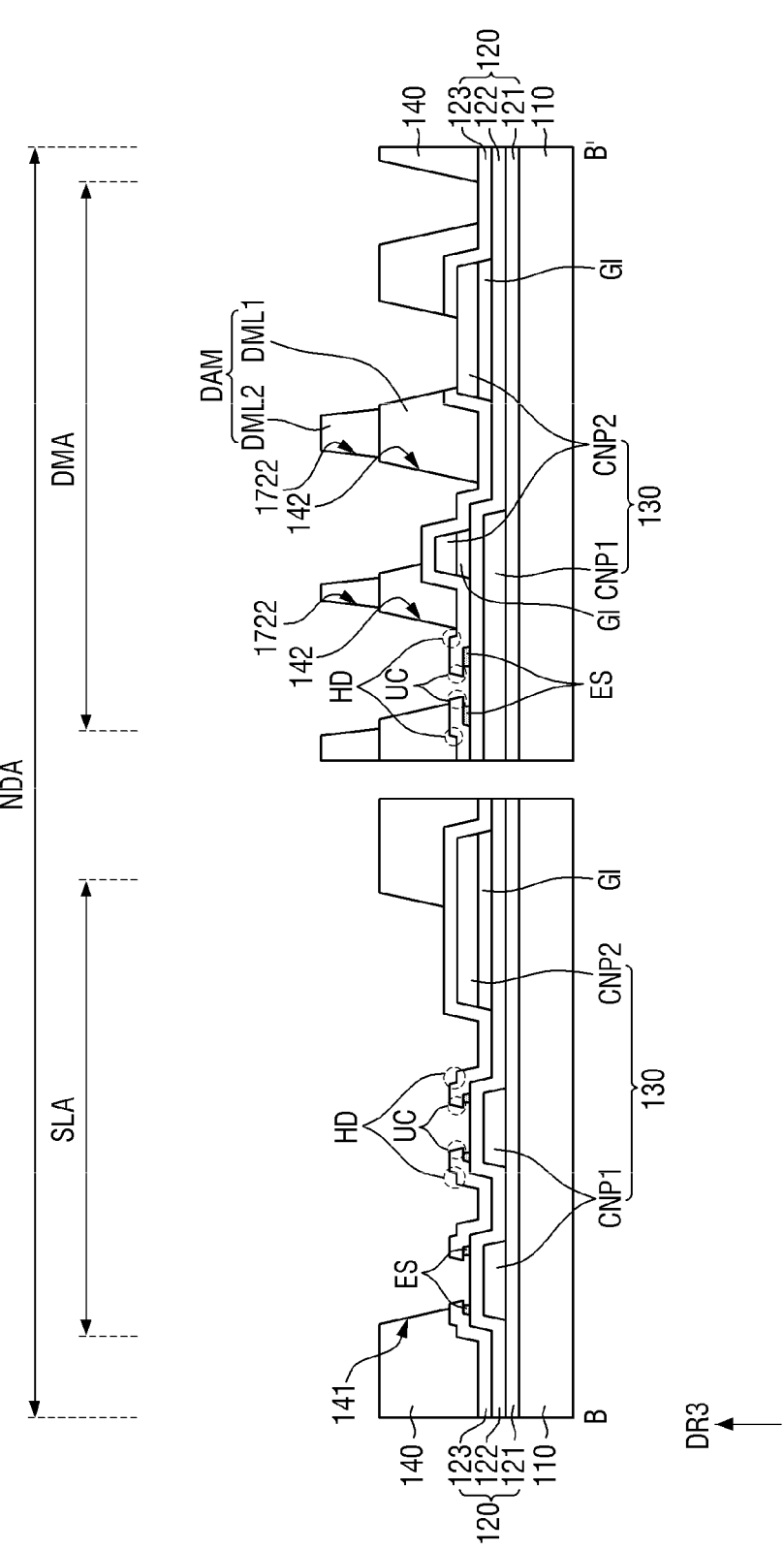

Referring to FIG. 37, the two or more second valleys 1722 respectively connected to the two or more first valleys 142 and penetrating the pixel defining layer 172 may be provided together with the pixel defining layer 172. In addition, the second dam layer DML2 made of the same layer as the pixel defining layer 172 may be provided on the first dam layer DML1.

Accordingly, the dam structure DAM constituted by the stacking of the first dam layer DML1 and the second dam layer DML2 may be provided.

Figure 38:
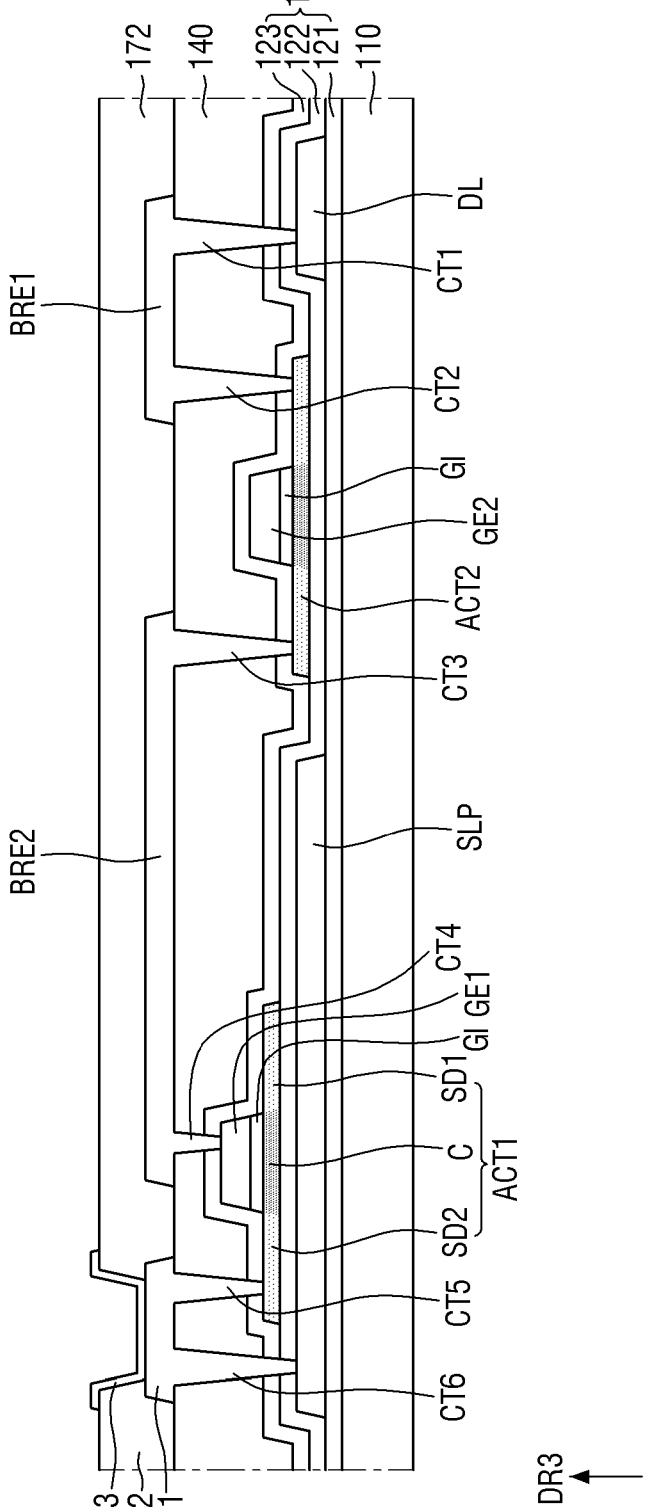

Referring to FIG. 38, the light emitting layers 173 are disposed on the pixel electrodes 171, respectively.

Figure 39:
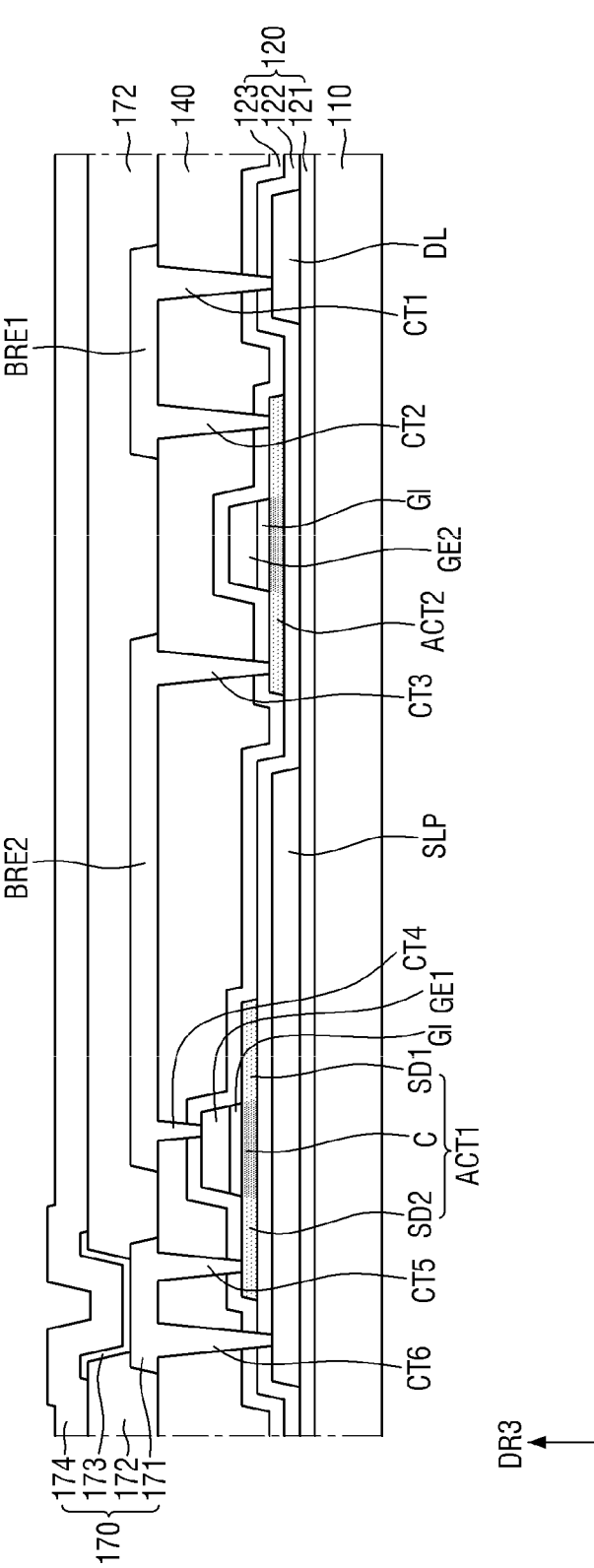

Referring to FIG. 39, the common electrode 174 corresponding entirely to the pixel areas PA is disposed on the light emitting layers 173 and the pixel defining layer 172.

Figure 40:
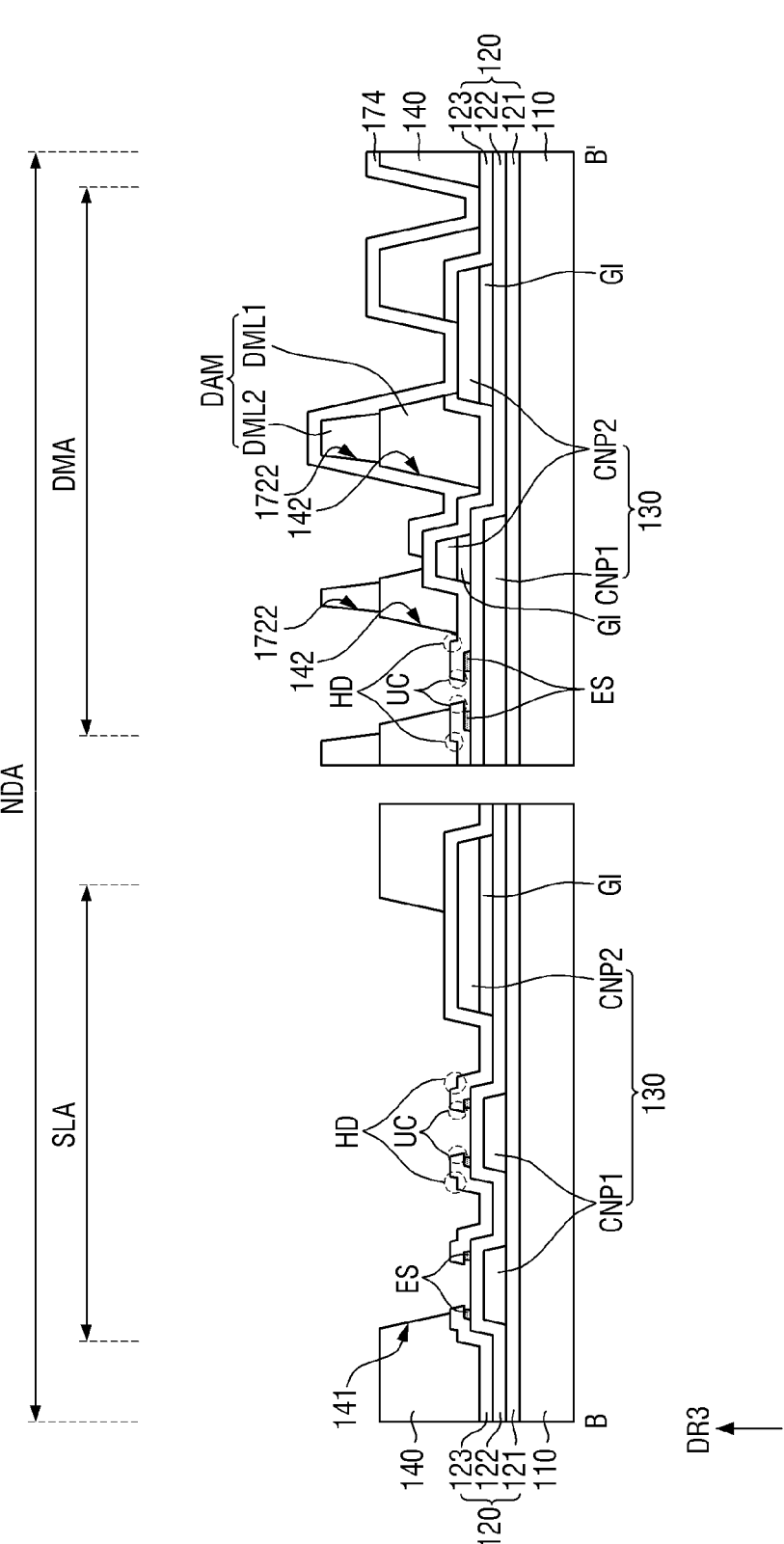

Referring to FIG. 40, the common electrode 174 may extend to the dam area DMA of the non-display area NDA, be disposed to cover the at least one dam structure DAM, and be connected to at least one connection line through a predetermined contact hole in the dam area DMA.

Accordingly, the light emitting array 170 including the light emitting elements EMD respectively corresponding to the pixel areas PA and having a structure in which the light emitting layer 173 is interposed between the pixel electrode 171 and the common electrode 174 is provided (step S50 in FIG. 15).

Figure 41:
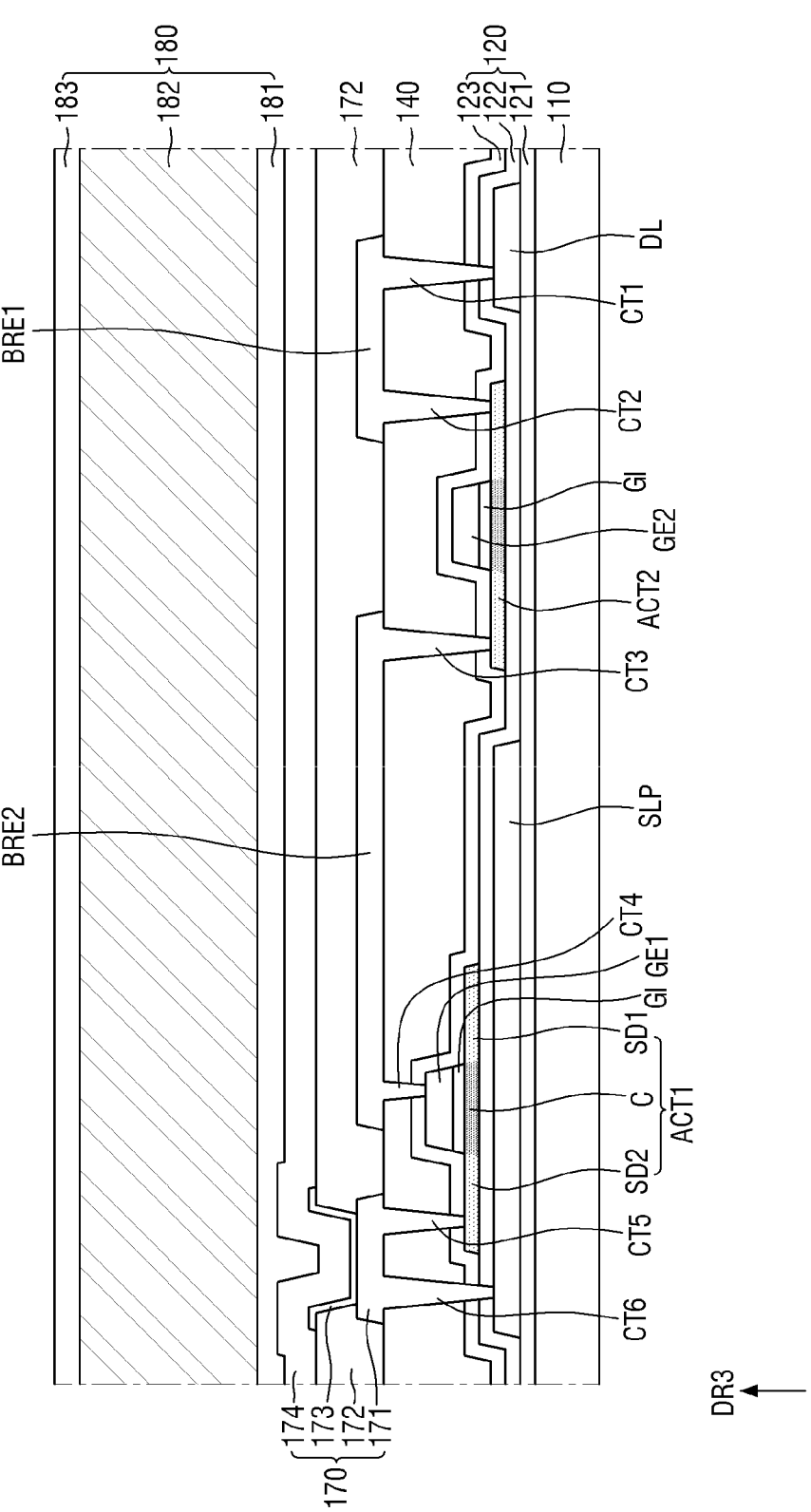
Figure 42:
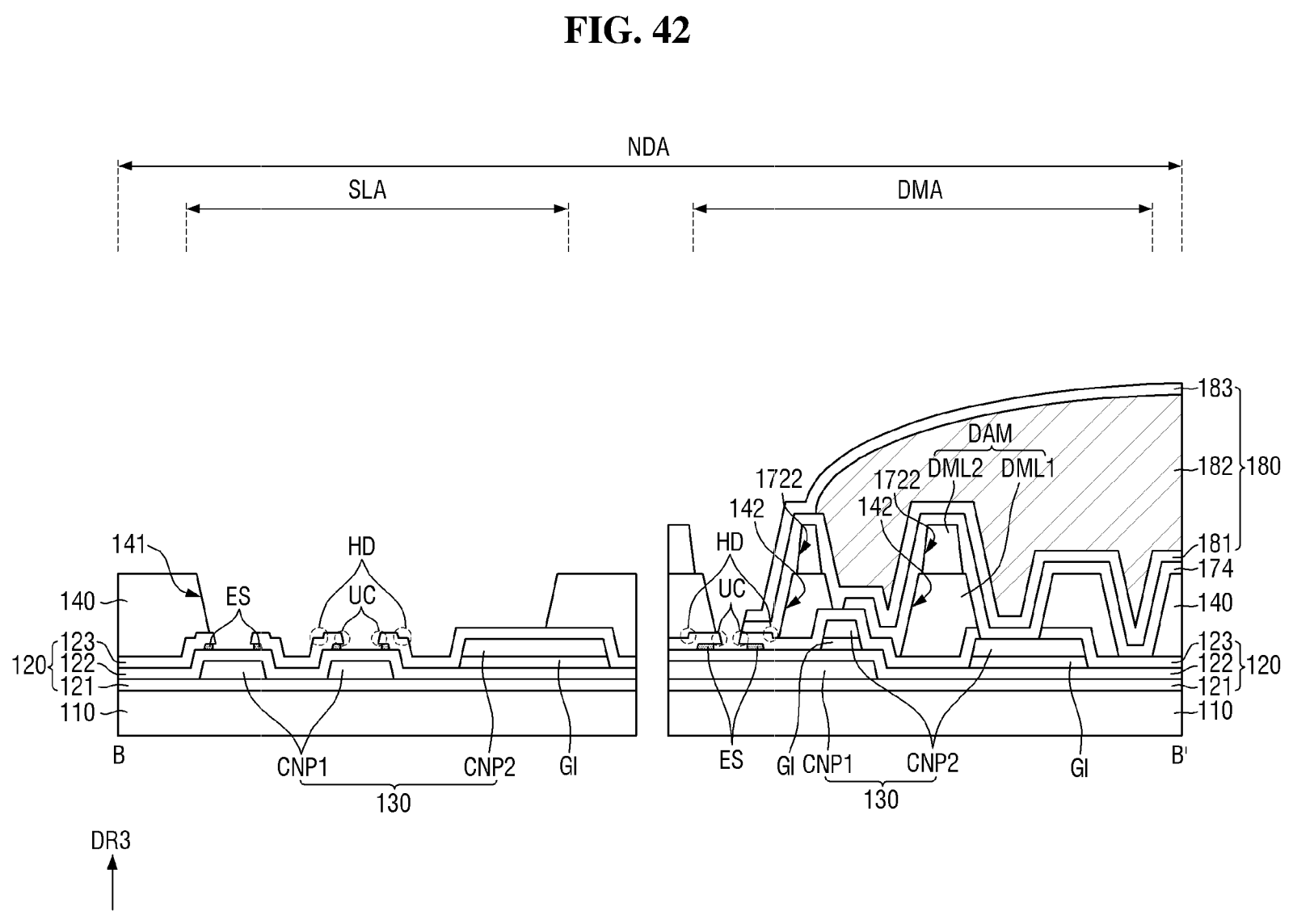
Figure 43:
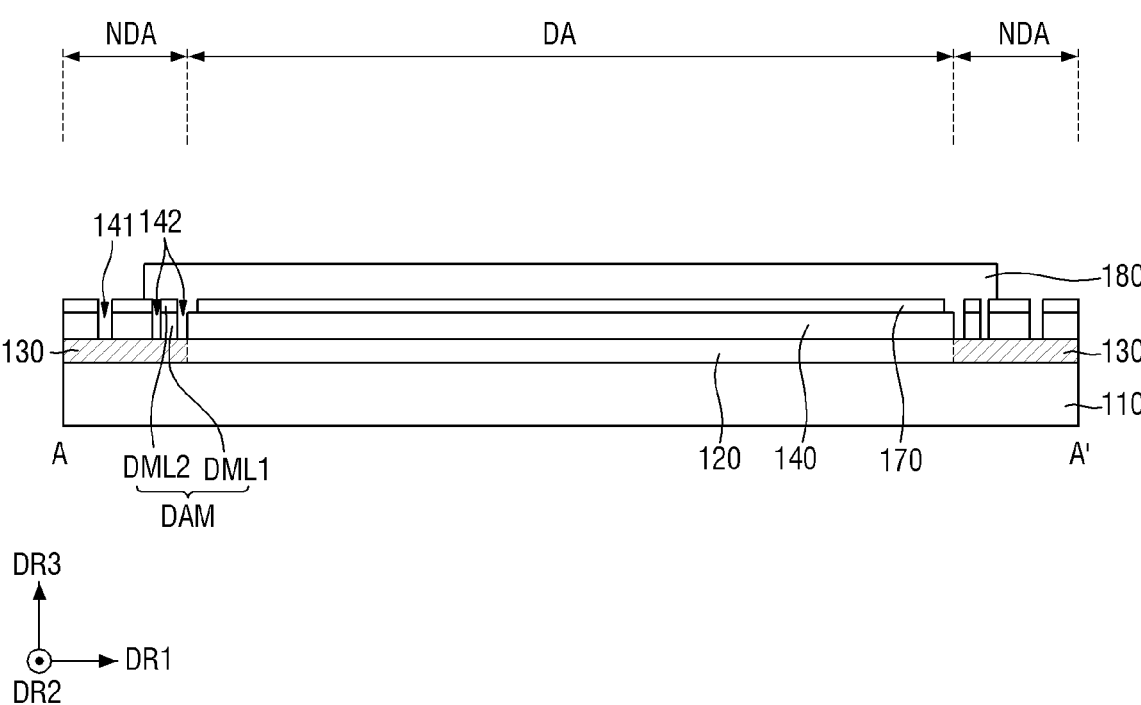

Referring to FIGS. 41, 42 and 43, the sealing structure 180 covering the light emitting array 170 is provided (step S60 in FIG. 15).

The sealing structure 180 may include the first sealing layer 181 disposed on the light emitting array 170 and made of an inorganic insulating material, the second sealing layer 182 disposed on the first sealing layer 181 and made of an organic insulating material, and the third sealing layer 183 disposed on the first sealing layer 181, covering the second sealing layer 182, and made of an inorganic insulating material.

As illustrated in FIG. 42, the first sealing layer 181 may be disposed to extend to the dam area DMA until the first sealing layer 181 covers the light emitting array 170 and covers the second dam layer DML2.

The second sealing layer 182 has an edge corresponding to the dam structure DAM including the first dam layer DML1 and the second dam layer DML2.

The third sealing layer 183 covers the second sealing layer 182 and is in contact with the first sealing layer 181 in the dam area DMA.

Figure 44:
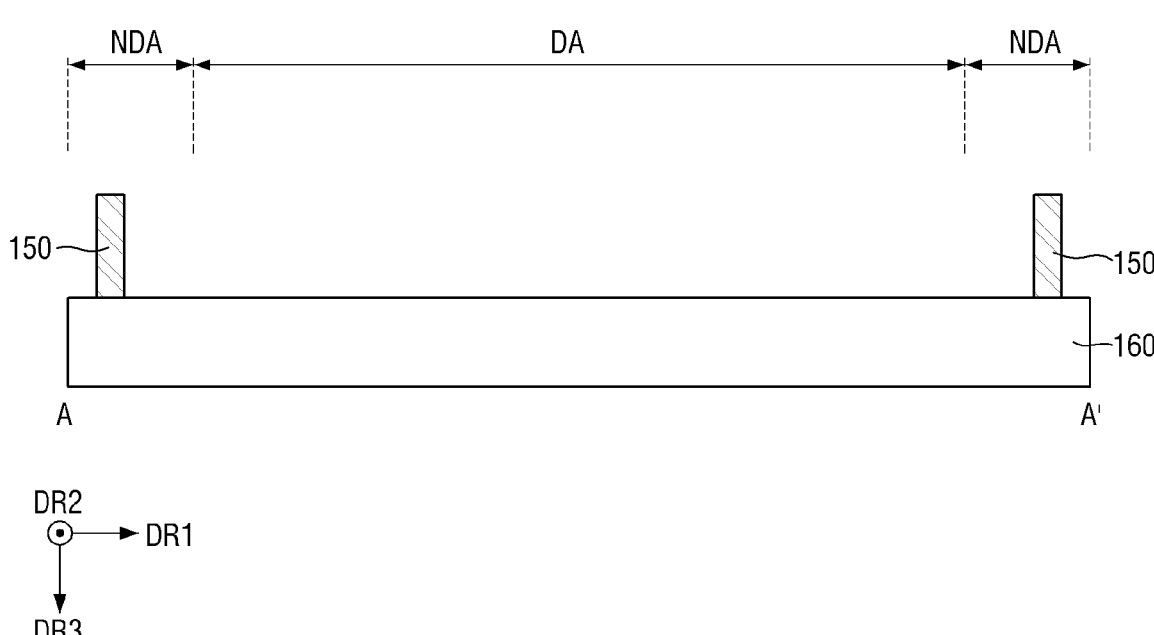
FIG. 44, and FIG. 45 illustrate structures related to steps of the flowcharts shown in FIG. 15, FIG. 16, and FIG. 17.

Referring to FIG. 44, the sealing member 150 having a shape surrounding the display area DA is disposed on one surface of the encapsulation substrate 160 including at least the display area DA (step S70 in FIG. 15).

Figure 45:
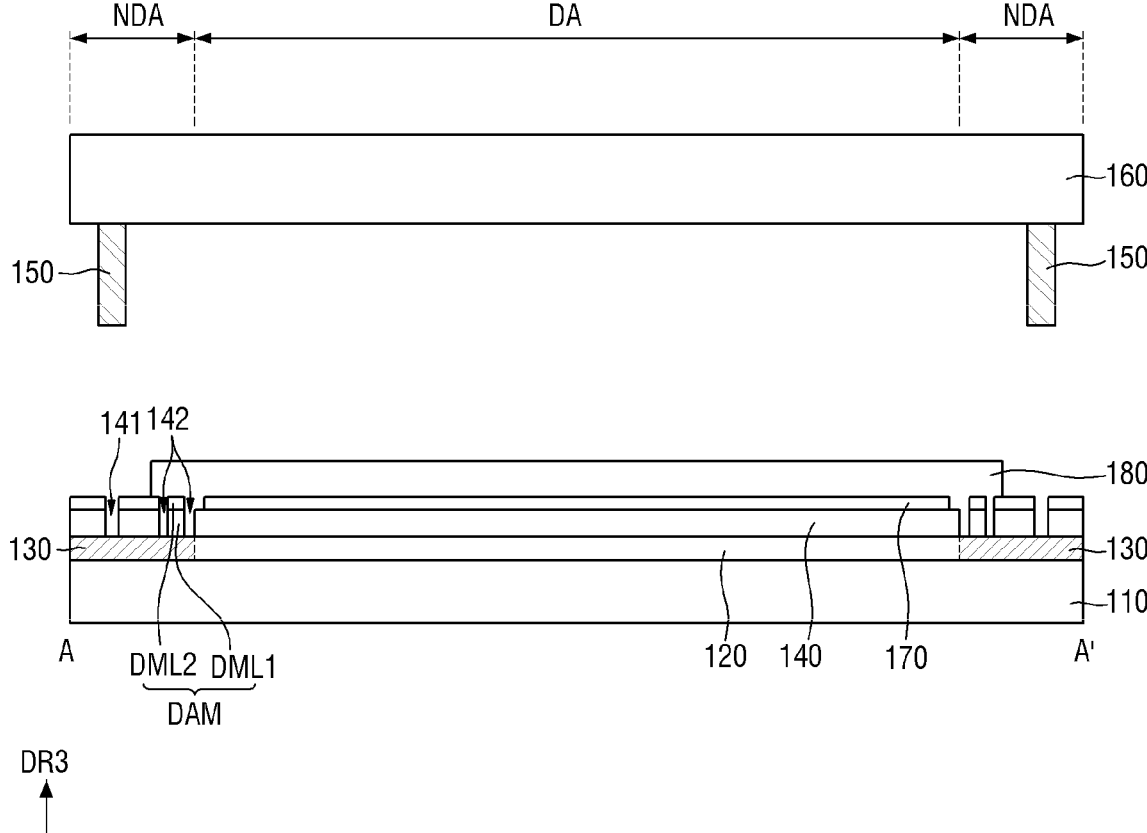

Referring to FIG. 45, the encapsulation substrate 160 and the support substrate 110 are aligned so that the sealing member 150 of the encapsulation substrate 160 and the sealing hole 141 of the support substrate 110 face each other (step S80 in FIG. 15).

Thereafter, as illustrated in FIG. 2, by disposing the sealing member 150 in the sealing hole 141, the encapsulation substrate 160 and the supporting substrate 110 are bonded to each other through the sealing member 150 (step S90 in FIG. 15).

Accordingly, the display panel 100 according to the first embodiment may be provided.

Figure 46:
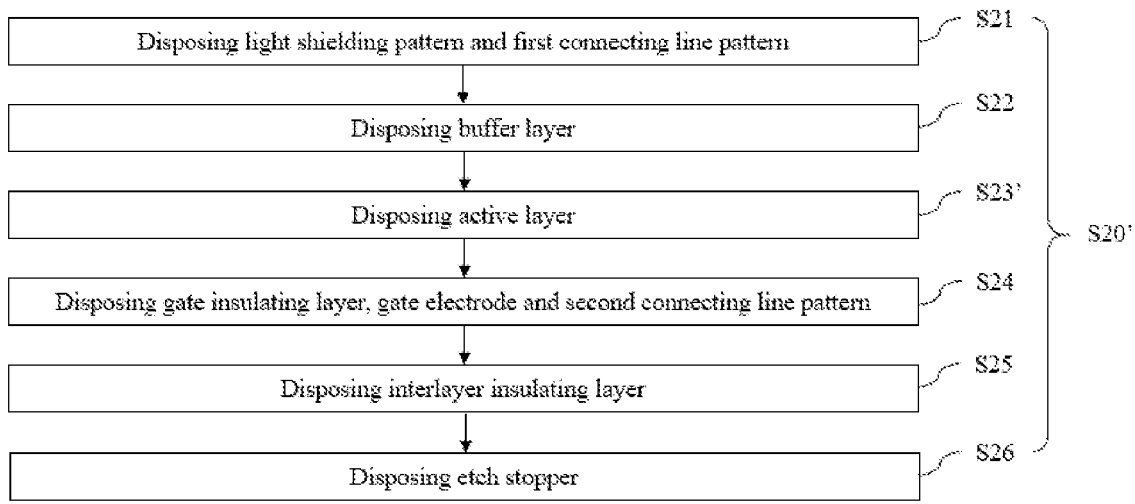
FIG. 46 is a flowchart illustrating a method for fabricating a display panel according to an embodiment.
Figure 47:
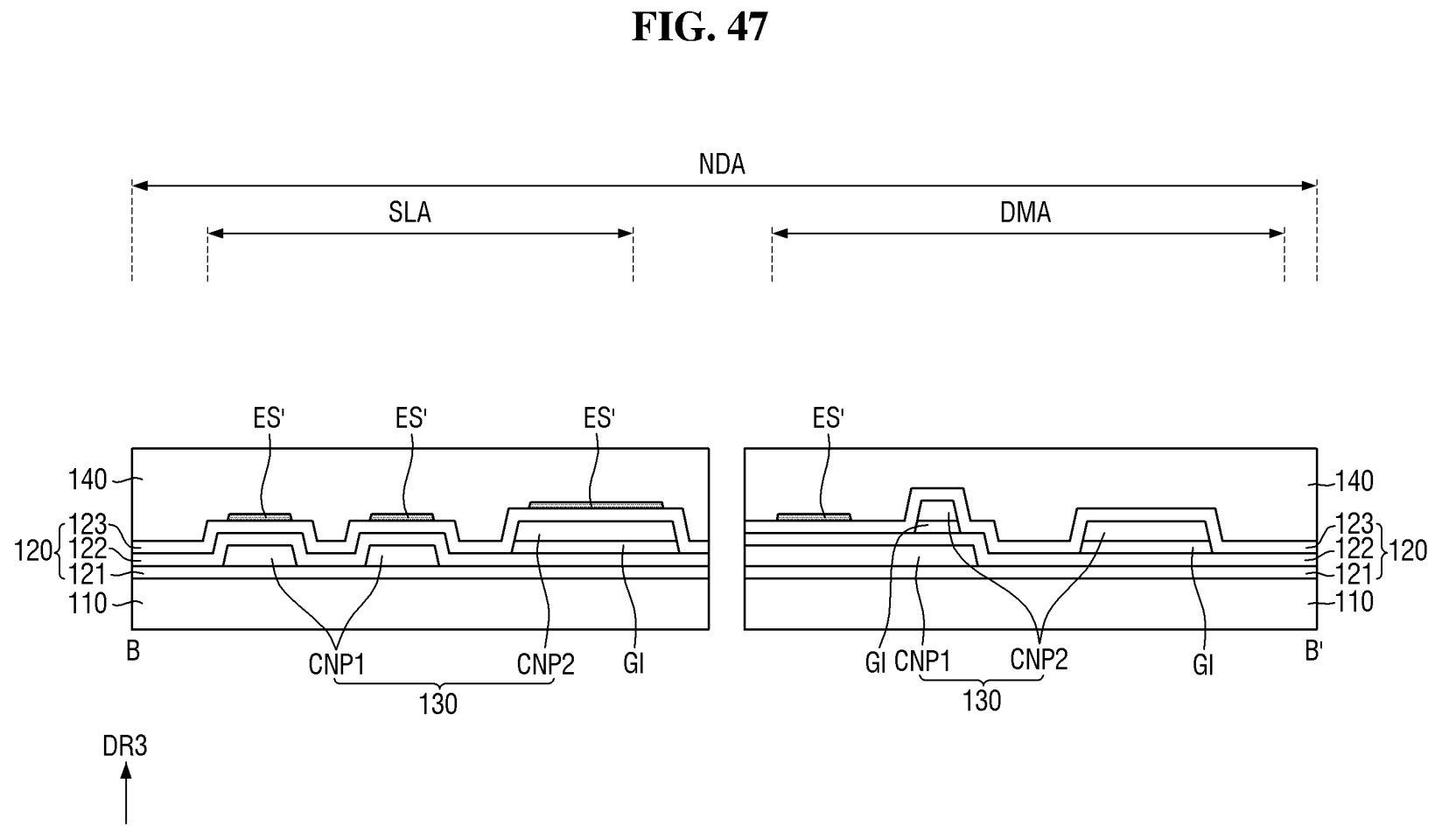

FIG. 46 is a flowchart illustrating a method for fabricating a display panel according to an embodiment. FIG. 47 illustrates disposing the via layer after disposing the etch stopper according to an embodiment.

Referring to FIG. 46, the method for fabricating the display panel according to the second embodiment is the same as that of the first embodiment according to FIGS. 15, 16, and 17 except that in the step S20' of disposing the circuit array 120 and the connection lines 130, the etch stopper ES is not disposed together with the first active layer ACT1, and disposing the etch stopper ES' is performed after the step S25 of disposing the interlayer insulating layer 123, a redundant description will be omitted below.

That is, referring to FIG. 47, the etch stopper ES' according to the second embodiment is not disposed on the buffer layer 122, but is disposed on the insulating layer 123 after the interlayer insulating layer 123 is disposed (step S25 of FIG. 46) (step S26 in FIG. 46).

In this way, while there is a disadvantage in that the number of mask processes increases, the second connecting line part CNP2 disposed on the buffer layer 122 may also be protected by the etch stopper ES', and thus there is an advantage in that the yield and product reliability may be improved.

However, the aspects of the disclosure are not restricted to the one set forth herein. The above and other aspects of the disclosure will become more apparent to one of daily skill in the art to which the disclosure pertains by referencing the claims, with functional equivalents thereof to be included therein.

What is claimed is:
1. A method for fabricating a display panel, the method comprising:
    providing a support substrate comprising a display area and a non-display area, the display area in which a plurality of pixel areas is arranged, the non-display area being a periphery of the display area;

disposing a circuit array and connection lines on the support substrate, the circuit array disposed in the display area and comprising thin film transistors and signal lines connected to the thin film transistors, and the connection lines disposed in the non-display area connected to the signal lines;

disposing a via layer covering the circuit array and the connection lines on the support substrate;

providing a sealing hole having a shape surrounding the display area in the non-display area of the support substrate by patterning the via layer;

disposing a sealing member having a shape surrounding the display area on an encapsulation substrate comprising at least the display area;

aligning the support substrate and the encapsulation substrate in a direction in which the sealing member and the sealing hole face each other; and disposing the sealing member in the sealing hole and bonding the support substrate to the encapsulation substrate, wherein the disposing of the circuit array and the connection lines comprises:

disposing a light shielding member in one of the pixel areas and disposing a first connecting line part in the non-display area, by patterning a first conductive material layer on the support substrate;

disposing a buffer layer covering the light shielding member and the first connecting line part on the support substrate;

disposing an active layer overlapping the light shielding member and disposing an etch stopper corresponding to at least a portion of an overlapping area between the sealing hole and the first connecting line part, by patterning a semiconductor material layer on the buffer layer;

disposing a stacked structure of a gate insulating layer and a gate electrode in a channel area of the active layer and disposing a stacked structure of the gate insulating layer and a second connecting line part in the non-display area, by patterning the first insulating material layer on the buffer layer and the second conductive material layer on the first insulating material layer; and disposing an interlayer insulating layer covering the active layer, the etch stopper, the gate electrode, and the second connecting line part on the buffer layer, wherein each of the connection lines comprises at least one of the first connecting line part and the second connecting line part, and wherein in the providing of the sealing hole:

a first portion of the interlayer insulating layer covering the etch stopper in the sealing hole is patterned together with the via layer to expose a portion of the etch stopper; and at least a portion of the exposed etch stopper in the sealing hole is patterned, and the interlayer insulating layer comprises a first undercut structure that corresponds to the patterned etch stopper and is spaced apart from the buffer layer.

2. The method of claim 1, further comprising, after providing the sealing hole, disposing a light emitting array comprising light emitting elements respectively corresponding to the pixel areas on the via layer; and disposing a sealing structure covering the light emitting array, wherein in the providing of the sealing hole, two or more first valleys are further provided in the non-display area of the support substrate, wherein the two or more first valleys surround the display area and are more adjacent to the display area than the sealing hole, in the disposing of the active layer, the etch stopper further corresponds to at least a portion of an overlapping area between each of the two or more first valleys and the first connecting line part, and in the providing of the sealing hole and the two or more first valleys, a first dam layer having the same layer as the via layer is provided between the two or more first valleys.

3. The method of claim 2, wherein the providing of the sealing hole and the two or more first valleys comprises:

disposing a mask material layer of a first thickness on the via layer;

providing an exposure mask comprising a first blocking portion, at least one first opening and a second blocking portion, through an exposure process using a halftone mask, the first blocking portion corresponding to each of the two or more first valleys and the sealing hole and having a second thickness smaller than the first thickness, the at least one first opening corresponding to each of the pixel areas and penetrating the mask material layer, and the second blocking portion being a remainder excluding the first blocking portion and the at least one first opening and made of the mask material layer of the first thickness;

disposing at least one contact hole corresponding to each of the pixel areas by patterning the via layer corresponding to the at least one first opening of the exposure mask;

providing a change mask comprising the at least one first opening, a third blocking portion and a second opening, through an ashing process for the exposure mask, the third blocking portion corresponding to the second blocking portion and having a third thickness smaller than the first thickness, and the second opening corresponding to the first blocking portion and exposing the via layer;

disposing the sealing hole and the two or more first valleys by patterning the via layer corresponding to the second opening of the change mask; and removing the change mask.

4. The method of claim 3, wherein in the providing of the two or more first valleys, a second portion of the interlayer insulating layer covering the etch stopper in at least one of the two or more first valleys is patterned together with the via layer to expose a portion of the etch stopper, at least a portion of the exposed etch stopper is patterned, and the interlayer insulating layer in the at least one of the two or more first valleys comprises a second undercut structure that corresponds to the patterned etch stopper and is spaced apart from the buffer layer.

5. The method of claim 4, wherein in the disposing of the sealing hole and the two or more first valleys, the other portion of the etch stopper remains between the undercut structure of the interlayer insulating layer and the buffer layer.

6. The method of claim 4, wherein in the disposing of the sealing hole and the two or more first valleys, the etch stopper is all removed.

7. The method of claim 4, wherein in the providing of the exposure mask, the halftone mask corresponds to each of a plurality of separated areas into which the support substrate is divided, and the exposure process is performed on each of the separated areas, each of the separated areas comprises a double exposure area adjacent to a boundary between the plurality of separated areas and repeatedly exposed to the exposure process, and in the disposing of the active layer and the etch stopper, the etch stopper corresponds to the double exposure area of each of the two or more first valleys and the sealing hole.

8. The method of claim 4, wherein the disposing of the circuit array and the connection lines further comprises, after disposing the interlayer insulating layer, disposing an auxiliary etch stopper corresponding to at least a portion of an overlapping area between each of the two or more first valleys and the sealing hole and the second connecting line part, and in the disposing of the sealing hole and the two or more first valleys, the via layer comprises an undercut structure by the auxiliary etch stopper corresponding to at least a portion of the overlapping area between each of the two or more first valleys and the sealing hole and the second connecting line part.

9. The method of claim 3, wherein in the disposing of the mask material layer, the mask material layer contains siloxane.

10. The method of claim 3, wherein the disposing of the light emitting array comprises:

disposing pixel electrodes respectively corresponding to the pixel areas on the via layer;

patterning a second insulating material layer on the via layer to dispose a pixel defining layer corresponding to a space between the pixel areas and covering an edge of each of the pixel electrodes;

disposing light emitting layers respectively on the pixel electrodes; and disposing a common electrode corresponding to the pixel areas on the pixel defining layer and the light emitting layers, wherein in the disposing of the pixel defining layer, two or more second valleys respectively connected to the two or more first valleys are further disposed in the non-display area, and in the disposing of the pixel defining layer and the two or more second valleys, a second dam layer having the same layer as the pixel defining layer is provided on the first dam layer between the two or more second valleys.

11. The method of claim 10, wherein the disposing of the sealing structure comprises:

disposing a first sealing layer of an inorganic insulating material on the light emitting array;

disposing a second sealing layer of an organic insulating material on the first sealing layer; and disposing a third sealing layer of the inorganic insulating material covering the second sealing layer on the first sealing layer, wherein in the disposing of the first sealing layer, the first sealing layer covers the light emitting array and the second dam layer, and in the disposing of the second sealing layer, the second sealing layer has an edge corresponding to the first dam layer and the second dam layer.

12. The method of claim 10, wherein in the disposing of the at least one contact hole, a few of the at least one contact hole penetrates the via layer and the interlayer insulating layer, and a few other of the at least one contact hole penetrates the via layer, the interlayer insulating layer, and the buffer layer, and in the disposing of the pixel electrodes, the pixel electrode is connected to a portion of the active layer in contact with one side of the channel area through a contact hole penetrating the via layer and the interlayer insulating layer.

\* \* \* \* \*